(12) United States Patent
Kato et al.

(10) Patent No.: US 9,053,909 B2
(45) Date of Patent: *Jun. 9, 2015

(54) ACTIVATED GAS INJECTOR, FILM DEPOSITION APPARATUS, AND FILM DEPOSITION METHOD

(75) Inventors: Hitoshi Kato, Oshu (JP); Yasushi Takeuchi, Oshu (JP); Shigehiro Ushikubo, Oshu (JP); Hiroyuki Kikuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 841 days.

This patent is subject to a terminal disclaimer.

(21) Appl. No.: 12/547,648

(22) Filed: Aug. 26, 2009

(65) Prior Publication Data

US 2010/0055347 A1 Mar. 4, 2010

(30) Foreign Application Priority Data

Aug. 29, 2008 (JP) ................................. 2008-222740
Mar. 13, 2009 (JP) ................................. 2009-061605
Jul. 24, 2009 (JP) ................................. 2009-172948

(51) Int. Cl.
*C23C 16/50* (2006.01)
*C23C 16/505* (2006.01)
(Continued)

(52) U.S. Cl.
CPC ..... *H01J 37/32559* (2013.01); *C23C 16/45517* (2013.01); *C23C 16/45563* (2013.01); *C23C 16/45565* (2013.01); *C23C 16/45578* (2013.01); *C23C 16/50* (2013.01); *C23C 16/505* (2013.01); *C23C 16/509* (2013.01); *C23C 16/5093* (2013.01); *H01J 1/00* (2013.01);
(Continued)

(58) Field of Classification Search
CPC .................. C23C 16/45517; C23C 16/45563; C23C 16/45565; C23C 16/45578; C23C 16/50; C23C 16/505; C23C 16/509; C23C 16/5093; H01J 1/00
USPC ......... 118/723 E, 723 R; 156/345.43, 345.44, 156/345.45, 345.55
See application file for complete search history.

(56) References Cited

U.S. PATENT DOCUMENTS 4,657,616 A * 4/1987 Benzing et al. .......... 156/345.43
4,681,773 A * 7/1987 Bean .......................... 427/255.5
(Continued)

FOREIGN PATENT DOCUMENTS

JP 04-287912 10/1992
JP 3144664 3/2001
(Continued)

*Primary Examiner* — Rudy Zervigon
(74) *Attorney, Agent, or Firm* — IPUSA, PLLC

(57) ABSTRACT

An activated gas injector includes a flow passage defining member partitioned into a gas activation passage and a gas introduction passage by a partition wall; a gas introduction port through which a process gas is introduced into the gas introduction passage; a pair of electrodes to be supplied with electrical power to activate the process gas, wherein the electrodes extend along the partition wall in the gas activation passage; through-holes formed in the partition wall and arranged along a longitudinal direction of the electrodes, wherein the through-holes allow the process gas to flow from the gas introduction passage to the gas activation passage; and gas ejection holes provided in the gas activation passage along the longitudinal direction of the electrodes, wherein the gas ejection holes allow the process gas activated in the gas activation passage to be ejected therefrom.

3 Claims, 60 Drawing Sheets

(51) Int. Cl.

| | |
|---|---|
| *C23C 16/509* | (2006.01) |
| *H01J 37/32* | (2006.01) |
| *C23C 16/455* | (2006.01) |
| *C23C 16/452* | (2006.01) |
| *C23C 16/458* | (2006.01) |
| *C23C 16/06* | (2006.01) |
| *C23C 16/22* | (2006.01) |
| *H01J 1/00* | (2006.01) |

(52) U.S. Cl.
CPC ........ *C23C 16/452* (2013.01); *C23C 16/45536* (2013.01); *C23C 16/45551* (2013.01); *C23C 16/4584* (2013.01); *H01J 37/3244* (2013.01); *H01J 37/32449* (2013.01)

(56) References Cited

U.S. PATENT DOCUMENTS

| | | | | |
|---|---|---|---|---|
| 4,879,970 | A * | 11/1989 | Barkalow et al. | 118/719 |
| 5,095,300 | A * | 3/1992 | Alexander et al. | 340/686.5 |
| 5,266,119 | A * | 11/1993 | Taniguchi et al. | 118/730 |
| 5,302,209 | A * | 4/1994 | Maeda et al. | 118/719 |
| 5,310,339 | A * | 5/1994 | Ushikawa | 432/253 |
| 5,314,574 | A * | 5/1994 | Takahashi | 438/706 |
| 5,338,362 | A * | 8/1994 | Imahashi | 118/719 |
| 5,540,821 | A * | 7/1996 | Tepman | 204/192.13 |
| 5,807,792 | A * | 9/1998 | Ilg et al. | 438/758 |
| 5,855,681 | A * | 1/1999 | Maydan et al. | 118/719 |
| 5,902,088 | A * | 5/1999 | Fairbairn et al. | 414/217 |
| 5,909,994 | A * | 6/1999 | Blum et al. | 414/217 |
| 5,911,834 | A * | 6/1999 | Fairbairn et al. | 134/1.3 |
| 6,120,609 | A * | 9/2000 | Selyutin et al. | 118/728 |
| 6,143,082 | A * | 11/2000 | McInerney et al. | 118/719 |
| 6,203,619 | B1 * | 3/2001 | McMillan | 118/719 |
| 6,235,656 | B1 * | 5/2001 | Clarke | 438/800 |
| 6,319,553 | B1 * | 11/2001 | McInerney et al. | 427/250 |
| 6,413,321 | B1 * | 7/2002 | Kim et al. | 118/725 |
| 6,562,141 | B2 * | 5/2003 | Clarke | 118/715 |
| 6,591,850 | B2 * | 7/2003 | Rocha-Alvarez et al. | 137/9 |
| 6,634,314 | B2 * | 10/2003 | Hwang et al. | 118/723 R |
| 6,635,115 | B1 * | 10/2003 | Fairbairn et al. | 118/719 |
| 6,752,874 | B2 * | 6/2004 | Shim et al. | 118/719 |
| 6,812,157 | B1 * | 11/2004 | Gadgil | 438/763 |
| 6,843,882 | B2 * | 1/2005 | Janakiraman et al. | 156/345.29 |
| 6,872,421 | B2 * | 3/2005 | Hwang et al. | 427/248.1 |
| 6,962,644 | B2 * | 11/2005 | Paterson et al. | 156/345.28 |
| 6,972,055 | B2 * | 12/2005 | Sferlazzo | 118/719 |
| 7,052,576 | B2 * | 5/2006 | Park et al. | 156/345.24 |
| 7,153,542 | B2 * | 12/2006 | Nguyen et al. | 427/248.1 |
| 7,276,122 | B2 * | 10/2007 | Devine et al. | 118/719 |
| 7,422,636 | B2 * | 9/2008 | Ishizaka | 118/715 |
| 7,566,891 | B2 * | 7/2009 | Rocha-Alvarez et al. | 250/504 R |
| 7,589,336 | B2 * | 9/2009 | Kaszuba et al. | 250/504 R |
| 7,655,092 | B2 * | 2/2010 | Fairbairn et al. | 118/719 |
| 7,663,121 | B2 * | 2/2010 | Nowak et al. | 250/455.11 |
| 7,763,115 | B2 * | 7/2010 | Hatanaka et al. | 118/719 |
| 7,777,198 | B2 * | 8/2010 | Rocha-Alvarez et al. | 250/455.11 |
| 7,794,546 | B2 * | 9/2010 | Li | 118/733 |
| 7,828,900 | B2 * | 11/2010 | Hatanaka et al. | 118/719 |
| 7,861,668 | B2 * | 1/2011 | Toyoda et al. | 118/723 E |
| 7,909,595 | B2 * | 3/2011 | Kaszuba et al. | 425/174.4 |
| 7,927,662 | B2 * | 4/2011 | Matsuura | 427/255.31 |
| 7,964,858 | B2 * | 6/2011 | Yang et al. | 250/504 R |
| 8,020,514 | B2 * | 9/2011 | Toyoda et al. | 118/723 E |
| 8,034,723 | B2 * | 10/2011 | Ohizumi et al. | 438/758 |
| 8,043,432 | B2 * | 10/2011 | Dip | 118/719 |
| 8,066,815 | B2 * | 11/2011 | Devine et al. | 118/719 |
| 8,093,072 | B2 * | 1/2012 | Ishimaru | 438/14 |
| 8,176,871 | B2 * | 5/2012 | Okuda et al. | 118/723 E |
| 8,187,679 | B2 * | 5/2012 | Dickey et al. | 427/569 |
| 8,197,636 | B2 * | 6/2012 | Shah et al. | 156/345.32 |
| 8,251,012 | B2 * | 8/2012 | Ishimaru | 118/723 E |
| 8,261,692 | B2 * | 9/2012 | Kontani et al. | 118/723 E |
| 8,267,041 | B2 * | 9/2012 | Abe et al. | 118/723 E |
| 8,372,202 | B2 * | 2/2013 | Kato et al. | 118/719 |
| 8,461,062 | B2 * | 6/2013 | Sakai et al. | 438/479 |
| 8,465,591 | B2 * | 6/2013 | Kato et al. | 118/719 |
| 8,465,592 | B2 * | 6/2013 | Kato et al. | 118/719 |
| 8,590,484 | B2 * | 11/2013 | Sato et al. | 118/695 |
| 2001/0007244 | A1 * | 7/2001 | Matsuse | 118/719 |
| 2002/0000194 | A1 * | 1/2002 | Clarke | 118/715 |
| 2002/0034595 | A1 * | 3/2002 | Tometsuka | 427/569 |
| 2002/0056414 | A1 * | 5/2002 | Shim et al. | 118/719 |
| 2002/0088547 | A1 * | 7/2002 | Tomoyasu et al. | 156/345.47 |
| 2003/0049372 | A1 * | 3/2003 | Cook et al. | 427/248.1 |
| 2003/0139035 | A1 * | 7/2003 | Yim et al. | 438/643 |
| 2003/0164143 | A1 * | 9/2003 | Toyoda et al. | 118/723 E |
| 2004/0025786 | A1 * | 2/2004 | Kontani et al. | 118/715 |
| 2004/0052972 | A1 * | 3/2004 | Schmitt | 427/569 |
| 2004/0055636 | A1 * | 3/2004 | Rocha-Alvarez et al. | 137/9 |
| 2004/0187784 | A1 * | 9/2004 | Sferlazzo | 118/719 |
| 2005/0084610 | A1 * | 4/2005 | Selitser | 427/248.1 |
| 2005/0241579 | A1 * | 11/2005 | Kidd | 118/715 |
| 2005/0247265 | A1 * | 11/2005 | Devine et al. | 118/719 |
| 2005/0268852 | A1 * | 12/2005 | Hatanaka et al. | 118/723 VE |
| 2006/0124058 | A1 * | 6/2006 | Sakai et al. | 118/715 |
| 2006/0177579 | A1 * | 8/2006 | Shin et al. | 427/248.1 |
| 2006/0213439 | A1 * | 9/2006 | Ishizaka | 118/715 |
| 2006/0249175 | A1 * | 11/2006 | Nowak et al. | 134/1 |
| 2006/0251827 | A1 * | 11/2006 | Nowak et al. | 427/558 |
| 2006/0260544 | A1 * | 11/2006 | Toyoda et al. | 118/715 |
| 2007/0116873 | A1 * | 5/2007 | Li et al. | 427/248.1 |
| 2007/0137572 | A1 | 6/2007 | Matsuura et al. | |
| 2007/0209590 | A1 * | 9/2007 | Li | 118/719 |
| 2007/0212484 | A1 * | 9/2007 | Li | 427/248.1 |
| 2007/0218701 | A1 | 9/2007 | Shimizu et al. | |
| 2007/0218702 | A1 * | 9/2007 | Shimizu et al. | 438/758 |
| 2007/0286963 | A1 * | 12/2007 | Rocha-Alvarez et al. | 427/508 |
| 2008/0026162 | A1 * | 1/2008 | Dickey et al. | 427/569 |
| 2008/0066681 | A1 * | 3/2008 | Toyoda et al. | 118/723 R |
| 2008/0075858 | A1 * | 3/2008 | Koh | 427/255.28 |
| 2008/0096369 | A1 | 4/2008 | Strzyzewski et al. | |
| 2008/0121180 | A1 * | 5/2008 | Kontani et al. | 118/723 R |
| 2008/0202423 | A1 * | 8/2008 | Hatanaka et al. | 118/723 VE |
| 2008/0241384 | A1 * | 10/2008 | Jeong et al. | 427/255.29 |
| 2008/0251014 | A1 * | 10/2008 | Kontani et al. | 118/715 |
| 2008/0251015 | A1 * | 10/2008 | Kontani et al. | 118/715 |
| 2008/0286980 | A1 * | 11/2008 | Ishimaru | 438/716 |
| 2009/0074984 | A1 * | 3/2009 | Shimizu et al. | 427/569 |
| 2009/0151632 | A1 * | 6/2009 | Okuda et al. | 118/666 |
| 2009/0255468 | A1 * | 10/2009 | Yamamoto et al. | 118/723 E |
| 2009/0324826 | A1 * | 12/2009 | Kato et al. | 427/255.28 |
| 2009/0324828 | A1 * | 12/2009 | Kato et al. | 427/255.28 |
| 2010/0050942 | A1 * | 3/2010 | Kato et al. | 118/730 |
| 2010/0050943 | A1 * | 3/2010 | Kato et al. | 118/730 |
| 2010/0050944 | A1 * | 3/2010 | Kato et al. | 118/730 |
| 2010/0055297 | A1 * | 3/2010 | Kato et al. | 427/8 |
| 2010/0055312 | A1 * | 3/2010 | Kato et al. | 427/255.26 |
| 2010/0055314 | A1 * | 3/2010 | Kato et al. | 427/255.28 |
| 2010/0055315 | A1 * | 3/2010 | Honma | 427/255.28 |
| 2010/0055316 | A1 * | 3/2010 | Honma | 427/255.28 |
| 2010/0055317 | A1 * | 3/2010 | Kato et al. | 427/255.28 |
| 2010/0055319 | A1 * | 3/2010 | Kato et al. | 427/255.28 |
| 2010/0055320 | A1 * | 3/2010 | Honma | 427/255.28 |
| 2010/0055351 | A1 * | 3/2010 | Kato et al. | 427/595 |
| 2010/0116210 | A1 * | 5/2010 | Kato et al. | 118/730 |
| 2010/0122710 | A1 * | 5/2010 | Kato et al. | 134/1 |
| 2010/0124610 | A1 * | 5/2010 | Aikawa et al. | 427/255.28 |
| 2010/0130009 | A1 * | 5/2010 | Ishimaru | 438/680 |
| 2010/0132614 | A1 * | 6/2010 | Kato et al. | 118/723 R |
| 2010/0132615 | A1 * | 6/2010 | Kato et al. | 118/725 |
| 2010/0136795 | A1 * | 6/2010 | Honma | 438/758 |
| 2010/0151131 | A1 * | 6/2010 | Obara et al. | 427/255.28 |
| 2010/0227046 | A1 * | 9/2010 | Kato et al. | 427/10 |
| 2010/0227059 | A1 * | 9/2010 | Kato et al. | 427/255.28 |
| 2010/0229797 | A1 * | 9/2010 | Kato et al. | 118/730 |
| 2010/0260935 | A1 * | 10/2010 | Kato et al. | 427/255.28 |
| 2010/0260936 | A1 * | 10/2010 | Kato et al. | 427/255.28 |
| 2010/0291319 | A1 * | 11/2010 | Yamashita et al. | 427/575 |
| 2011/0065283 | A1 * | 3/2011 | Sato et al. | 438/758 |
| 2011/0100489 | A1 * | 5/2011 | Orito et al. | 137/560 |
| 2011/0126985 | A1 * | 6/2011 | Ohizumi et al. | 156/345.55 |
| 2011/0139074 | A1 * | 6/2011 | Kato et al. | 118/730 |

(56) References Cited

U.S. PATENT DOCUMENTS

| | | | |
|---|---|---|---|
| 2011/0151122 A1* | 6/2011 | Kato et al. | 427/255.23 |
| 2011/0155056 A1* | 6/2011 | Kato et al. | 118/719 |
| 2011/0159187 A1* | 6/2011 | Kato et al. | 427/255.26 |
| 2011/0159702 A1* | 6/2011 | Ohizumi et al. | 438/778 |
| 2012/0075460 A1* | 3/2012 | Aikawa et al. | 348/87 |
| 2012/0094011 A1* | 4/2012 | Hishiya et al. | 427/8 |

FOREIGN PATENT DOCUMENTS

| | | | |
|---|---|---|---|
| JP | 2001-254181 | | 9/2001 |
| JP | 2004-343017 | | 12/2004 |
| JP | 2006057162 A | * | 3/2006 |
| JP | 2007-247066 | | 9/2007 |
| JP | 2008-509547 | | 3/2008 |
| JP | 2010056477 A | * | 3/2010 |
| JP | 2010059495 A | * | 3/2010 |
| JP | 2010059496 A | * | 3/2010 |
| JP | 2010059498 A | * | 3/2010 |
| JP | 2010059499 A | * | 3/2010 |
| JP | 2010062370 A | * | 3/2010 |
| JP | 2010062371 A | * | 3/2010 |
| JP | 2010080924 A | * | 4/2010 |
| JP | 2010087467 A | * | 4/2010 |
| JP | 2010135420 A | * | 6/2010 |
| JP | 2010153805 A | * | 7/2010 |
| JP | 2010206025 A | * | 9/2010 |
| JP | 2010212627 A | * | 9/2010 |
| JP | 2010219125 A | * | 9/2010 |
| JP | 2010239102 A | * | 10/2010 |
| JP | 2010245448 A | * | 10/2010 |
| JP | 2010263245 A | * | 11/2010 |
| JP | 2011103495 A | * | 5/2011 |
| JP | 2011103496 A | * | 5/2011 |
| JP | 2011119408 A | * | 6/2011 |
| JP | 2011124384 A | * | 6/2011 |
| JP | 2011134996 A | * | 7/2011 |
| JP | 2011135003 A | * | 7/2011 |

* cited by examiner

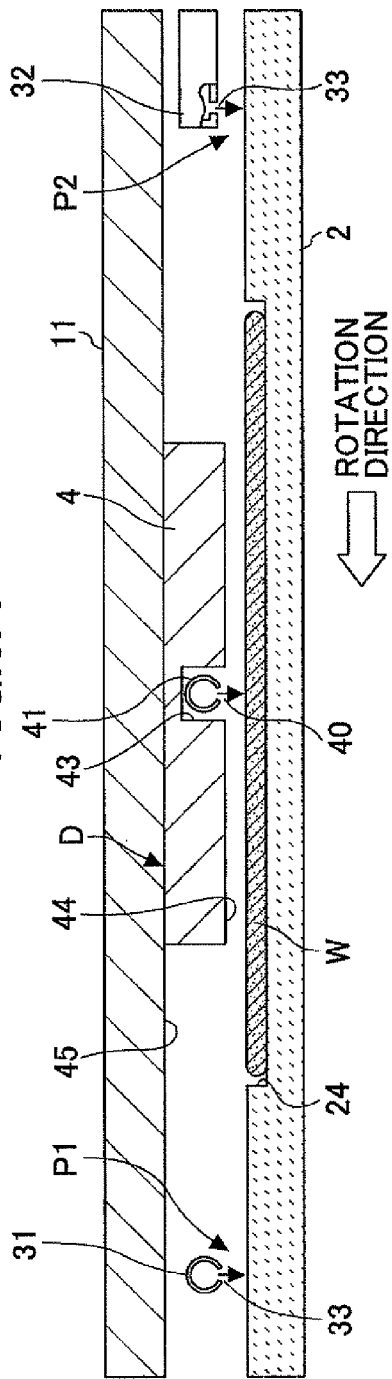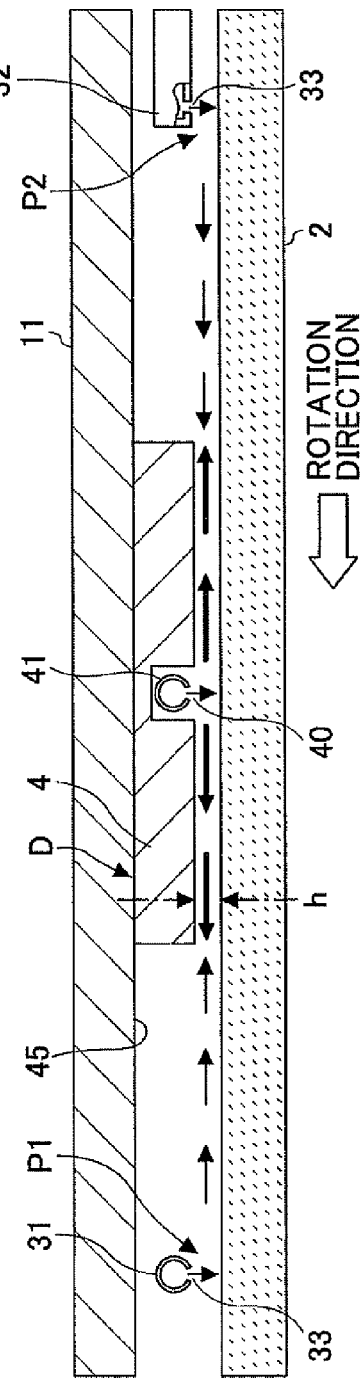

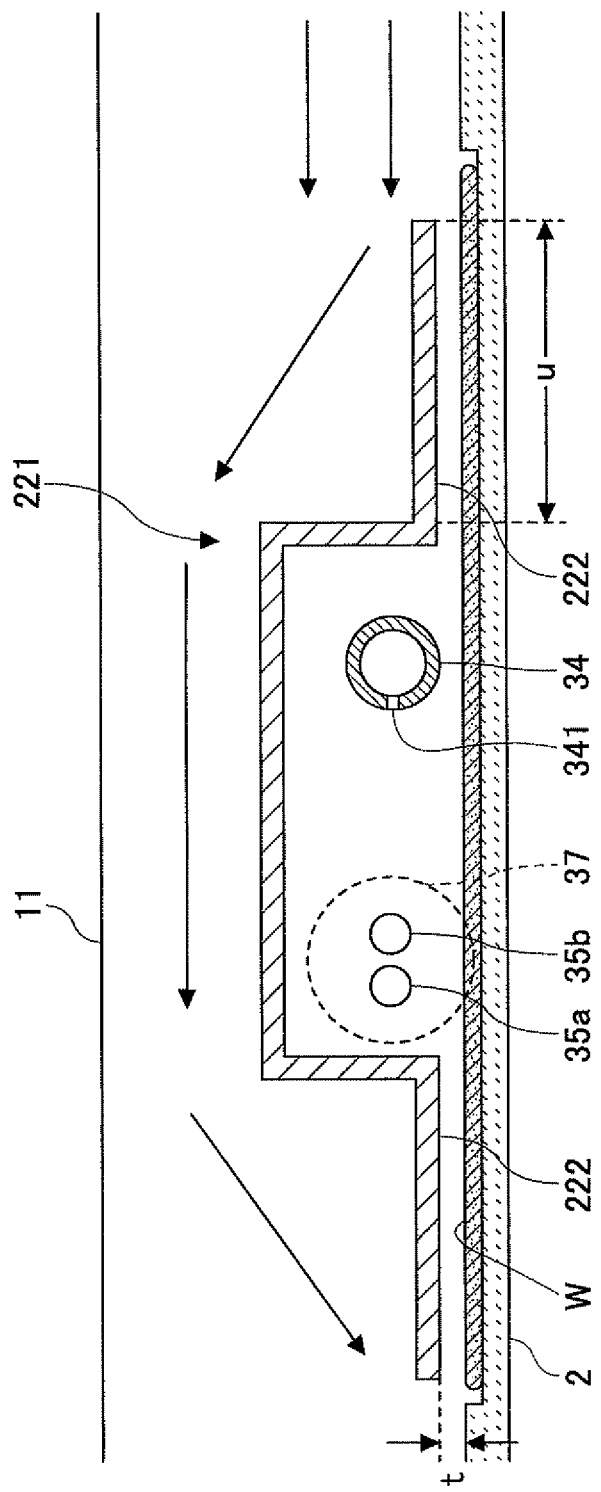

BTBAS

DIPAS

WITH AIRFLOW CONTROL MEMBER

WITHOUT AIRFLOW CONTROL MEMBER

WITH AIRFLOW CONTROL MEMBER

WITHOUT AIRFLOW CONTROL MEMBER

WITH AIRFLOW CONTROL MEMBER

WITHOUT AIRFLOW CONTROL MEMBER

WITH AIRFLOW CONTROL MEMBER

WITHOUT AIRFLOW CONTROL MEMBER

FIG.53

| | (a) | (b) | (c) | (d) |
|---|---|---|---|---|
| ROTATION SPEED OF TURNTABLE (rpm) | 20 | 20 | 30 | 20 |
| HIGH FREQUENCY POWER (W) | 0 | 400 | 0 | 400 |
| SCHEMATIC CROSS SECTION | 93.8nm(0.17nm/cy) / 94.1nm(0.17nm/cy) | 88.1nm(0.11nm/cy) / 128nm(0.16nm/cy) | 136nm(0.16nm/cy) / 142nm(0.17nm/cy) | 104nm(0.12nm/cy) / 139nm(0.17nm/cy) |
| THICKNESS RATIO R (%) | 100 | 145 | 104 | 133 |

ACTIVATED GAS INJECTOR, FILM DEPOSITION APPARATUS, AND FILM DEPOSITION METHOD

CROSS-REFERENCE TO RELATED APPLICATIONS

The present application is based on Japanese Patent Applications No. 2008-222740, 2009-061605, and 2009-172948 filed with the Japanese Patent Office on Aug. 29, 2008, Mar. 13, 2009, and Jul. 24, 2009, respectively, the entire contents of which are hereby incorporated herein by reference.

BACKGROUND OF THE INVENTION

1. Field of the Invention

The present invention relates to a technology for depositing a film on a substrate by carrying out plural cycles of supplying in turn at least two source gases to the substrate in order to form plural layers of a reaction product.

2. Description of the Related Art

As a film deposition technique in a semiconductor fabrication process, there has been known a process, in which a first reaction gas is adsorbed on a surface of a semiconductor wafer (referred to as a wafer hereinafter) and the like under vacuum and then a second reaction gas is adsorbed on the surface of the wafer in order to form one or more atomic or molecular layers through reaction of the first and the second reaction gases on the surface of the wafer, and such an alternating adsorption of the gases is repeated plural times, thereby depositing a film on the wafer. This technique is called Atomic Layer Deposition (ALD) or Molecular Layer Deposition (MLD) and advantageous in that the film thickness can be controlled at higher accuracy by the number of times of alternately supplying the reaction gases, and in that the deposited film can have excellent uniformity over the wafer. Therefore, this deposition method is thought to be promising as a film deposition technique that can address further miniaturization of semiconductor devices.

As a film deposition apparatus to carry out such a deposition method, a single-wafer deposition apparatus having a shower head at a top center portion inside a vacuum chamber is used, and a deposition method using such an apparatus has been under consideration. When such a deposition chamber is used, it takes a long time to purge the reaction gases with a purge gas, resulting in an extremely long process time because the number of cycles may reach several hundred. Therefore, a deposition method and an apparatus that enable high throughput are desired.

Under such circumstances, a film deposition apparatus in which plural substrates are arranged on a turntable along a rotation direction of the turntable in a vacuum chamber has been proposed in Patent Documents 1 through 8.

SUMMARY OF THE INVENTION

An ALD method is preferably applied to deposition of a high-dielectric film such as a silicon nitride film, silicon oxide film and the like to be used as a gate insulator. When silicon nitride is deposited, a dichlorosilane (DCS) gas or the like is used as a first reaction gas and ammonia gas or the like is used as a second gas, for example. While the film deposition using such reaction gases is carried out by heating a wafer at temperatures of 700° C. through 800° C. in order to supply energy required for the film deposition, reduced thermal history is desired in view of a technological trend toward high integration and miniaturization.

Patent Document 9 discloses a vertical batch type film deposition apparatus where several ten through several hundred wafers are held one above another in a holder and transferred into a cylindrical reaction tube of the film deposition apparatus. In this apparatus, ammonia gas is activated into plasma and supplied into the reaction chamber of the apparatus in order to carry out film deposition. Use of activated species (e.g., $NH_3$ radicals) having high reactivity generated in plasma makes it possible to reduce thermal energy applied to the wafer, compared with a conventional thermal film deposition method.

A plasma generation portion provided in the film deposition apparatus disclosed in Patent Document 9 is configured to include parallel plate electrodes to which high frequency power is applied. The electrodes are arranged along an inner wall of the reaction tube. In such a configuration, the reaction gas is activated into plasma when the reaction gas flows between the electrodes, and the reaction gas further flows between the wafers held one above another from one side to the other. In this case, a concentration of the activated reaction gas (activated species including $NH_3$ radicals) reduces along the flow direction of the reaction gas. Namely, the concentration is relatively high in a circumferential area of the wafer, which the activated gas first reaches, and the concentration is lower in the opposite circumferential area of the wafer. This is because the activated gas can easily lose its chemical activity. When this happens, an across-wafer-uniformity of the film properties is degraded.

In a film deposition apparatus that the inventors of this application have developed, a reaction gas nozzle is provided in a vacuum chamber so that the nozzle extends in a radial direction of the vacuum chamber from a side wall toward the center of the vacuum chamber, and a reaction gas flows through the nozzle and is ejected from gas ejection holes formed in the nozzle toward a wafer moving below the nozzle. If the plasma generation portion, for example, one disclosed in Patent Document 9, is provided at a base end of the nozzle (near the side wall of the vacuum chamber) in such a film deposition apparatus, the activated species lose their chemical activity while flowing through the nozzle mainly when the species hit the inner wall of the nozzle. Therefore, if such a plasma generation portion is applied to the film deposition apparatus using the reaction gas nozzle extending along the radial direction, there is a problem of poor uniformity of the film properties.

In addition, a process apparatus for exposing a wafer to plasma has been known as shown in FIG. 1. In this apparatus, a film is deposited from a reaction gas A and a reaction gas B on a wafer W placed on a susceptor 501 and the film is exposed to oxygen radicals generated by plasma at a plasma generation chamber 502, in a process chamber 500 in order to modify properties of the deposited film. In FIG. 1, reference numeral 503 is a radical transport conduit: reference numeral 504 is a gas supplying unit; reference numeral 505 is a gas supplying source of the reaction gas A; reference numeral 506 is a gas supplying source of the reaction gas B; reference numeral 507 is a gas supplying conduit; reference numeral 508 is a heater; and reference numeral 509 is a vacuum pump. The film deposited on the wafer W in this apparatus is, for example, a silicon dioxide film, and in this case, the oxygen radicals play a role of eliminating impurities such as N, OH-group, and H included in the as-deposited silicon oxide film. Because the oxygen radicals are supplied to the chamber 500 by a so-called remote-plasma method with the plasma generation chamber 502 located separately from the chamber 500, the radicals lose their chemical activity when being transported to the chamber 500. Therefore, there is a relatively low concentration of the oxygen radicals in the chamber 500, and the property modification is not effectively carried out. As a result, the impurities cannot be eliminated from the deposited silicon dioxide; a Si/O ratio cannot come close to the stoichiometric ratio of 1/2; and a three dimensional structure of Si—O—Si cannot be properly formed in the silicon dioxide film. In other words, a high quality silicon dioxide film cannot be obtained. Incidentally, it may be thought to increase a temperature of the wafer in order to facilitate decomposition of the $O_3$ in the plasma. However, it is inadvisable in carrying out a low temperature process.

Patent Document 1: United States Patent Publication No. 7,153,542 (FIGS. 6A, 6B)

Patent Document 2: Japanese Patent Application Laid-Open Publication No. 2001-254181 (FIGS. 1, 2)

Patent Document 3: Japanese Patent Publication No. 3,144,664 (FIGS. 1, 2, claim 1)

Patent Document 4: Japanese Patent Application Laid-Open Publication No. H4-287912

Patent Document 5: United States Patent Publication No. 6,634,314

Patent Document 6: Japanese Patent Application Laid-Open Publication No. 2007-247066 (paragraphs 0023 through 0025, 0058, FIGS. 12 and 13)

Patent Document 7: United States Patent Publication No. 2007-218701

Patent Document 8: United States Patent Publication No. 2007-218702

Patent Document 9: Japanese Patent Application Laid-Open Publication No. 2004-343017 (paragraphs 0021 through 0025, FIGS. 1 through 4)

The present invention has been made in view of the above, and provides an activated gas injector, a film deposition apparatus employing the activated gas injector, and a film deposition method using the film deposition apparatus.

A first aspect of the present invention provides an activated gas injector comprising: a flow passage defining member partitioned into a gas activation passage and a gas introduction passage by a partition wall; a gas introduction port through which a process gas is introduced into the gas introduction passage; a pair of electrodes to be supplied with electrical power to activate the process gas, wherein the electrodes extend along the partition wall in the gas activation passage; through-holes formed in the partition wall and arranged along a longitudinal direction of the electrodes, wherein the through-holes allow the process gas to flow from the gas introduction passage to the gas activation passage; and gas ejection holes provided in the gas activation passage along the longitudinal direction of the electrodes, wherein the gas ejection holes allow the process gas activated in the gas activation passage to be ejected therefrom.

A second aspect of the present invention provides an activated gas injector comprising: a flow passage defining member partitioned into a gas activation passage and a gas introduction passage by a partition wall; a gas introduction port through which a process gas is introduced into the gas introduction passage; a heater configured to heat and activate the process gas, wherein the heater extends along the partition wall in the gas activation passage; through-holes formed in the partition wall and along a longitudinal direction of the heater, wherein the through-holes allow the process gas introduced into the gas introduction passage to flow into the gas activation passage; and gas ejection holes provided in the gas activation passage along the longitudinal direction of the heater, wherein the gas ejection holes allow the process gas activated in the gas activation passage to be ejected therefrom.

A third aspect of the present invention provides a film deposition apparatus comprising: a turntable provided in a vacuum chamber, wherein the turntable includes a substrate receiving area in which a substrate is placed; and an activated gas injector of claim 1, wherein the activated gas injector is arranged in a direction intersecting a direction along which the substrate receiving area moves due to rotation of the turntable and opposes the substrate receiving area of the turntable, and supplies an activated reaction gas to the substrate in order to deposit a film on the substrate.

A fourth aspect of the present invention provides a film deposition apparatus comprising: a turntable provided in a vacuum chamber, wherein the turntable includes a substrate receiving area in which a substrate is placed; and the activated gas injector of claim 1, wherein the activated gas injector is arranged in a direction intersecting a direction along which the substrate receiving area moves due to rotation of the turntable and opposes the substrate receiving area of the turntable, thereby supplying an activated gas to modify a property of a film on the substrate.

A fifth aspect of the present invention provides a film deposition apparatus for depositing a film on a substrate by carrying out a cycle of alternately supplying at least two kinds of reaction gases that react with each other to the substrate to produce a layer of a reaction product in a vacuum chamber. This film deposition apparatus comprises a turntable provided in a vacuum chamber, wherein the turntable includes a substrate receiving area in which a substrate is placed; a first reaction gas supplying portion configured to supply a first reaction gas to a surface with the substrate receiving area; a second reaction gas supplying portion including the activated gas injector of claim 1 configured to supply a second reaction gas to the surface with the substrate receiving area, the second reaction gas supplying portion being separated from the first reaction gas supplying portion along a rotation direction of the turntable; a separation area located between a first process area in which the first reaction gas is supplied and a second process area in which the second reaction gas is supplied, along the rotation direction; and an evacuation opening provided in the vacuum chamber in order to evacuate the chamber. The separation area includes a separation gas supplying portion that supplies a second separation gas, and a ceiling surface that creates in relation to the surface with the substrate receiving area a thin space in which the second separation gas may flow from the separation area to the process area side in relation to the rotation direction.

A sixth aspect of the present invention provides a film deposition apparatus for depositing a film on a substrate by carrying out a cycle of alternately supplying at least two kinds of reaction gases that react with each other to the substrate to produce a layer of a reaction product in a vacuum chamber. This film deposition apparatus comprises a turntable provided in the vacuum chamber, wherein the turntable includes a substrate receiving area in which a substrate is placed; a first reaction gas supplying portion configured to supply a first reaction gas to a surface with the substrate receiving area; a second reaction gas supplying portion configured to supply a second reaction gas to the surface with the substrate receiving area, the second reaction gas supplying portion being separated from the first reaction gas supplying portion along a rotation direction of the turntable; the activated gas injector described above, wherein the activated gas injector is arranged between the first reaction gas supplying portion and the second reaction gas supplying portion along the rotation direction and opposes the surface with the substrate receiving area, thereby supplying an activated process gas in order to modify a property of the reaction product on the substrate; a separation area located between a first process area in which the first reaction gas is supplied and a second process area in which the second reaction gas is supplied, along the rotation direction; and an evacuation opening provided in the chamber in order to evacuate the chamber. The separation area includes a separation gas supplying portion that supplies a second separation gas, and a ceiling surface that creates in relation to the surface with the substrate receiving area a thin space in which the second separation gas may flow from the separation area to the process area side in relation to the rotation direction.

A seventh aspect of the present invention provides a film deposition apparatus for depositing a film on a substrate by carrying out a cycle of alternately supplying at least two kinds of reaction gases that react with each other to the substrate to produce a layer of a reaction product in a vacuum chamber. This film deposition apparatus comprises a table provided in the vacuum chamber, wherein a substrate is placed on the table; a first reaction gas supplying portion configured to supply a first reaction gas to the substrate on the table; a second reaction gas supplying portion configured to supply a second reaction gas to the substrate on the table; an activation portion configured to activate a process gas in order to modify a property of the reaction product on the substrate; and a rotation mechanism configured to rotate the first reaction gas supplying portion, the second reaction gas supplying portion, and the activation portion in relation to the table. The substrate may be located in a first area where the first reaction gas is supplied, a second area where the second gas is supplied, and a third area where the activated process gas is supplied in this order by the relative rotation.

An eighth aspect of the present invention provides a film deposition method for depositing a film on a substrate by carrying out a cycle of supplying in turn at least two kinds of reaction gases that react with each other to the substrate to produce a layer of a reaction product in a vacuum chamber. This method includes steps of placing a substrate in a substrate receiving area of a turntable provided in the vacuum chamber and rotating the turntable around a vertical axis; evacuating the vacuum chamber; supplying a first reaction gas to a surface of the substrate from a first reaction gas supplying portion; supplying a second reaction gas to the surface of the substrate from a second reaction gas supplying portion located downstream relative to the turntable with respect to the first reaction gas supplying portion, thereby producing the reaction product on the substrate through chemical reaction of the first reaction gas and the second reaction gas; supplying an activated process gas from the activated gas injector of claim 1 to modify a property of the reaction product, wherein the activated gas injector is arranged between the second reaction gas supplying portion and the first reaction gas supplying portion along the rotation direction of the turntable and opposing the substrate receiving area of the turntable; and supplying a separation gas to a separation area arranged between a first process area where the first reaction gas is supplied and a second process area where the second reaction gas is supplied, the separation area being provided to separate atmospheres of the first and the second process areas.

A ninth aspect of the present invention provides a film deposition method for depositing a film on a substrate by carrying out a cycle of supplying in turn at least two kinds of reaction gases that react with each other to the substrate to produce a layer of a reaction product in a vacuum chamber. The film deposition method comprises steps of placing a substrate in a substrate receiving area of a turntable provided in the vacuum chamber and rotating the turntable around a vertical axis; evacuating the vacuum chamber; supplying a first reaction gas to a surface of the substrate from a first reaction gas supplying portion; supplying a second reaction gas to the surface of the substrate from a second reaction gas supplying portion located downstream relative to the turntable with respect to the first reaction gas supplying portion, thereby producing the reaction product on the substrate through chemical reaction of the first reaction gas and the second reaction gas; supplying a process gas activated into plasma from the activated gas injector described above to modify a property of the reaction product, wherein the activated gas injector is arranged between the second reaction gas supplying portion and the first reaction gas supplying portion along the rotation direction of the turntable and opposing the substrate receiving area of the turntable; and supplying a separation gas to a separation area arranged between a first process area where the first reaction gas is supplied and a second process area where the second reaction gas is supplied, the separation area being provided to separate atmospheres of the first and the second process areas.

A tenth aspect of the present invention provides a film deposition method for depositing a film on a substrate by carrying out a cycle of supplying in turn at least two kinds of reaction gases that react with each other to the substrate to produce a layer of a reaction product in a vacuum chamber. The film deposition method comprises steps of substantially horizontally placing the substrate on a table in the vacuum chamber; supplying a first reaction gas to the substrate on the table from a first reaction gas supplying portion; rotating the table and the first reaction gas supplying portion relative to each other, thereby locating the substrate in a second reaction gas supplying area, and supplying a second reaction gas to the substrate from a second reaction gas supplying portion; rotating the first reaction gas supplying portion and the second reaction gas supplying portion in relation to the table, thereby locating the substrate in an activation area, and supplying an activated process gas to the substrate from an activation portion, thereby modifying a property of the reaction product on the substrate; and supplying a separation gas to a separation area arranged between a first process area where the first reaction gas is supplied and a second process area where the second reaction gas is supplied, the separation area being provided to separate atmospheres of the first and the second process areas.

An eleventh aspect of the present invention provides a storage medium storing a computer program to be used in a film deposition apparatus for depositing a film on a substrate by carrying out a cycle of alternately supplying at least two kinds of reaction gases that react with each other to the substrate to produce a layer of a reaction product in a vacuum chamber. The computer program includes a step of causing the apparatus to carry out a film deposition method according to the aspects of the present invention.

BRIEF DESCRIPTION OF THE DRAWINGS

FIGS. 5A and 5B are developed cross-sectional view showing a separation area and process areas, respectively;

FIG. 33 is a cross-sectional view of the activated gas injector shown in FIGS. 32A and 32B;

FIG. 53 shows schematic cross-sectional views of silicon oxide film obtained in an experiment carried out to study a gap-fill characteristic;

DETAILED DESCRIPTION OF THE PREFERRED EMBODIMENT

In an embodiment of the present invention, an activated gas injector for supplying a process gas includes a pair of electrodes for activating the process gas. The electrodes are arranged in parallel with each other along a longitudinal direction of the activated gas injector, specifically along a longitudinal direction of a partition wall provided in a flow passage defining member constituting the activated gas injector. Therefore, the activated process gas can be uniformly supplied to a vacuum chamber by the activated gas injector, compared with a case where the process gas is activated by electrodes arranged in a circumferential wall of the vacuum chamber and the activated process gas is supplied to the vacuum chamber through a relatively fine nozzle.

Figure 1:
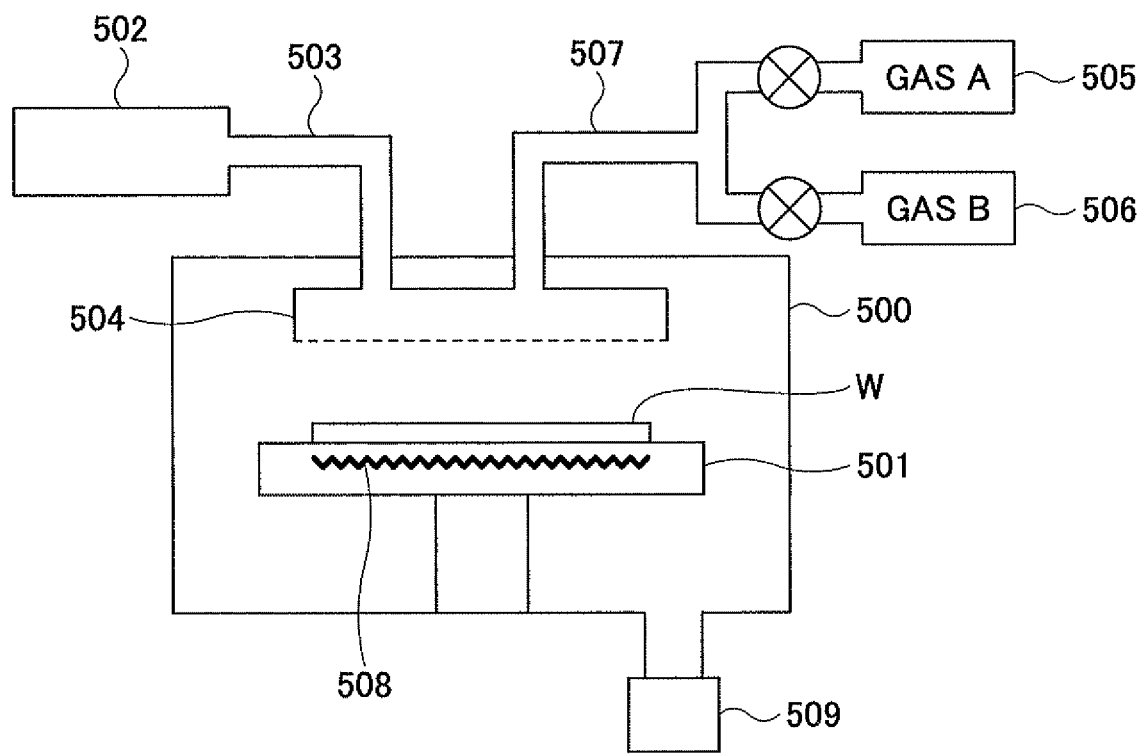
FIG. 1 is a schematic diagram of a related art film deposition apparatus.
Figure 2:
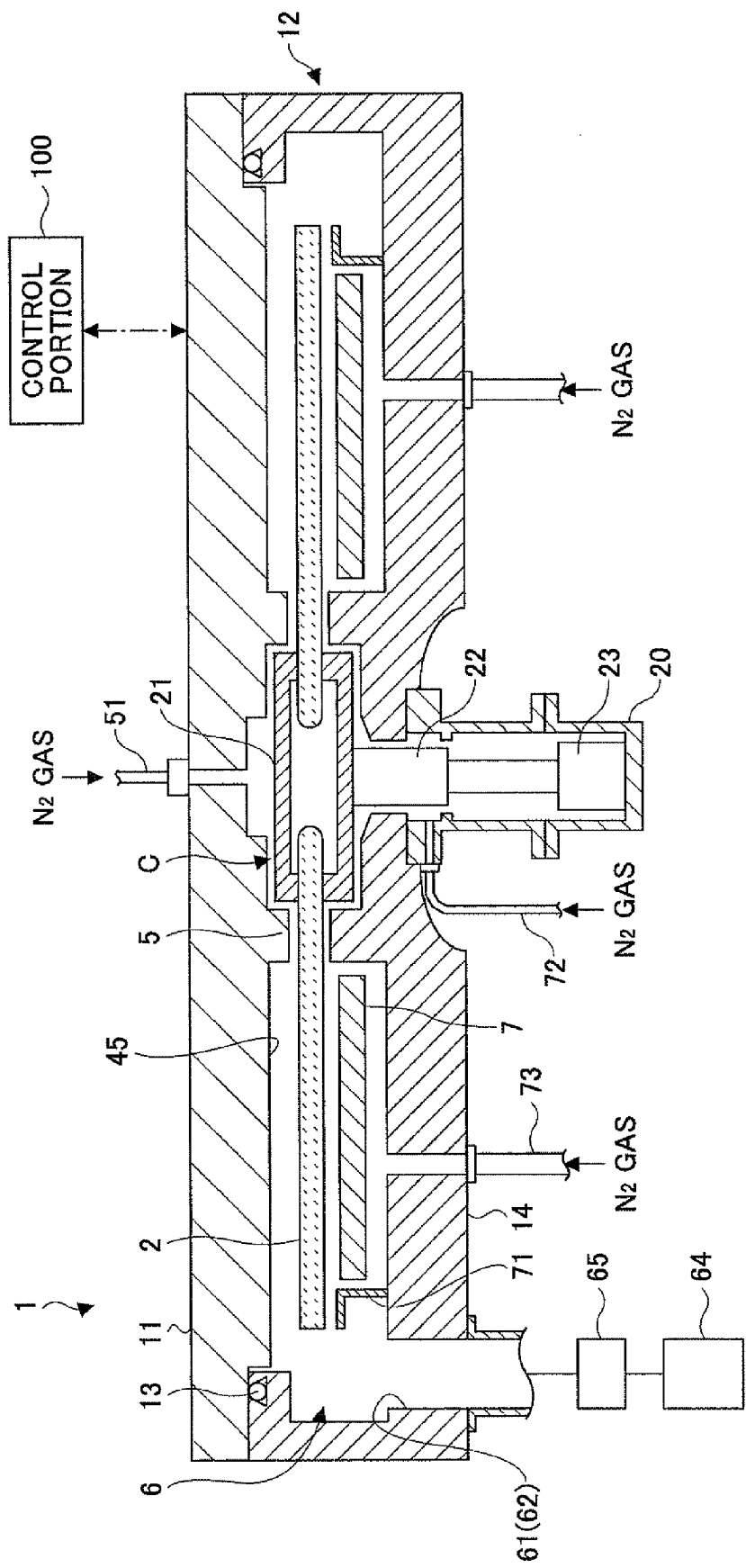
FIG. 2 is a cross-sectional view, taken along I-I' line in FIG. 4, of a film deposition apparatus according to an embodiment of the present invention.

Referring to the accompanying drawings, a film deposition apparatus according to an embodiment of the present invention is explained. As shown in FIG. 2 (a cross-sectional view taken along I-I' line in FIG. 4), a film deposition apparatus according to an embodiment of the present invention includes a vacuum chamber 1 having substantially a shape of a flattened cylinder, and a turntable 2 that is located inside the vacuum chamber 1 and has a rotation center at a center of the vacuum chamber 1. The vacuum chamber 1 is composed of a ceiling plate 11 and the chamber body 12 and, the ceiling body 11 can be separated from a chamber body 12. The ceiling plate 11 is pressed onto the chamber body 12 via a ceiling member such as an O ring 13 when the inside of the vacuum chamber is maintained at a reduced pressure, according to which the vacuum chamber 1 is assuredly hermetically sealed. On the other hand, the ceiling plate 11 can be raised by a driving mechanism (not shown) when the ceiling plate 11 has to be removed from the chamber body 12.

The turntable 2 is fixed onto a cylindrically shaped core portion 21 at substantially the center of the vacuum chamber 1. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 has a flanged pipe portion at the top and is hermetically fixed to a bottom surface of the bottom portion 14 via the flanged pipe portion.

Figure 3:
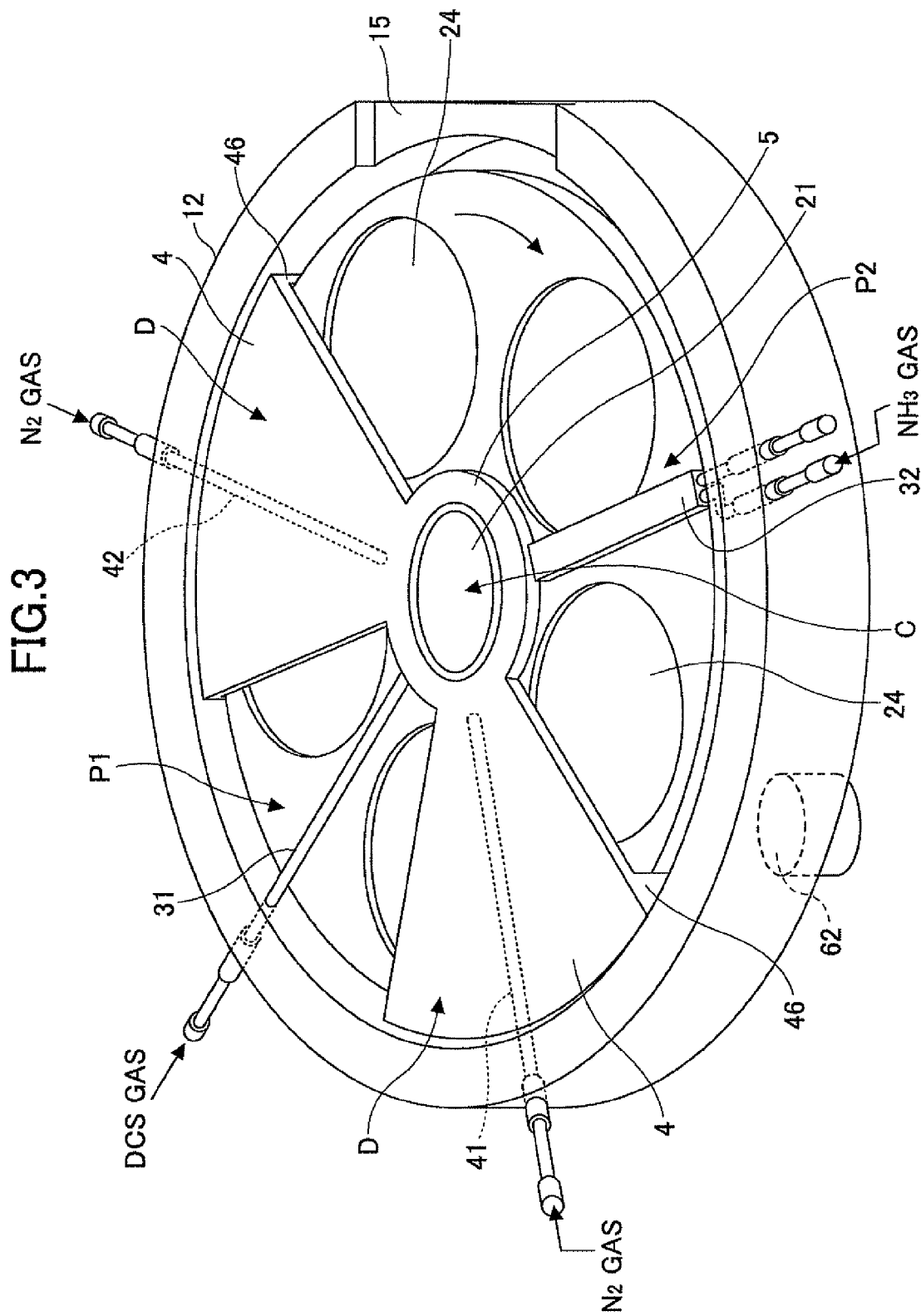
FIG. 3 is a perspective view of an inside configuration of the film deposition apparatus of FIG. 1.
Figure 4:
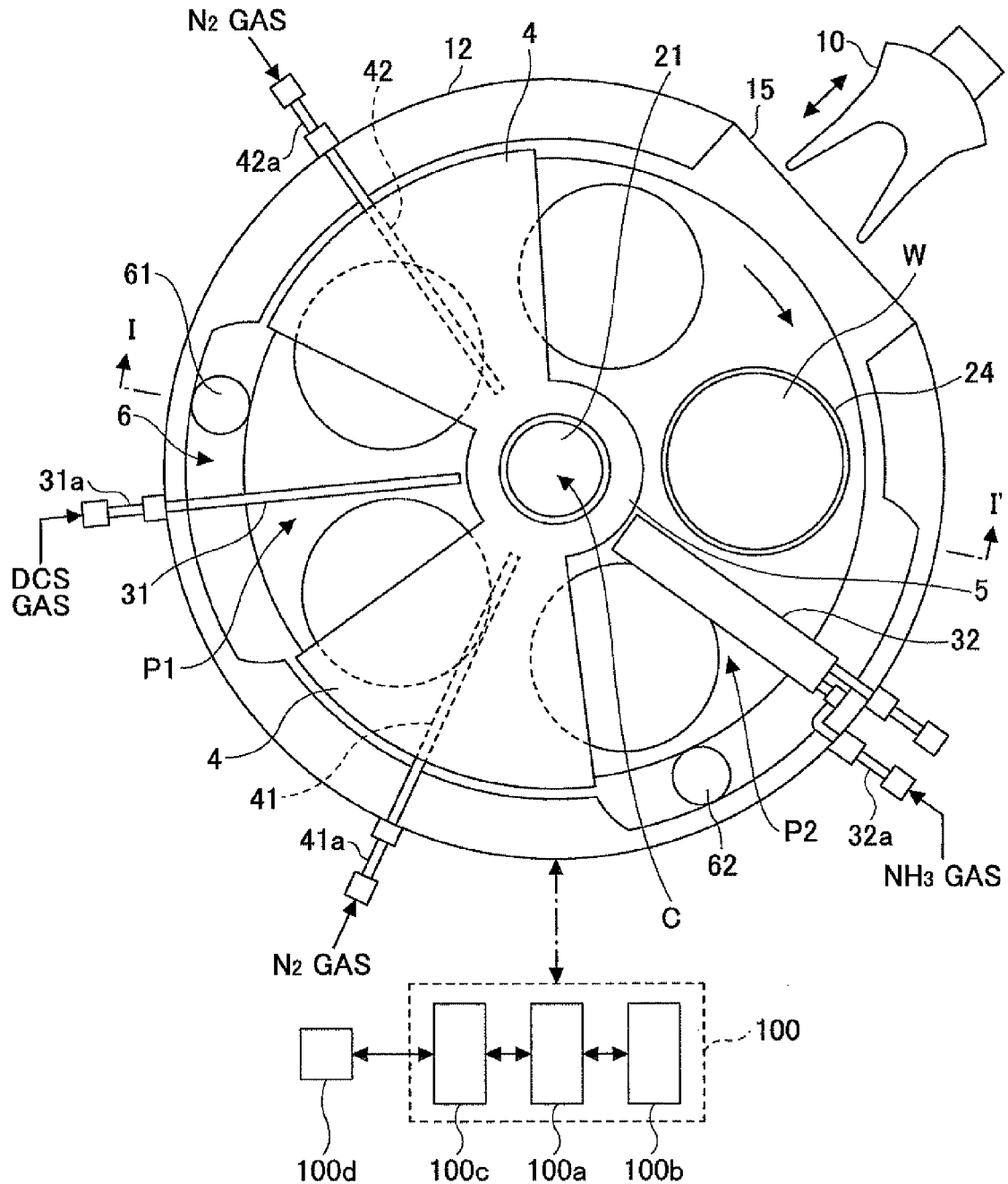
FIG. 4 is a plan view of the film deposition apparatus of FIG. 1.

As shown in FIGS. 3 and 4, plural (e.g., five) circular concave portions 24, each of which receives a wafer W, are formed along a rotation direction (circumferential direction) in a top surface of the turntable 2, although only one wafer W is illustrated in FIG. 4. FIGS. 5A and 5B are projected cross-sectional diagrams taken along a circle concentric to the turntable 2. As shown in FIG. 5A, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is in agreement with a surface of an area of the turntable 2, the area excluding the concave portions 24. If there is a relatively large step between the area and the wafer W, gas flow turbulence is caused by the step, which may affect thickness uniformity across the wafer W. Therefore, the two surfaces are preferably at the same elevation in order to improve the thickness uniformity across the wafer W. While "the same elevation" may mean here that a height difference is less than or equal to about 5 mm, the difference has to be as close to zero as possible to the extent allowed by machining accuracy. In the bottom of the concave portion 24 there are formed three through-holes (not shown) through which three corresponding elevation pins (see FIG. 8) are raised/lowered. The elevation pins support a back surface of the wafer W and raise/lower the wafer W.

The concave portions 24 are substrate receiving areas provided to position the wafers W and prevent the wafers W from being thrown out by centrifugal force caused by rotation of the turntable 2. However, the substrate receiving areas (wafer receiving areas) are not limited to the concave portions 24, but may be performed by guide members that are located at predetermined angular intervals on the turntable 2 to hold the edges of the wafers W. In addition, electrostatic chucks may be provided in the turntable 2. In this case, the place where the wafer W is electrostatically fixed corresponds to the substrate receiving area.

As shown in FIGS. 3 and 4, the vacuum chamber 1 is provided with a first reaction gas nozzle 31, an activated gas injector 32, and separation gas nozzles 41, 42 above the turntable 2, all of which extend toward the center of the vacuum chamber 1 in radial directions and at predetermined angular intervals. With this configuration, the activated gas injector 32 is arranged to extend in a direction intersecting the rotation direction of the turntable 2, namely the direction along which the wafer W moves. The first gas nozzle 31, the activated gas injector 32, and the separation gas nozzles 41, 42 are attached to a circumferential wall of the vacuum chamber 1, and inlet ports 31a, 32a, 41a, 42a, which are base ends of the corresponding nozzles and injector, penetrate through the circumferential wall.

Although the reaction gas nozzle 31, the activated gas injector 32, and the separation gas nozzles 41, 42 are introduced into the vacuum chamber 1 from the circumferential wall of the vacuum chamber 1 in the illustrated example, these nozzles 31, 41, 42 and the injector 32 may be introduced from a ring-shaped protrusion portion 5 (described later). In this case, an L-shaped conduit may be provided in order to be open on the outer circumferential surface of the protrusion portion 4 and on the outer top surface of the ceiling plate 11. With such an L-shaped conduit, the nozzle 31 (41, 42) and the injector 32 can be connected to one opening of the L-shaped conduit inside the vacuum chamber 1 and the gas inlet port 31a (32a, 41a, 42a) can be connected to the other opening of the L-shaped conduit outside the vacuum chamber 1.

The reaction gas nozzle 31 is connected to a gas supplying source of dichlorosilane (DCS) gas, which is a first source gas, and the activated gas injector 32 is connected to a gas supplying source of ammonia ($NH_3$) gas, which is a second source gas. The separation gas nozzles 41, 42 are connected to gas supplying sources of $N_2$ (nitrogen) gas (not shown), which serves as a separation gas. In the illustrated example, the activated gas injector 32, the separation gas nozzle 41, the first reaction gas nozzle 31, and the separation gas nozzle 42 are arranged clockwise in this order, seen from above.

The reaction gas nozzle 31 has ejection holes 33 to eject the first reaction gas downward. The ejection holes 33 are arranged in the longitudinal direction of the first reaction gas nozzle 31 at predetermined intervals. The activated gas injector 32 can activate the $NH_3$ gas introduced into the activated gas injector 32 and supply the activated $NH_3$ gas into the vacuum chamber 1. The activated gas injector 32 is explained in detail later. The separation gas nozzles 41, 42 have ejection holes 40 to eject the separation gases downward from the ejection holes 40. The reaction gas nozzle 31 and the activated gas injector 32 are a first reaction gas supplying portion and a second reaction gas supplying portion, respectively, in this embodiment. In addition, an area below the reaction gas nozzle 31 is a first process area P1 in which the DCS gas is adsorbed on the wafer W, and an area below the activated gas injector 32 is a second process area P2 in which the activated $NH_3$ gas is adsorbed on the wafer W.

The separation gas nozzles 41, 42 are provided in separation areas D that are configured to separate the first process area P1 and the second process area P2. In each of the separation areas D, there is provided a convex portion 4 on the ceiling plate 11, as shown in FIGS. 3 through 5. The convex portion 4 has a top view shape of a sector whose apex lies at the center of the vacuum chamber 1 and whose arced periphery lies near and along the inner circumferential wall of the chamber body 12. In addition, the convex portion 4 has a groove portion 43 that extends in the radial direction so that the convex portion 4 is substantially bisected by the groove portion 43 in which the separation gas nozzle 41 (42) is housed. A circumferential distance between the center axis of the separation gas nozzle 41 (42) in the groove portion 43 and one side of the sector-shaped convex portion 4 is substantially equal to the other circumferential distance between the center axis of the separation gas nozzle 41 (42) and the other side of the sector-shaped convex portion 4.

Incidentally, while the groove portion 43 is formed in order to bisect the convex portion 4 in this embodiment, the groove portion 42 is formed so that an upstream side of the convex portion 4 relative to the rotation direction of the turntable 2 is wider, in other embodiments.

With the above configuration, there are flat low ceiling surfaces 44 (first ceiling surfaces) on both sides of the separation gas nozzle 41 (42), and ceiling surfaces 45 (second ceiling surfaces) higher than the ceiling surfaces 44 outside of the corresponding low ceiling surfaces 44, as shown in FIG. 4A. The convex portion 4 (ceiling surface 44) provides a separation space, which is a thin space, between the convex portion 4 and the turntable 2 in order to impede the first and the second gases from entering the thin space and from being mixed.

Namely, the separation gas nozzle 41 impedes the $NH_3$ gas flowing along the rotation direction from entering the space between the convex portion 4 and the turntable 2, and the DCS gas flowing along a direction opposite to the rotation direction from entering the space between the convex portion 4 and the turntable 2. "The gases being impeded from entering" means that the $N_2$ gas as the separation gas ejected from the separation gas nozzle 41 spreads between the first ceiling surfaces 44 and the upper surface of the turntable 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the separation space, but that the gases cannot proceed farther toward the separation gas nozzle 41 and thus be mixed with each other even when a fraction of the reaction gases do enter the separation space. Namely, as long as such effect is demonstrated, the separation area D is able to separate the first process area P1 and the second process area P2. Incidentally, the DCS gas or the $NH_3$ gas adsorbed on the wafer W can pass through below the convex portion 4. A degree of "thin" of the thin space may be determined so that the effect of "the gases cannot enter the separation space" is demonstrated by a pressure difference caused between the thin space (a space below the convex portion 4 or the first ceiling surface 44) and the adjacent areas (areas below the second ceiling surfaces 45), and the specific height of the thin space may be different depending on the area of the convex portion 4 (the first ceiling surfaces 44). The gases adsorbed on the wafer W can pass through and below the convex portion 4. Therefore, the gases in "the gases being impeded from entering" mean the gases in a gaseous phase.

Figure 6:
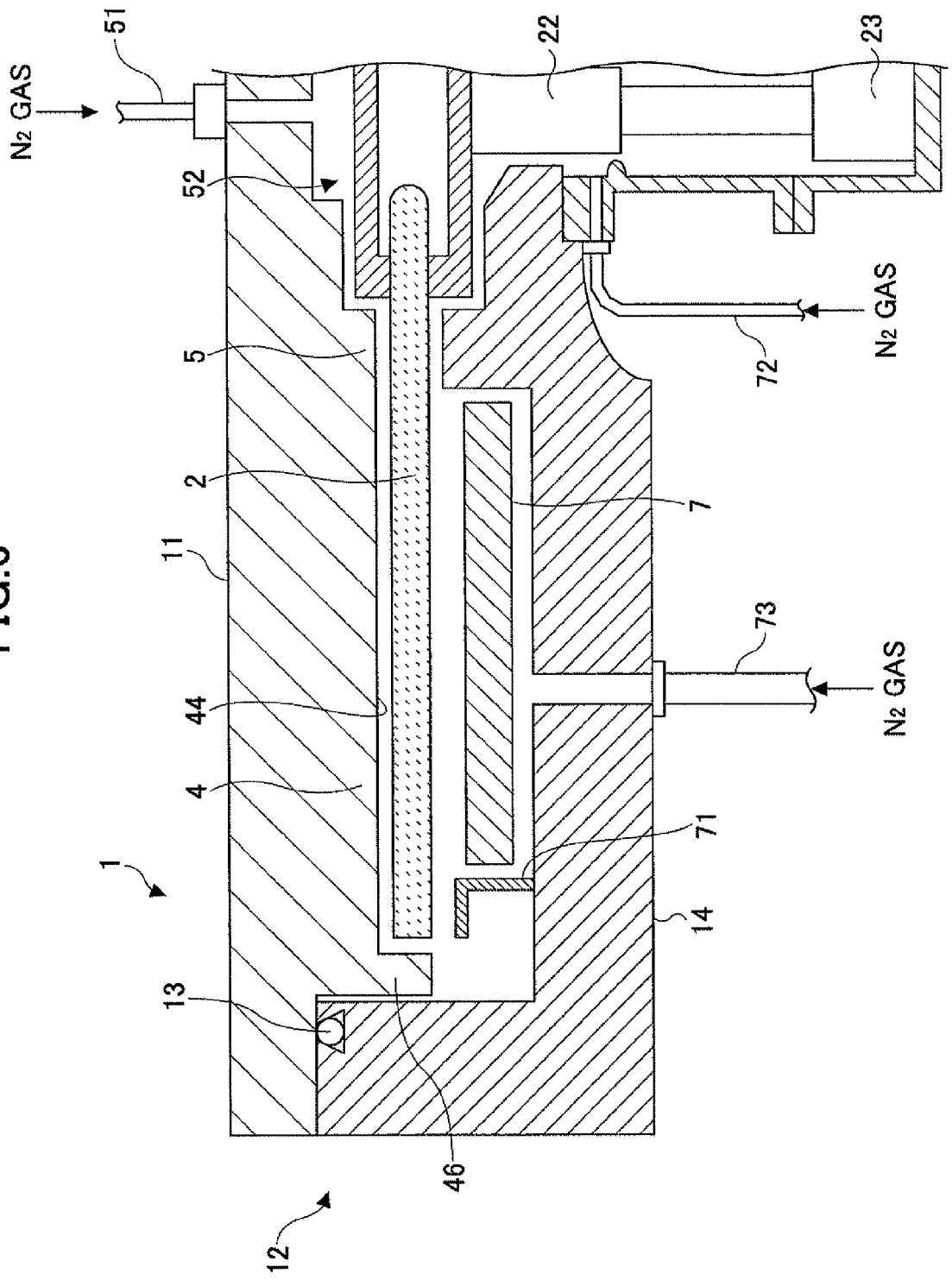
FIG. 6 is a cross-sectional view of the separation area in the film deposition apparatus of FIG. 1.
Figure 7:
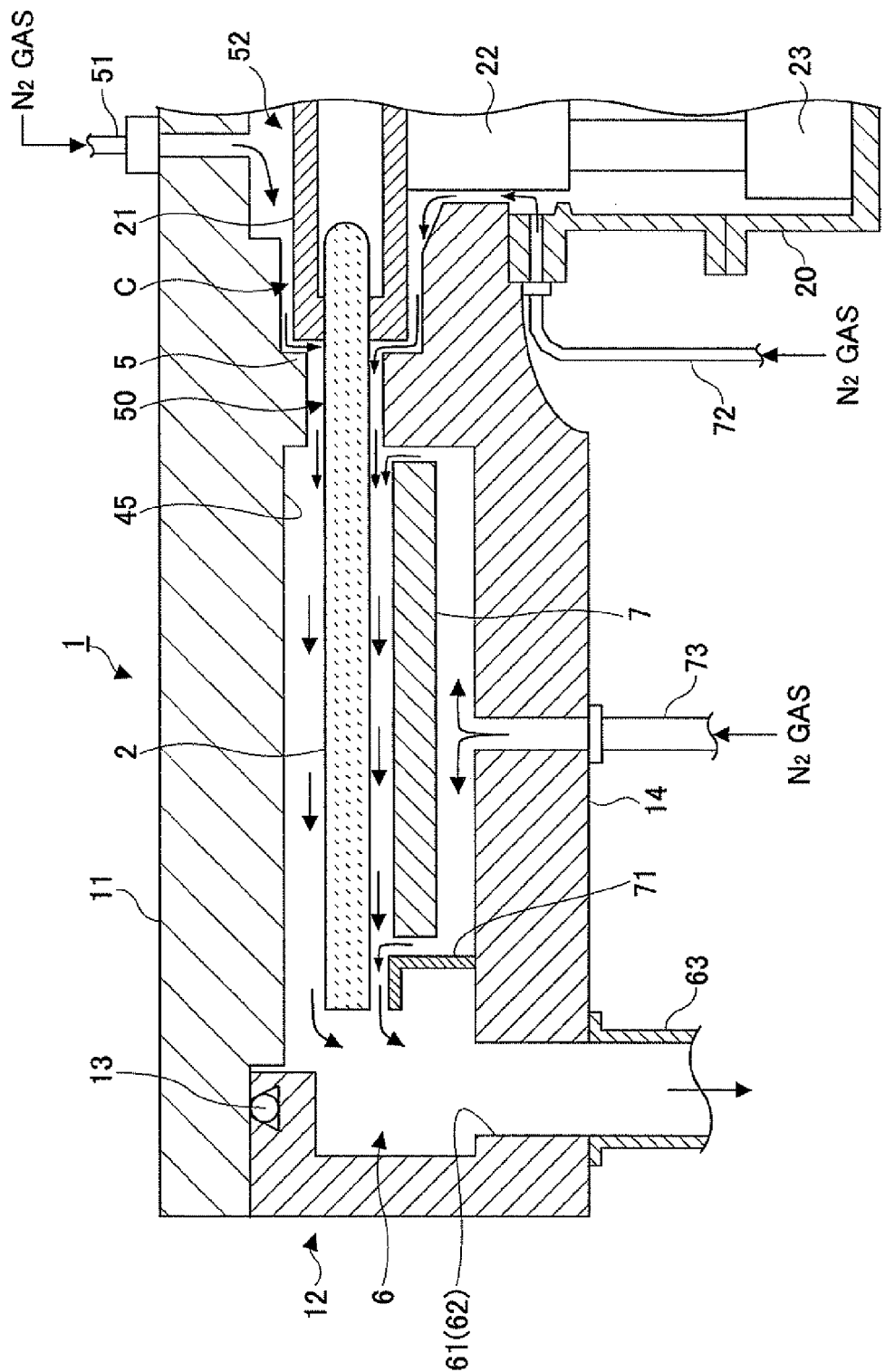
FIG. 7 is an explanatory view for explaining a flow pattern of a separation gas and a purge gas.

On the other hand, the ring-shaped protrusion portion 5 is provided on the lower surface of the ceiling plate 11 so that the inner circumference surface of the protrusion portion 5 faces the outer circumference surface of the core portion 21, as shown in FIGS. 6 and 7. The protrusion portion 5 opposes the turntable 2 in an outer area of the core portion 21. In addition, a lower surface of the protrusion portion 5 and a lower surface of the convex portion 4 form one plane surface.

In other words, a height of the lower surface of the protrusion portion 5 from the turntable 2 is the same as a height of the lower surface (ceiling surface 44) of the convex portion 4. FIGS. 3 and 4 show the inner configuration of the vacuum chamber 1 whose ceiling plate 11 is removed while the convex portions 5 remain inside the vacuum chamber 1. Incidentally, the convex portion 4 is formed not integrally with but separately from the protrusion portion 5 in other embodiments.

When it comes to how to configure the convex portion 4 and the separation gas nozzle 41 (42), the convex portion 4 is not necessarily formed by making the groove portion 43 for the separation gas nozzle 41 (42) to be housed in at the middle of one sector-shaped plate, but by threadably mounting two sector-shaped plates on the lower surface of the ceiling plate 11 so that the two sector-shaped plates are located with one plate on each side of the separation gas nozzle 41 (42).

The separation gas nozzle 41 (42) has ejection holes having an inner diameter of about 0.5 mm arranged at predetermined intervals of 10 mm in longitudinal directions of the separation gas nozzle 41 (42) in order to eject the separation gases downward from the ejection holes. In addition, the first reaction gas nozzle 31 also has ejection holes having an inner diameter of about 0.5 mm arranged at predetermined intervals of 10 mm in longitudinal directions of the separation gas nozzle 41 (42) in order to eject the separation gases downward from the ejection holes.

In this embodiment, the wafer W having a diameter of about 300 mm is supposed to be processed in the vacuum chamber 1. In this case, the convex portion 4 has a circumferential length of, for example, about 146 mm along an inner arc located at a distance 140 mm from the rotation center of the turntable 2, and a circumferential length of, for example, about 502 mm along an outer arc corresponding to the outermost portion of the concave portions 24 of the turntable 2. In addition, a circumferential length L (FIG. 5A) from one side wall of the convex portion 4 through the nearest side wall of the groove portion 43 along the outer arc is about 246 mm.

In addition, the height h (FIG. 4A) of the back surface of the convex portion 4, or the ceiling surface 44, measured from the top surface of the turntable 2 (or the wafer W) is, for example, about 0.5 mm through about 10 mm, and preferably about 4 mm. In this case, the rotational speed of the turntable 2 is, for example, 1 through 500 revolutions per minute (rpm). In order to ascertain the separation function performed by the separation area D, the size of the convex portion 4 and the height h of the ceiling surface 44 from the turntable 2 may be determined depending on the rotational speed of the turntable 2 through experimentation. Incidentally, the separation gas is $N_2$ in this embodiment but may be an inert gas such as He and Ar, or $H_2$ in other embodiments, as long as the separation gas does not affect the deposition.

As described above, the vacuum chamber 1 is provided with the first ceiling surfaces 44 and the second ceiling surfaces 45 that are higher than the first ceiling surfaces 44, which are alternately arranged in the circumferential direction. FIG. 2 shows a cross section of one portion of the vacuum chamber 1 where the higher ceiling surface 45 is formed, and FIG. 6 shows a cross section of another portion of the vacuum chamber 1 where the lower ceiling surface 44 is formed. As shown in FIGS. 3 and 6, the convex portion 4 has a bent portion 46 that bends in an L-shape at the outer circumferential edge of the convex portion 4. The bent portion 46 is provided in order to impede the reaction gases from entering from both sides of the bent portion 46 and from being mixed with each other, in the same manner as the convex portion 4. The gaps between the bent portion 46 and the turntable 2 and between the bent portion 46 and the chamber body 12 may be the same as the height h of the ceiling surface 44 from the turntable 2. In the illustrated example, an inner circumferential surface of the bent portion 46 may serve as an inner circumferential wall of the vacuum chamber 1, when viewed from the turntable 2.

The inner circumferential wall of the chamber body 12 is close to the outer circumferential surface of the bent portion 46 and stands upright in the separation area D, as shown in FIG. 6, and is dented outward from a height corresponding to the outer circumferential surface of the turntable 2 down through the bottom portion 14 of the chamber body 12 in areas other than the separation area D, as shown in FIG. 2. The dented area is referred to as an evacuation area 6 below. As shown in FIGS. 2 and 4, two evacuation ports 61, 62 are provided in the bottoms of the corresponding evacuation areas 6. The evacuation ports 61, 62 are connected to a commonly-provided evacuation unit 64 including, for example, a vacuum pump via corresponding evacuation pipes 63, as shown in FIGS. 2 and 4. Reference numeral "65" in FIG. 2 is a pressure control unit commonly provided for the evacuation ports 61, 62. Plural pressure controllers 65 may be provided to the corresponding evacuation ports 61, 62.

In order to secure the separation effect by the separation area D, the evacuation ports 61, 62 are located with one port on each side of each of the separation areas D along the rotation direction of the turntable 2, when viewed from above, and substantially exclusively evacuate the corresponding reaction gases (the DSC gas and the $NH_3$ gas). In the illustrated example, the evacuation port 61 is located between the first reaction gas nozzle 31 and the separation area D that is located downstream relative to the rotation direction of the turntable 2 with respect to the first reaction gas nozzle 31, and the evacuation port 62 is located between the activated gas injector 32 and the separation area D that is located downstream relative to the rotation direction of the turntable 2 with respect to the activated gas injector 32.

Although the two evacuation ports 61, 62 are made in the chamber body 12 in this embodiment, three or four or more evacuation ports may be provided in other embodiments. For example, one additional evacuation port may be made in an area between the separation area D including the separation gas nozzle 42 and the activated gas injector 32 located downstream relative to the rotation of the turntable 2 with respect to the separation area D. While the evacuation ports 61, 62 are located below the turntable 2 to evacuate the vacuum chamber 1 through an area between the inner circumferential wall of the chamber body 12 and the outer circumferential surface of the turntable 2 in the illustrated example, the evacuation ports 61, 62 may be located in the side wall of the chamber body 12. In addition, when the evacuation ports 61, 62 are provided in the side wall of the chamber body 12, the evacuation ports 61, 62 may be located higher than the turntable 2. In this case, the gases flow along the upper surface of the turntable 2 into the evacuation ports 61, 62 located higher the turntable 2. Therefore, it is advantageous in that particles in the vacuum chamber 1 are not blown upward by the gases, compared to a case where the evacuation ports are provided, for example, in the ceiling plate 11.

As shown in FIGS. 2, 6, and 7, a heater unit 7 as a heating portion is provided in a space between the bottom portion 14 of the chamber body 12 and the turntable 2, so that the wafers W placed on the turntable 2 are heated through the turntable 2 at a temperature of, for example, 300° C. determined by a process recipe. In addition, a cover member 71 is provided beneath the turntable 2 and near the outer circumference of the turntable 2 in order to surround the heater unit 7, so that the space where the heater unit 7 is located is partitioned from the outside area of the cover member 71. The cover member 71 has a flange portion 71a at the top. The flange portion 71a is arranged so that a slight gap is maintained between the back surface of the turntable 2 and the flange portion in order to prevent gas from flowing inside the cover member 71.

In an inside area of the space where the ring-shaped heater unit 7 is housed, the bottom portion 14 comes close to the back surface of the turntable 2 and the core portion 21, leaving slight gaps between the bottom portion 14 and the turntable 2 and between the bottom portion 14 and the core portion 21. In addition, there is a small gap between the rotational shaft 22 and an inner surface of the center hole of the bottom portion 14 through which the rotation shaft 22 passes. This small gap is in the gaseous communication with the case body 20. A purge gas supplying pipe 72 is connected to an upper portion of the case body 20 so that $N_2$ gas as a purge gas is supplied to the slight gaps, thereby purging the slight gaps. Moreover, plural purge gas supplying pipes 73 are connected at predetermined angular intervals to the bottom portion 14 of the chamber body 12 below the heater unit 7 in order to purge the space where the heater unit 7 is housed.

With such configurations, a space from the case body 20 through the heater unit housing space for housing the heater unit 7 is purged with $N_2$ gas from the purge gas supplying pipes 72, 73, and the purge gas is evacuated from the evacuation ports 61, 62 through the gap between the turntable 2 and the cover member 7, and the evacuation areas 6, as shown in FIG. 7. With this, the DCS ($NH_3$) gas is impeded from entering the second (first) process area P2 (P1) through the space below the turntable 2, and thus from being mixed with the $NH_3$ (DCS) gas. Namely, the purge gas serves as a separation gas.

A separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through the thin gap 50 between the protrusion portion 5 and the turntable 2 and then along the top surface of the turntable 2 toward the circumferential edge of the turntable 2. Because the space 52 and the gap 50 are filled with the $N_2$ gas, the reaction gases (DCS, $NH_3$) cannot be mixed through the center portion of the turntable 2. In other words, the film deposition apparatus according to this embodiment is provided with a center area C that is defined by the center portion of the turntable 2 and the ceiling plate 11 of the vacuum chamber 1 in order to separate the first process area P1 and the second process area P2 and is configured to have an ejection opening that ejects the separation gas toward the top surface of the turntable 2. The ejection opening corresponds to the gap 50 between the protrusion portion 5 and the turntable 2, in the illustrated example.

In addition, a transfer opening 15 is formed in a side wall of the chamber body 12 as shown in FIGS. 3 and 4. Through the transfer opening 15, the wafer W is transferred into or out from the vacuum chamber 1 by a transfer arm 10 (FIG. 4). The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 as a wafer receiving portion of the turntable 2 from the transfer arm 10. In order to lower/raise the wafer W into/from the concave portion 24, there are provided elevation pins (not shown) that are raised or lowered through corresponding through-holes formed in the concave portion 24 of the turntable 2 by an elevation mechanism (not shown).

The film deposition apparatus according to this embodiment includes the activated gas injector 32 that activates $NH_3$ gas as the second reaction gas into plasma and supplies the $NH_3$ gas in the state of plasma toward the wafer W placed in the substrate receiving area (the concave portion 24). The activated gas injector 32 is explained in detail in the following.

Figure 8:
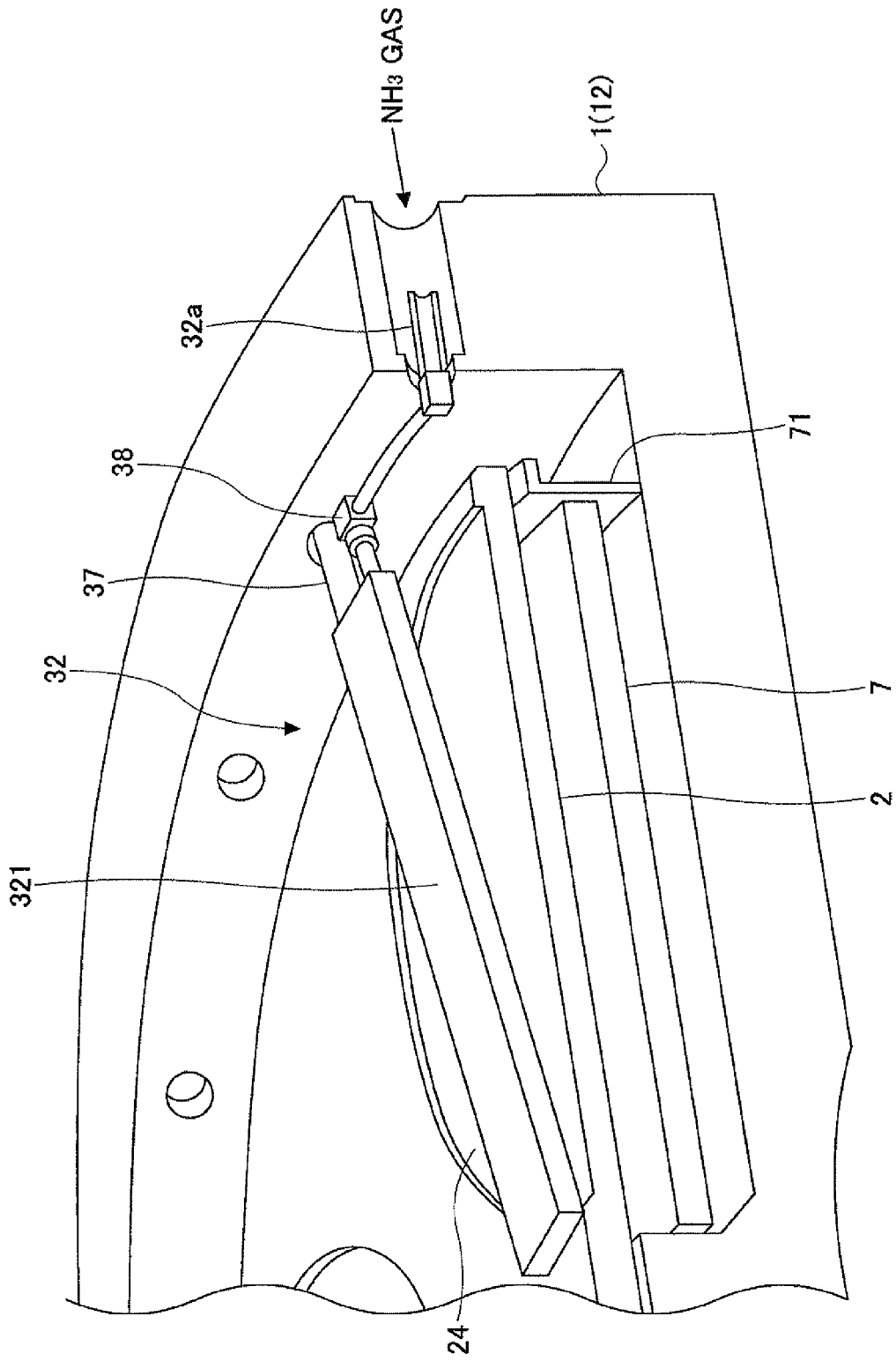
FIG. 8 is a perspective view illustrating an activated gas injector for activating a reaction gas into plasma.
Figure 9:
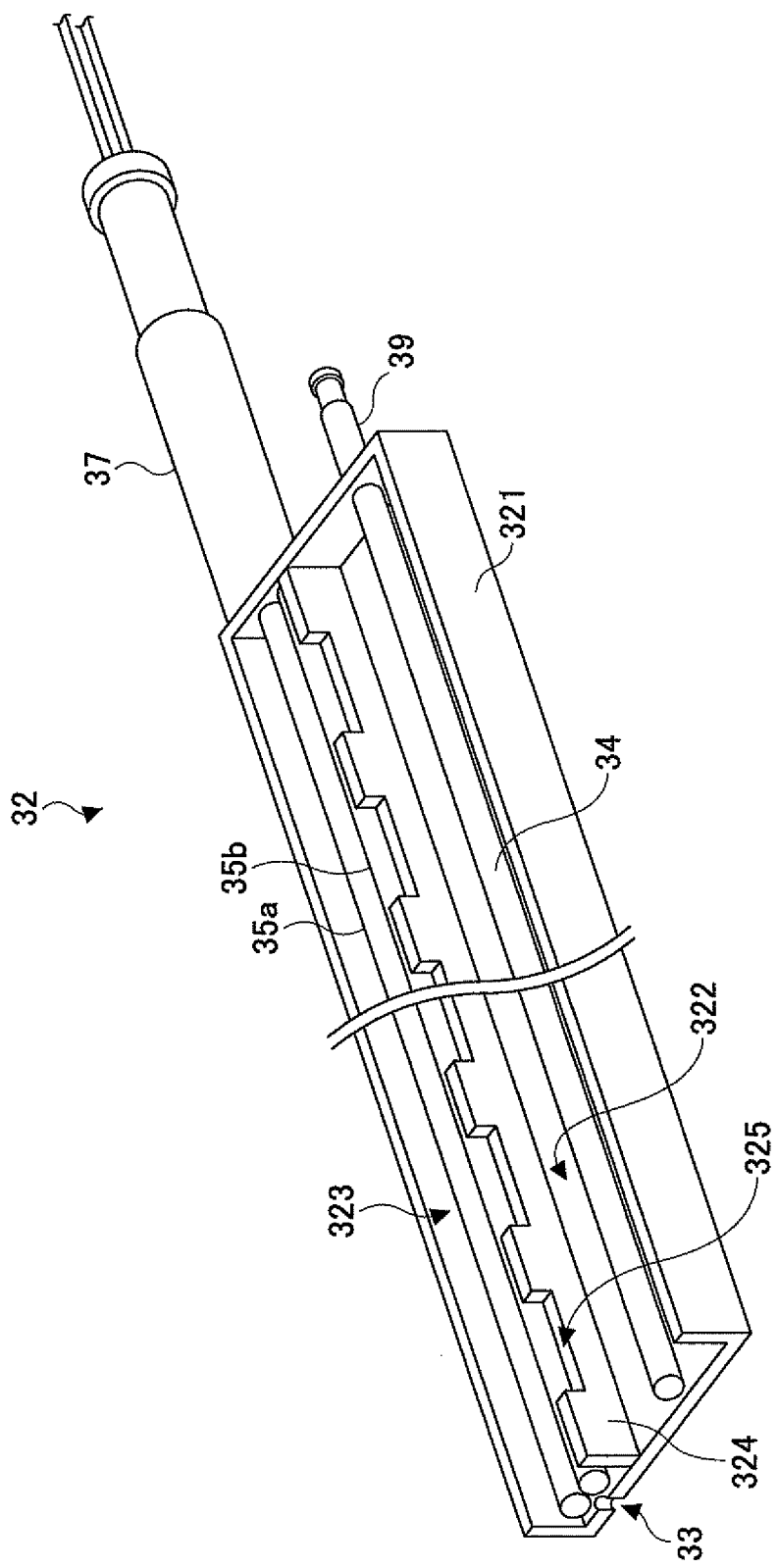
FIG. 9 is a perspective view illustrating an inner structure of the activated gas injector.
Figure 10:
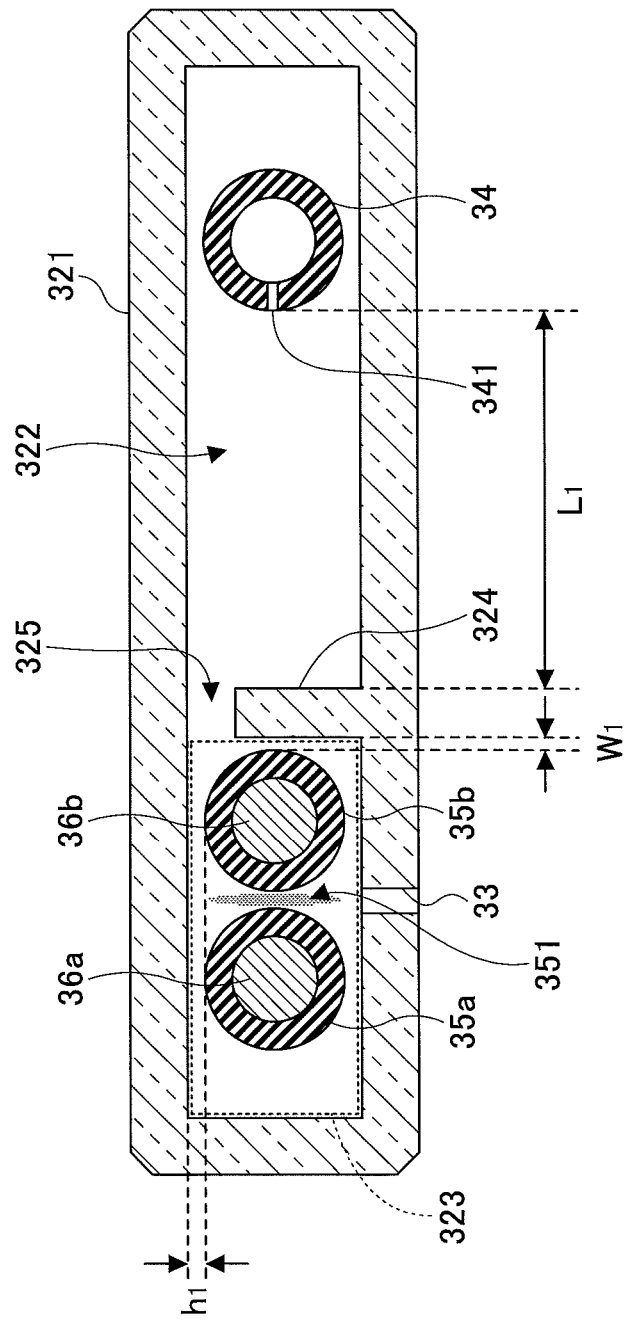
FIG. 10 is a cross-sectional view of the activated gas injector.

As shown in FIG. 8, the activated gas injector 32 includes an injector body 321 as a flow passage defining member having a shape of a flattened elongate rectangular parallelepiped. The injector body 321 is hollow as shown in FIGS. 9 and 10, and made of quartz, which has an excellent resistance against plasma etching, for example. The hollow space inside the injector body 321 is divided into two different spaces by a partition wall 324 extending in the longitudinal direction. One of the spaces is a gas activation chamber 323 as a gas activation passage where the $NH_3$ gas is activated into plasma, and the other space is a gas introduction chamber 322 as a gas introduction passage from which the $NH_3$ gas is uniformly introduced into the gas activation chamber 323. As shown in FIG. 10, a ratio of a width of the gas activation chamber 323 with respect to that of the gas introduction chamber 322 is about 2/3, which means the gas introduction chamber 322 has a larger volume.

Referring to FIGS. 9 and 10, a tubular gas introduction nozzle 34 is arranged in the gas introduction chamber 322 so that the gas introduction nozzle 34 extends from a base end to a distal end of the gas introduction chamber 322 along the partition wall 324. The gas introduction nozzle 34 has gas holes 341 open toward the partition wall 324. The gas holes 341 are arranged at predetermined intervals in the longitudinal direction and allow the $NH_3$ gas to flow through into the gas introduction chamber 322. On the other hand, a base end of the gas introduction nozzle 34 is connected to a gas introduction port 39 at a side wall of the injector body 321 (FIG. 9). The gas introduction port 39 is connected via a joint 38 to a gas supplying port 32a, for example, and allows the $NH_3$ gas to flow into the gas introduction nozzle 34.

As shown in FIG. 9, rectangular cut-out portions 325 are formed at predetermined intervals along the longitudinal direction (a longitudinal direction of electrodes 36a, 36b described later) in an upper portion of the partition wall 324 opposing the gas introduction nozzle 34. The cut-out portions 325 and a ceiling surface of the injector body 12 define rectangular through-holes that allow the $NH_3$ gas to flow from the gas introduction chamber 322 into the gas activation chamber 323.

In the illustrated example, a distance L1 between the gas holes 341 of the gas introduction nozzle 34 and the partition wall 324 may determined so that fluxes of the gas flowing out from each of the gas holes 341 are uniformly distributed (or mixed) in the gas introduction chamber 322 and thus the gas can uniformly flow out from the through-holes into the gas activation chamber 323.

Figure 11:
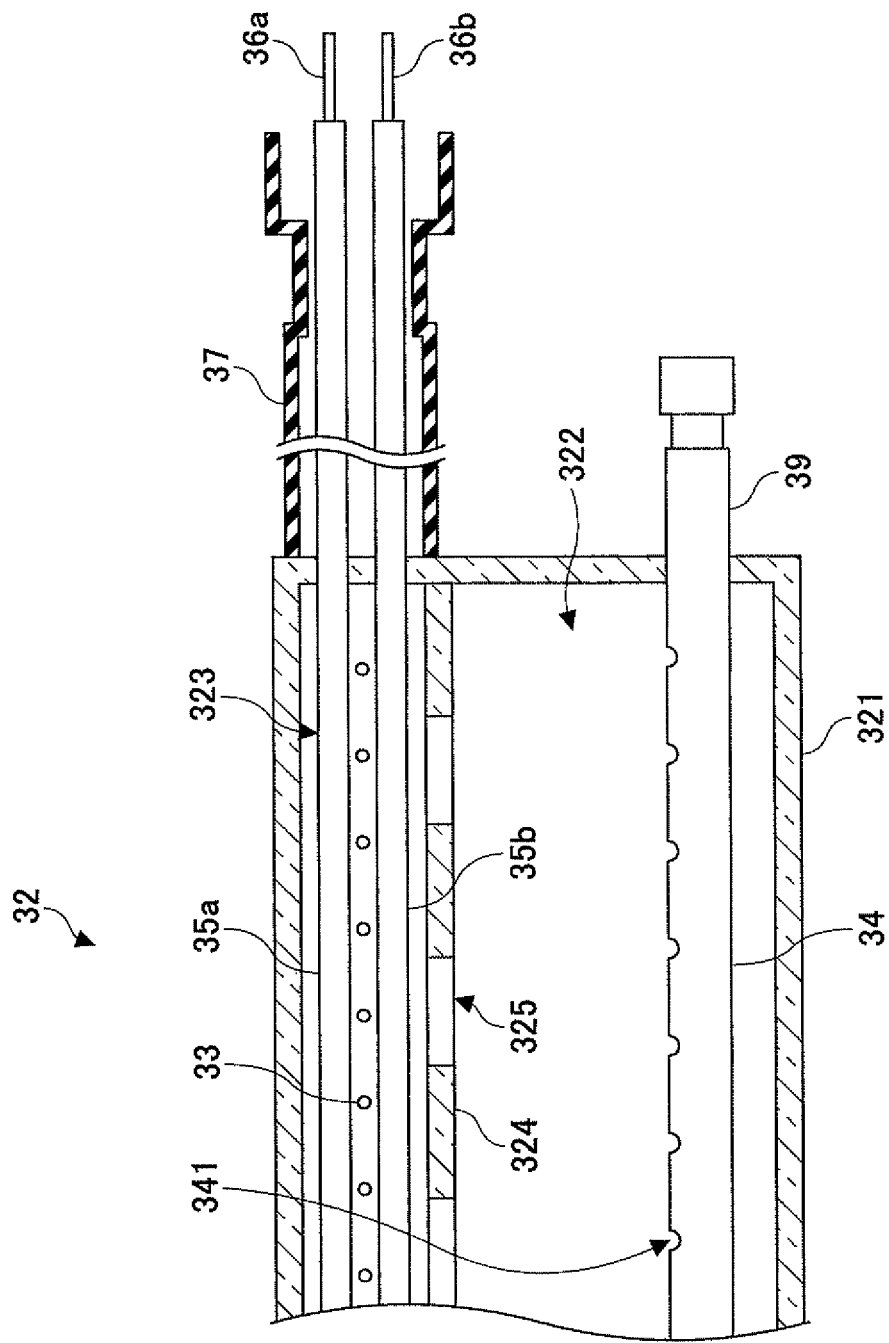
FIG. 11 is a cross-sectional view illustrating an inner configuration of a base end portion of the activated gas injector.

In the gas activation chamber 323, two sheath pipes 35a, 35b made of dielectric materials, for example, ceramics, extend from the base end to the distal end of the gas activation chamber 323 along the partition wall 324. The sheath pipes 35a, 35b are horizontally arranged in parallel with each other with a gap therebetween. Electrodes 36a, 36b made of, for example, nickel alloy, which has an excellent heat resistance, and having a diameter of about 5 mm, are inserted into the corresponding sheath pipes 35a, 35b in the direction from the base end to the distal end. Specifically, two of the electrodes 36a, 36b are arranged in parallel with each other leaving a distance of, for example, 2 mm through 10 mm, preferably 4 mm between the electrodes 36a, 36b, and the corresponding sheath pipes 35a, 35b made of ceramics surround the electrodes 36a, 36b. Base ends of the electrodes 36a, 36b are drawn out from the injector body 321, and connected to a high frequency power source (not shown) via a matching box (not shown) outside of the vacuum chamber 1. With this, high frequency power at a frequency of, for example, 13.56 MHz is supplied at a power level of, for example, 10 W through 200 W, preferably 100 W, to the electrodes 36a, 36b, which causes capacitively-coupled plasma in a plasma generation portion 351 between the two sheath pipes 35a, 35b, thereby activating the $NH_3$ gas flowing through the plasma generation portion 351. Incidentally, the sheath pipes 35a, 35b also extend out through the base end wall of the injector body 321 and the extended-out portions of the sheath pipes 35a, 35b are surrounded by a guard pipe 37 made of, for example, ceramics, as the shown in FIG. 11.

The injector body 321 has in its bottom below the plasma generation portion 351 gas ejection holes 33 that allow the activated $NH_3$ gas to flow downward. The gas ejection holes 33 are arranged at predetermined intervals along the longitudinal direction of the electrodes 36a, 36b. In addition, a relationship of a distance "h1" between the ceiling surface of the gas activation chamber 351 and the sheath pipe 35a (35b) with respect to a distance "w1" between the partition wall 324 and the sheath pipe 35b is determined to be, for example, h1≥w1. Therefore, the $NH_3$ gas flowing into the gas activation chamber 323 from the gas introduction chamber 322 mainly flows through the plasma generation portion 351 rather than a space between the partition wall 324 and the sheath pipe 35b.

The injector body 321 so configured is cantilevered by attaching the joint 38 and the guard pipe 37 to the circumferential wall of the chamber body 12, and extended so that the distal end of the injector body 321 is directed toward the center of the turntable 2. In addition, the bottom of the injector body 32 is located so that a distance between the gas ejection holes 33 of the gas activation chamber 323 and the wafer W placed in the concave portion 24 of the turntable 2 is, for example, 1 mm through 10 mm, preferably 10 mm. The injector body 321 is detachably attached to the chamber body 12, and the guard pipe 37 is fixed to the chamber body 12 via, for example, an O-ring (not shown), thereby keeping the vacuum chamber 1 hermetically sealed.

The film deposition apparatus according to this embodiment is provided with a controller 100 (FIG. 4) in order to control operations (including operations in the other embodiments explained later) of the deposition apparatus. The control portion 100 includes a process controller 100a formed of, for example, a computer, a user interface portion 100b, and a memory device 100c. The memory device 100c stores a program for operating the apparatus. The program includes a group of steps for executing an operation of the apparatus described later, and may be installed to the memory device 100c from a storing medium 100d such as a hard disk, a compact disk, a magneto-optical disk, a memory card, a flexible disk, and the like.

Next, a process carried out in the film deposition apparatus according to this embodiment is explained. First, the gate valve (not shown) is opened. Then, the wafer W is transferred into the vacuum chamber 1 through the transfer opening 15 by the transfer arm 10 (FIG. 10) and transferred to the concave portion 24. This wafer transferring is carried out by raising/lowering the elevation pins when the concave portion 24 stops in a position in alignment with the transfer opening 15. Such wafer transferring is carried out by intermittently rotating the turntable 2, and five wafers are placed in the corresponding concave portions 24. Next, the gate valve is closed; the vacuum chamber 1 is evacuated to a predetermined pressure;

and the wafers W are heated by the heater unit 7 via the turntable 2 while rotating the turntable 2. Specifically, the turntable 2 is heated in advance at a temperature of, for example, 300° C., and the wafers W are heated upon being placed on the turntable 2 (the concave portions 24). After the temperature of the wafers W is confirmed to be the predetermined temperature by a temperature sensor (not shown), the DCS gas is supplied from the first reaction gas nozzle 31, the $NH_3$ gas is supplied from the activated gas injector 32, and the $N_2$ gas is supplied from the first and the second separation gas nozzles 41, 42.

Figure 12:
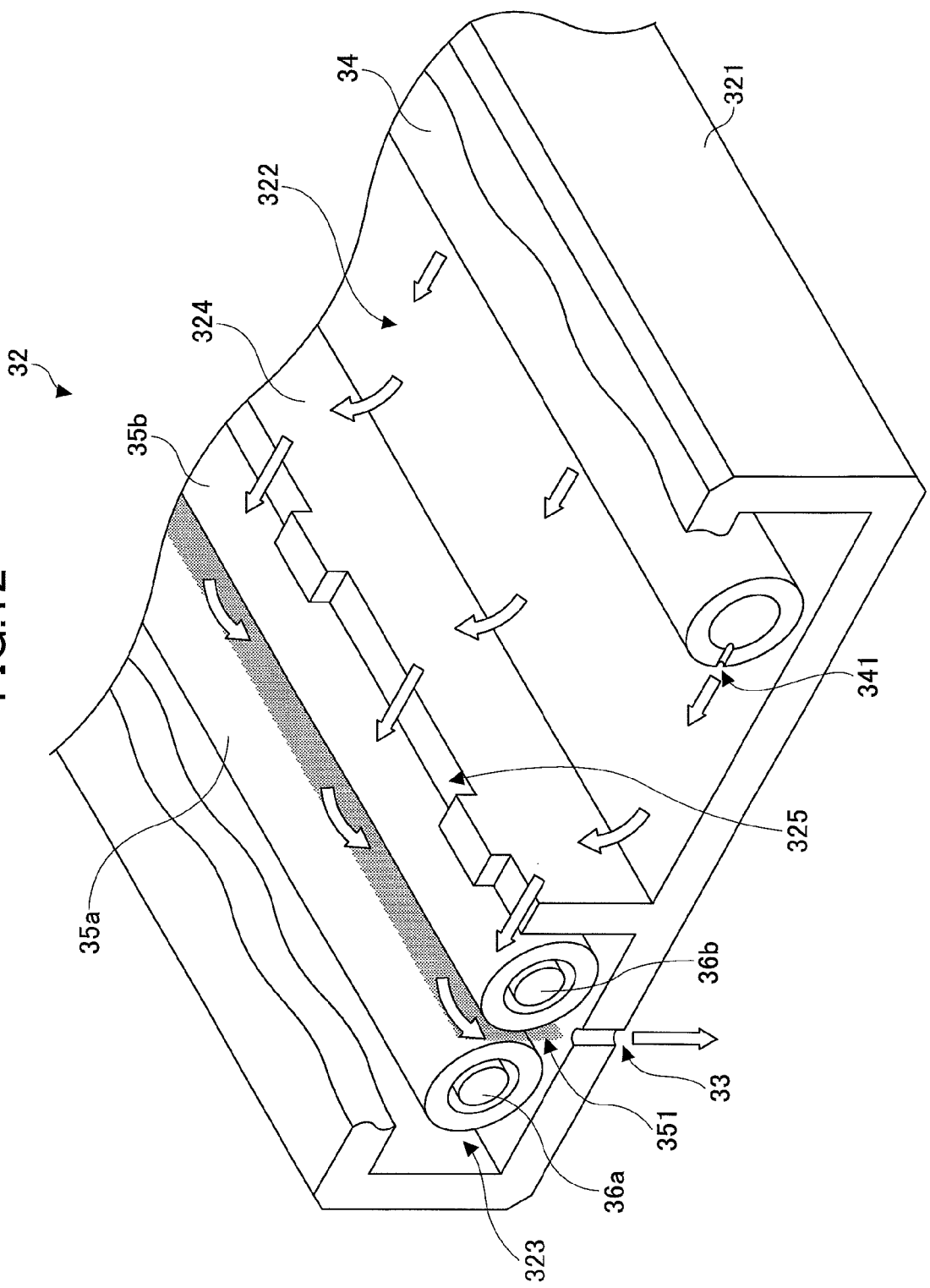
FIG. 12 is an explanatory view for explaining a gas flow pattern in the activated gas injector.

In this case, the $NH_3$ gas is supplied from the gas supplying port 32a to the gas introduction nozzle 34, and further into the gas introduction chamber 322 through the gas holes 341 made in the circumferential wall of the gas introduction nozzle 34 in the gas introduction chamber 322. The $NH_3$ gas spreads in the gas introduction chamber 322 so that a concentration of the $NH_3$ gas becomes uniform along the longitudinal direction of the injector body 321. The $NH_3$ gas flows toward the partition wall 324 opposing the gas holes 341 as shown in FIG. 12. When the $NH_3$ gas reaches the partition wall 324, the $NH_3$ gas flows upward along the partition wall 324 and flows into an upper portion of the gas activation chamber 323 via the cut-out portions 325 of the partition wall 324.

On the other hand, because the inside of the vacuum chamber 1 is kept at vacuum, the $NH_3$ gas flowing into the upper portion of the gas activation chamber 323 flows downward through the plasma generation portion 351 between the two sheath pipes 35a, 35b. At this time, because high frequency power is supplied to the electrodes 36a, 36b in the corresponding sheath pipes 35a, 35b, the $NH_3$ gas is activated into plasma when flowing through the plasma generation portion 351 and flows farther to the gas ejection holes 33.

The activated $NH_3$ gas is supplied into the vacuum chamber 1 immediately after the $NH_3$ gas flows through the plasma generation portion 351. Therefore, the activated $NH_3$ gas can reach the wafers W without losing its chemical activity. Alternatively, even if chemical activity is reduced, the $NH_3$ gas still has a sufficient level of chemical activity, compared with a case where the $NH_3$ gas flows through a relatively long nozzle to reach the wafers W. In addition, because the plasma generation portion 351 is formed between the two sheath pipes 35a, 35b extending along the longitudinal direction of the injector body 321 and above the gas ejection holes 33, the activated $NH_3$ gas can reach the gas ejection holes 33 at a uniform concentration. Namely, the activated $NH_3$ gas is supplied from the activated gas injector 32 to the wafer W at a uniform level of chemical activity along the longitudinal direction.

Under such circumstances, because the wafers W can alternately pass through the first process area P1 where the first reaction gas nozzle 31 is provided and the second process area P2 where the activated gas injector 32 is provided due to rotation of the turntable 2, the DCS gas is adsorbed on the wafers W and then the activated $NH_3$ gas is adsorbed on the wafers W. The DCS molecules and the $NH_3$ molecules react with each other on the wafers W, and a molecular layer(s) of silicon nitride is produced. After predetermined rotations of the turntable 2, the silicon nitride film having a predetermined thickness is deposited on the wafers W.

At this time, the $N_2$ gas serving as the separation gas is supplied from the separation gas supplying pipe 51 (FIG. 2) and ejected along the upper surface of the turntable 2 from the center area C, namely, the gap 50 between the protrusion portion 5 and the turntable 2. In the illustrated example, the inner circumferential surface of the chamber body 12 is dented in the process areas P1, P2 where the reaction gas nozzle 31 and the activated gas injector 32 are arranged, respectively, or below the second ceiling surfaces 45, leaving larger spaces (the evacuation area 6) next to process areas P1, P2. Because the evacuation ports 61, 62 are located below these large spaces, the pressure in the spaces below the second ceiling surfaces 45 is lower than the pressure in the thin space below the first ceiling surface 44 and the center area C.

Figure 13:
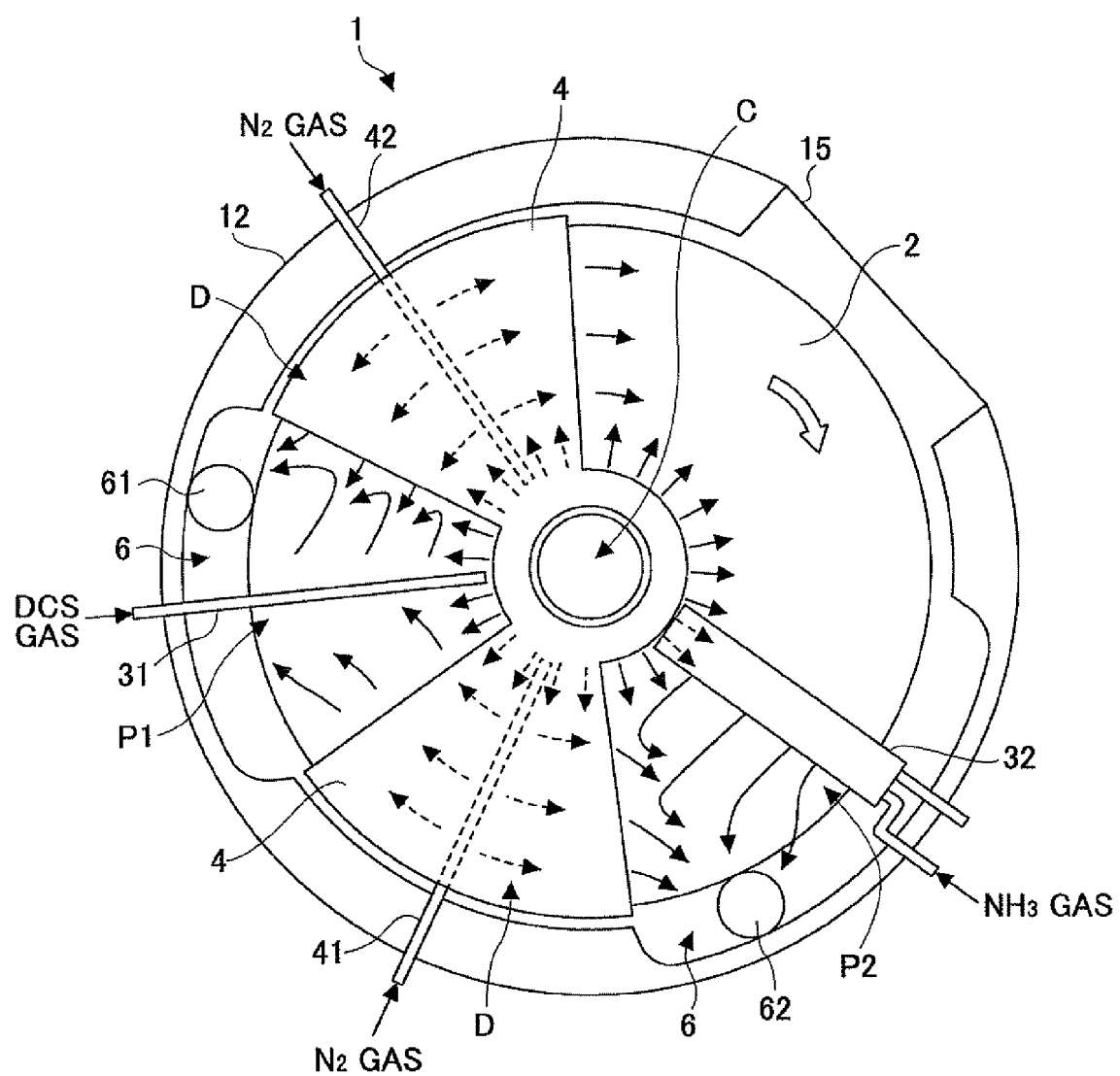
FIG. 13 is an explanatory view illustrating a gas flow pattern in a vacuum chamber of the film deposition apparatus of FIG. 2.

Flow patterns of the gases in the vacuum chamber 1 when the gases are supplied from the gas nozzles 31, 41, 42 and the activated gas injector 32, the gas supplying pipe 51 to the vacuum chamber 1 are shown in FIG. 13. Part of the $NH_3$ gas ejected from the activated gas injector 32 hits and flows along the top surface of the turntable 2 (and the surface of the wafer W) in a direction opposite to the rotation direction of the turntable 2. Then, the $NH_3$ gas is pushed back by the $N_2$ gas flowing along the rotation direction, and changes the flow direction toward the edge of the turntable 2 and the inner circumferential wall of the chamber body 12. Finally, this part of the $O_3$ gas flows into the evacuation area 6 and is evacuated from the vacuum chamber 1 through the evacuation port 62.

Another part of the $NH_3$ gas ejected from the activated gas injector 32 hits and flows along the top surface of the turntable 2 (and the surface of the wafers W) in the same direction as the rotation direction of the turntable 2. This part of the $NH_3$ gas mainly flows toward the evacuation area 6 due to the $N_2$ gas flowing from the center portion C and suction force through the evacuation port 62. Even so, a small portion of this part of the $NH_3$ gas flows toward the separation area D located downstream of the rotation direction of the turntable 2 with respect to the activated gas injector 32 and may enter the gap between the ceiling surface 44 and the turntable 2. However, because the height h and the circumferential length of the gap are designed so that the $NH_3$ gas is impeded from flowing into the gap under film deposition conditions intended, the small portion of the $NH_3$ gas cannot flow into the gap below the convex portion 4. Even when a small fraction of the $NH_3$ gas flows into the gap, the fraction of the $NH_3$ gas cannot flow farther into the separation area D, because the fraction of the $NH_3$ gas is pushed backward by the $N_2$ gas ejected from the separation gas nozzle 41. Then, substantially all the part of the $NH_3$ gas flowing along the top surface of the turntable 2 in the rotation direction flows into the evacuation area 6 through between the circumference of the turntable 2 and the inner circumferential wall of the vacuum chamber 1, and is evacuated through the evacuation port 62 along with the $N_2$ gas ejected from the center area C, as shown in FIG. 13.

Similarly, the DCS gas ejected from the first reaction gas nozzle 31 to flow along the top surface of the turntable 2 (and the surface of the wafers W) in the rotation direction of the turntable 2 and the opposite direction cannot flow into the gaps below the convex portions 4 located upstream and downstream of the rotation direction, respectively. Alternatively, even when a fraction of the DCS gas enters the gaps, the fraction of the DCS gas is pushed backward to the process areas P1, P2 by the $N_2$ gas ejected from the center area C. Then, the DOCS gas flows into the evacuation area 6 between the circumference of the turntable 2 and the inner circumferential wall of the vacuum chamber 1, and is evacuated through the evacuation port 61 along with the $N_2$ gas ejected from the center area C. As stated above, the separation areas D may impede the DOCS gas and the $NH_3$ gas from flowing thereinto, or may greatly reduce the amount of the DCS gas and the $NH_3$ gas flowing thereinto, or may push the DCS gas and the $NH_3$ gas backward. On the other hand, the DCS molecules and the $NH_3$ molecules adsorbed on the wafer W are allowed to go through the separation area D (below the lower ceiling surface 44), contributing to the film deposition.

Additionally, the DCS gas in the first process area P1 (the $NH_3$ gas in the second process area P2) is impeded from flowing into the center area C, because the separation gas is ejected toward the outer circumferential edge of the turntable 2 from the center area C, as shown in FIGS. 7 and 13. Even if a fraction of the DCS gas in the first process area P1 (the $NH_3$ gas in the second process area P2) flows into the center area C, the DCS gas (the $NH_3$ gas) is pushed backward by the separation gas, so that the DCS gas in the first process area P1 (the $NH_3$ gas in the second process area P2) is impeded from flowing into the second process area P2 (the first process area P1) through the center area C.

Moreover, the DCS gas in the first process area P1 (the $O_3$ gas in the second process area P2) is impeded from flowing into the second process area P2 (the first process area P1) through the space between the turntable 2 and the inner circumferential wall of the chamber body 12. This is because the bent portion 46 is formed downward from the convex portion 4 so that the gaps between the bent portion 46 and the turntable 2 and between the bent portion 46 and the inner circumferential wall of the chamber body 12 are as small as the height h of the ceiling surface 44 of the convex portion 4, thereby substantially preventing gaseous communication between the two process areas, as stated above. Therefore, the two separation areas D separate the first process area P1 and the second process area P2.

An example of process parameters preferable in the film deposition apparatus according to this embodiment is listed in the following. A rotational speed of the turntable 2 is 1 through 500 rpm (in the case of the wafer W having a diameter of 300 mm); a pressure in the vacuum chamber 1 is about 1.067 kPa (8 Torr); a temperature of the wafers W is about 350° C.; a flow rate of the DCS gas is 100 sccm; a flow rate of the $NH_3$ gas is about 10000 sccm; a flow rate of the $N_2$ gas from the separation gas nozzles 41, 42 is about 20000 sccm; and a flow rate of the $N_2$ gas from the separation gas supplying pipe 51 at the center of the vacuum chamber 1 is about 5000 sccm. In addition, the number of cycles of alternately supplying the reaction gases to the wafers W, namely, the number of times when the wafers W alternately pass through the process area P1 and the process area P2 is about 600, though it may be changed depending on the film thickness required.

The film deposition apparatus according to this embodiment of the present invention has the following advantages. In the film deposition apparatus enabling the ALD (MLD) method to be carried out in which the plural wafers are placed on the turntable 2 along the rotation direction of the turntable 2 and made alternately to pass through the first reaction area P1 and the second reaction area P2 by rotating the turntable 2, the activated gas injector 32 includes the pair of the electrodes 36a, 36b for activating the NH3 gas, and the electrodes 36a, 36b are arranged in parallel with each other and extend along the longitudinal direction of the activated gas injector 32. Therefore, the activated NH3 gas can be supplied toward the wafers at a concentration uniform along the direction from the base end to the distal end of the activated gas injector 32. Therefore, a silicon nitride film with uniform thickness and properties can be deposited on the wafers, compared with a case where the NH3 gas is activated by the electrodes arranged in the circumferential wall of the vacuum chamber 1 and the activated $NH_3$ gas is supplied to the vacuum chamber 1 through a relatively fine nozzle.

If the electrodes are provided in the circumferential wall of the vacuum chamber 1 in order to activate and supply the $NH_3$ gas to the vacuum chamber 1 through the fine nozzle, higher high frequency power has to be supplied to the electrodes in order to generate plasma with a higher degree of dissociation and to allow as large an amount of the active $NH_3$ gas as possible to reach the distal end of the fine nozzle. On the other hand, according to the activated gas injector 32 of this embodiment, a higher degree of dissociation is not necessary in order to obtain a sufficient amount of the activated $NH_3$ gas because the injector body 321 of the activated gas injector 32 is located 1 mm through 10 mm above the turntable 2 and, the electrodes 36a, 36b are arranged in the injector body 321. As a result, the film deposition may be carried out with low energy consumption.

Moreover, according to embodiments of the present invention, the plural wafers are placed on the turntable 2 along the rotation direction of the turntable 2 and alternately pass through the first process area P1 and the second reaction area P2, thereby realizing the ALD (MLD) mode film deposition. Therefore, a high throughput film deposition is realized.

Furthermore, because the film deposition apparatus has the separation areas D including the low ceiling surface 44 between the first process area P1 and the second process area P2 and the separation gas is ejected from the center portion C defined by the rotation center of the turntable 2 and the vacuum chamber 1, and the reaction gases are evacuated, along with the separation gas spreading on both sides of the separation area D from the separation gas nozzle and the separation gas ejected from the center area C, through the gap between the circumferential edge of the turntable 2 and the inner circumferential wall of the chamber body 12, the reaction gases are impeded from being mixed with each other, thereby preferably realizing the film deposition. Moreover, because the reaction gases are not mixed, almost no deposits are made from the reaction gases on the turntable 2, thereby reducing particle problems. Incidentally, while the turntable 2 has five concave portions 24 in this embodiment, the turntable 2 may have only one concave portion 24.

Moreover, because the activated gas injector 32 is detachably attached to the chamber body 12 of the vacuum chamber 1, maintenance, replacement or modification of the activated gas injector(s) 32 may be easily carried out. Incidentally, the activated gas injector 32 may be attached on the lower surface of the ceiling plate 11 of the vacuum chamber 1.

Figure 14:
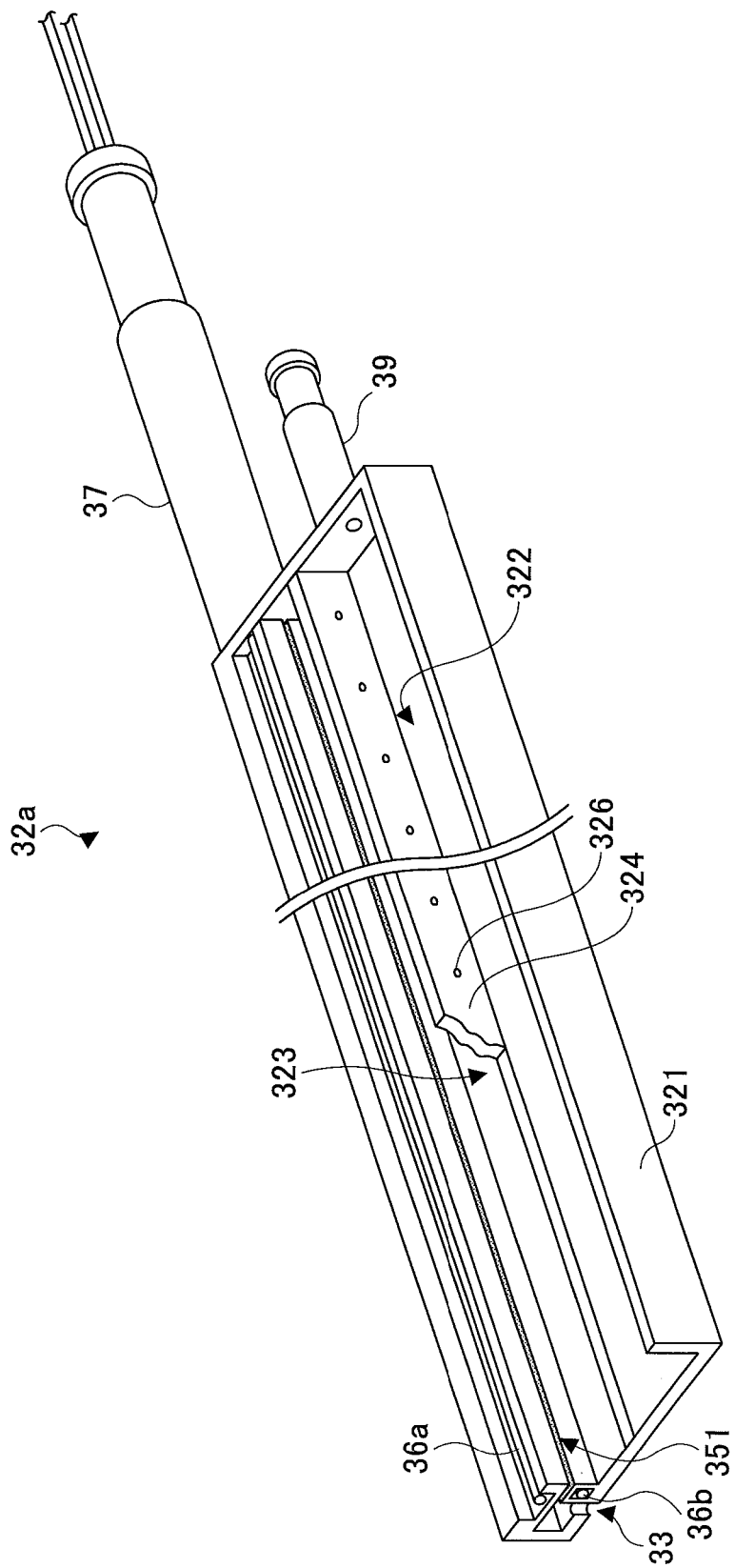
FIG. 14 is a perspective view illustrating an inner configuration of an activated gas injector according to a second embodiment.
Figure 15:
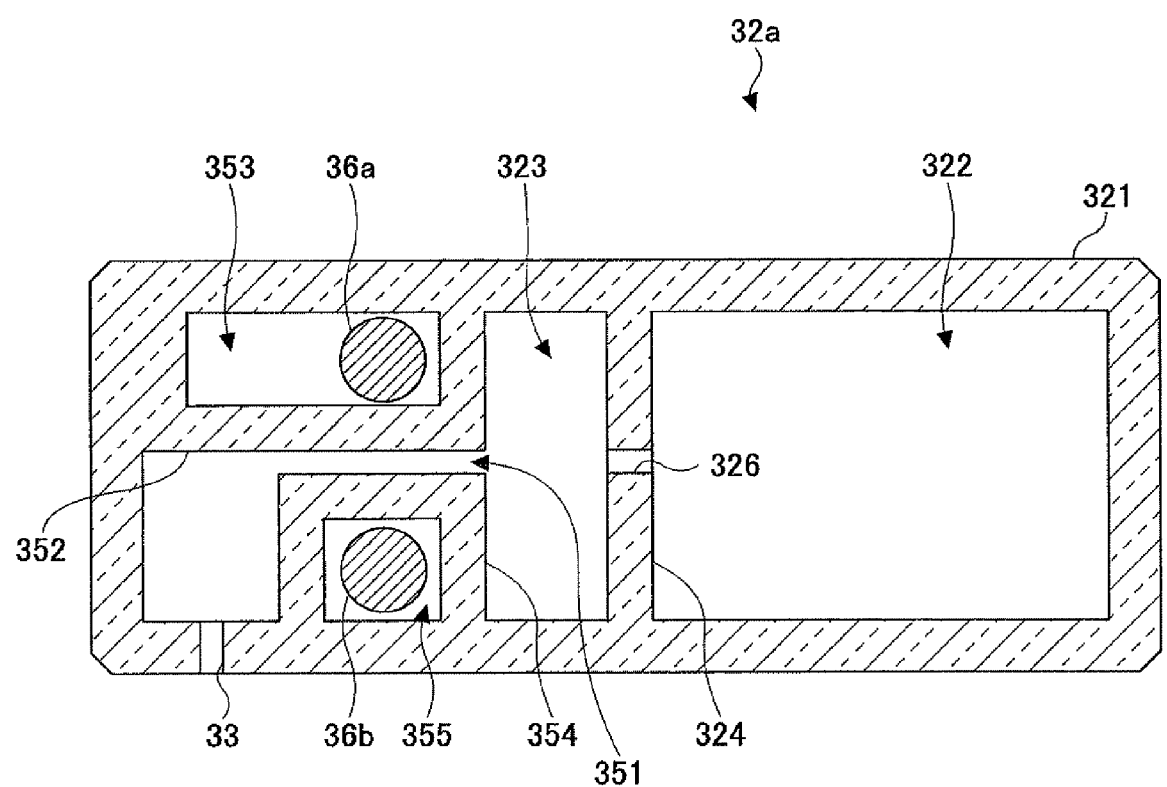
FIG. 15 is a cross-sectional view of the activated gas injector according to the second embodiment.
Figure 16:
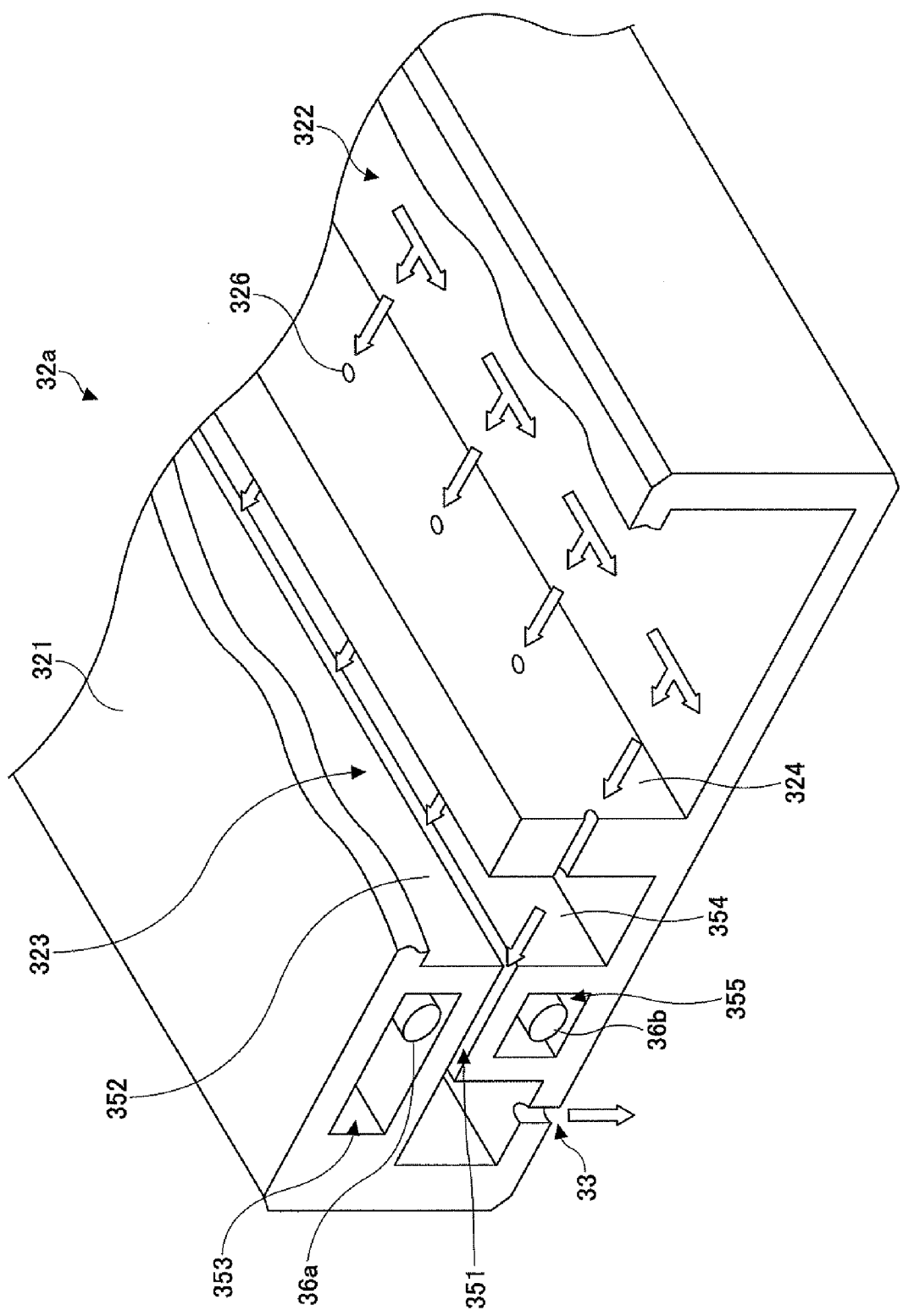
FIG. 16 is an explanatory view for explaining a gas flow pattern in the activated gas injector according to the second embodiment of the present invention.

Next, referring to FIGS. 14 through 16, an activated gas injector 32a according to a second embodiment of the present invention is explained. In these drawings, the same or corresponding reference numerals are given to the same or corresponding members or components as explained with reference to FIGS. 9 through 12.

The activated gas injector 32a according to the second embodiment is made of high purity alumina, which is more machinable than quartz, which is highly resistant to plasma etching and used to make the activated gas injector 32 of the first embodiment. The injector body 321 of the activated gas injector 32a according to the second embodiment is different from the first embodiment in that the $NH_3$ gas is introduced into the gas introduction chamber 322 from the gas introduction port 39 coupled to the base end of the injector body 321, while the activated gas injector 32 of the first embodiment uses the gas introduction nozzle 34. In addition, the injector body 321 of the activated gas injector 32a is different in that the partition wall 324 has plural through-holes 326 arranged at predetermined intervals in a vertically middle point or around of the partition wall 324, which allow gaseous communications between the gas introduction chamber 322 and the gas activation chamber 323, while the partition wall 321 in the first embodiment has the cut-out portions 325.

The gas activation chamber 323 of the activated gas injector 32a has two housing spaces 353, 355 configured by corresponding sheath members 352, 354 made of a dielectric material. The electrodes 36a, 36b are inserted into and arranged in the housing spaces 353, 355, respectively, as shown in FIG. 15. As shown, the two electrodes 36a, 36b are arranged one above the other and in parallel with each other, and the sheath members 352, 354 are arranged so that a gap is created between a lower surface of the upper sheath member 352 and an upper surface of the lower sheath member 354. This gap corresponds to the plasma generation portion 351. The sheath members 352, 354 are separately made of, for example, high purity alumina, which is also used to form the injector body 321, and attached by a ceramics adhesive or the like on the inner surface of the injector body 321. Incidentally, the activated gas injector 32a may be made of quartz, if machining capability allows.

With such a configuration, the $NH_3$ gas flowing through the plasma generation portion 351 between the electrodes 36a, 36b, which are arranged apart from each other by about 2 mm through about 10 mm, preferably about 4 mm, is activated into plasma by applying high frequency power from a high frequency power source to the electrodes 36a, 36b.

In addition, the lower sheath member 354 is located away from a (left) side wall of the injector body 321, leaving a space on the left. The $NE_3$ gas flows into this space from the plasma generation portion 351, and then farther flows into the vacuum chamber 1 through the gas ejection holes 33 below the space.

In the following, functions of the activated gas injector 32a according to the second embodiment of the present invention are explained. While the $NH_3$ gas introduced from the gas introduction port 39 flows from the base end to the distal end of the gas introduction chamber 322, the $NH_3$ gas flows into the gas activation chamber 323 through the through-holes 326. The $NH_3$ gas that has reached the gas activation chamber 323 flows into the plasma generation portion 351 between the sheath members 352, 354. The $NH_3$ gas is activated into plasma while flowing through the plasma generation portion 351, and the activated $NH_3$ gas flows into the gas ejection holes 33. In this embodiment, because the activated $NH_3$ gas is supplied into the vacuum chamber 1 immediately after flowing through the plasma generation portion 351, the $NH_3$ gas can be supplied to the wafers W at a highly active state. In addition, because the activated gas injector 32a has only one passage from the through-holes 326 of the partition wall 324 to the gas ejection holes 33, all of the $NH_3$ gas introduced into the gas activation chamber 323 flows through the plasma generation portion 351, and thus the $NH_3$ gas is effectively activated into plasma.

Figure 17:
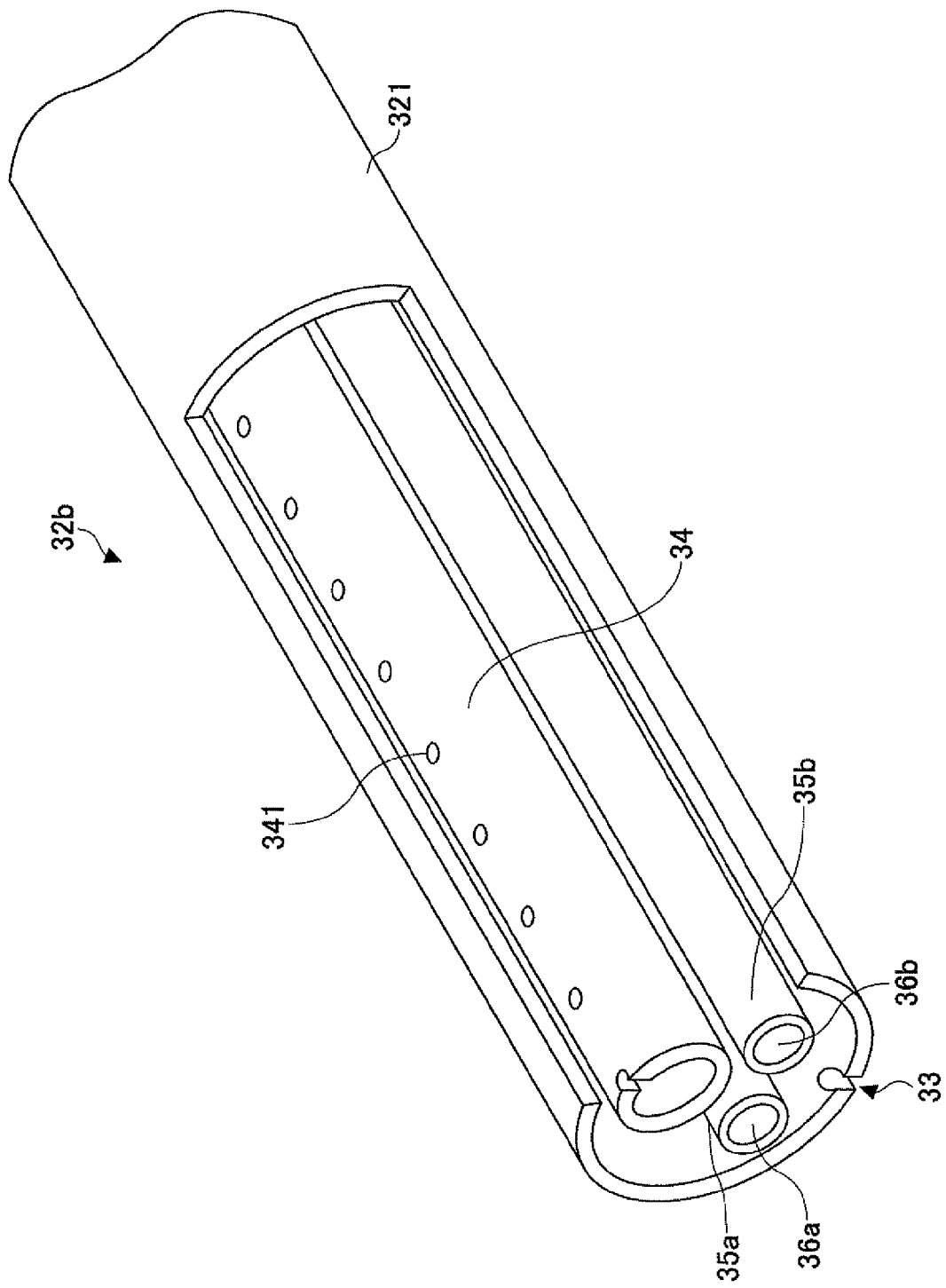
FIG. 17 is a perspective view of a modification example of the activated gas injector.
Figure 18:
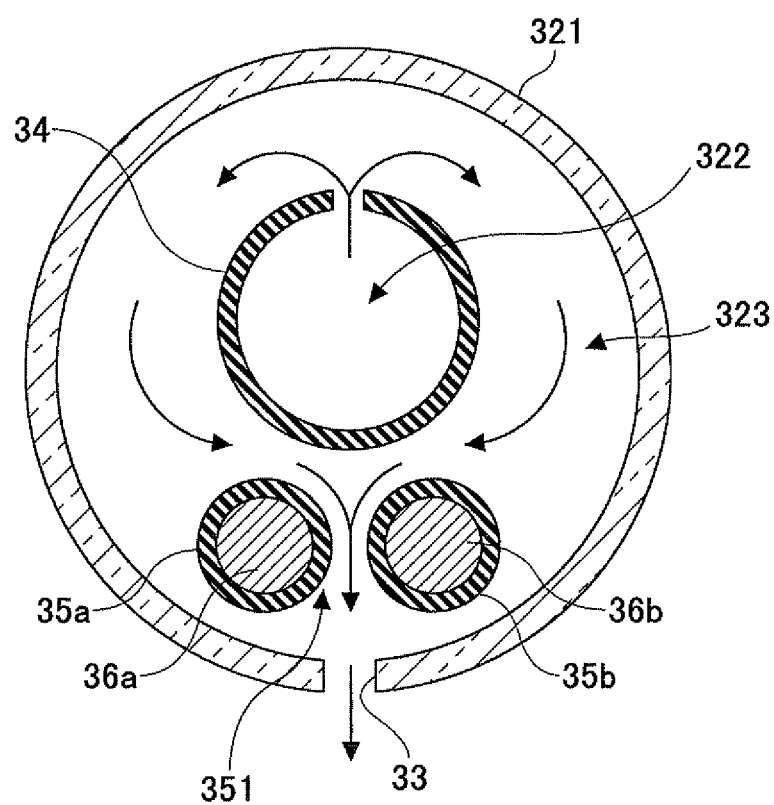
FIG. 18 shows a spatial relationship between a gas introduction nozzle and a pair of electrodes in an injector body.

A shape of the injector body 321 as the passage defining member is not limited to the rectangular parallelepiped illustrated in the first and the second embodiments. For example, the injector body 321 may have a shape of a cylinder, as shown in FIGS. 17 and 18. As shown, an activated gas injector 32b has a double cylinder structure having a cylindrical injector body 321 and the gas introduction nozzle 34 that is inserted into the injector body 321, and a pair of the electrodes 36a, 36b extending along the longitudinal direction of and below the gas introduction nozzle 34 inside the injector body 321. Specifically, the gas introduction nozzle 34 is arranged so that the gas holes 341 of the gas introduction nozzle 34 are open upward. In addition, the electrodes 36a, 36b are inserted into the corresponding sheath pipes 35a, 35b below the gas introduction nozzle 34 inside the injector body 321, and arranged in parallel with each other. With such a configuration, the plasma generation portion 351 is formed between the sheath pipes 35a, 35b (the pair of the electrodes 36a, 36b) above the gas ejection holes 33 formed in the injector body 321.

The $NH_3$ gas supplied to the injector body 321 through the gas holes 341 from the gas introduction nozzle 34 reaches the plasma generation portion 351 through a space between an outer circumferential wall of the gas introduction nozzle 34 and an inner surface of the injector body 321, as shown in FIG. 18. Then, the $NH_3$ gas is activated into plasma in the plasma generation portion 351, and the activated $NH_3$ gas is supplied to the wafers W through the gas ejection holes 33. In the illustrated example, the inside space of the gas introduction nozzle 34 corresponds to the gas introduction chamber 322 as the gas introduction passage; and the space between the gas introduction nozzle 34 and the injector body 321 corresponds to the gas activation chamber 323 as the gas activation passage. A cylindrical wall of the gas introduction nozzle 34 corresponds to the partition that separates the gas introduction chamber 322 and the gas activation chamber 323; and the gas holes 341 formed in the cylindrical wall correspond to the through-holes allowing the gaseous communication between the chambers 322, 323.

Figure 19:
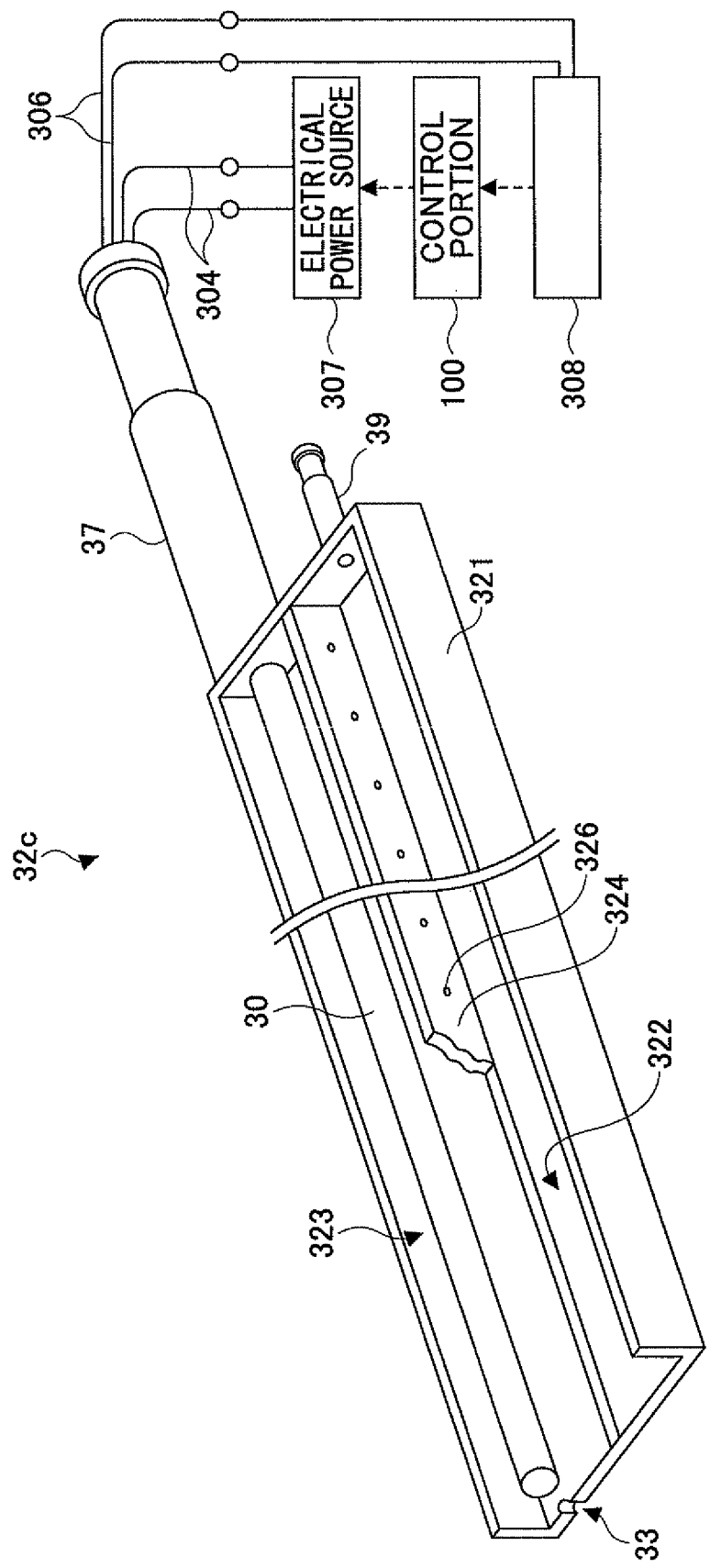
FIG. 19 is a schematic perspective view illustrating an activated gas injector according to a third embodiment of the present invention.
Figure 20:
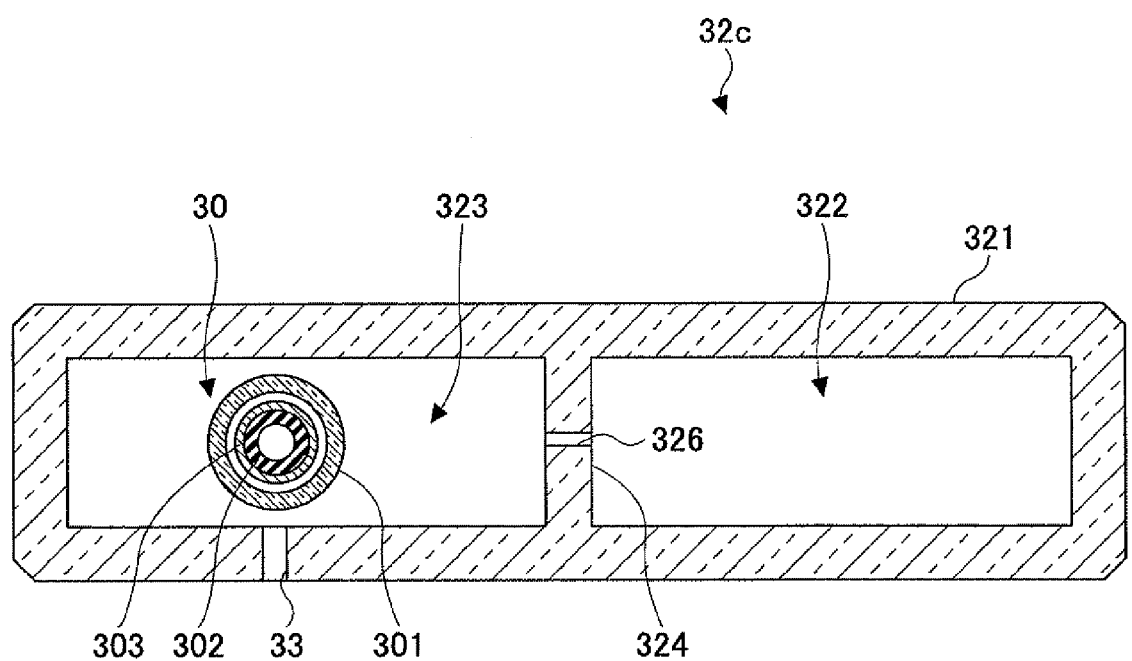
FIG. 20 is a cross-sectional view illustrating the activated gas injector according to the third embodiment.

Next, an activated gas injector 32c, which employs a heater configured to activate a reaction gas, according to a third embodiment of the present invention is explained. FIGS. 19 and 20 are perspective and cross-sectional views of the activated gas injector 32c according to the third embodiment, respectively. The same or corresponding reference numerals are given to the same or corresponding members of the activated gas injector 32 according to the first embodiment, in FIGS. 9 through 12.

The activated gas injector 32c has the injector body 321 having a shape of a rectangular parallelepiped and made of high purity alumina. In the injector body 321, there are the gas introduction chamber 322 as the gas introduction passage and the gas activation chamber 323 as the gas activation passage separated by the partition wall 324, as shown in FIG. 19. The gas introduction port 39 is connected to the base end of the gas introduction chamber 322, and a heater 30 (described later) is provided in the gas activation chamber 323. The two chambers 322, 323 are in gaseous communication with each other through the through-holes 326 arranged at predetermined intervals along the longitudinal direction of the partition wall 324.

Figure 21:
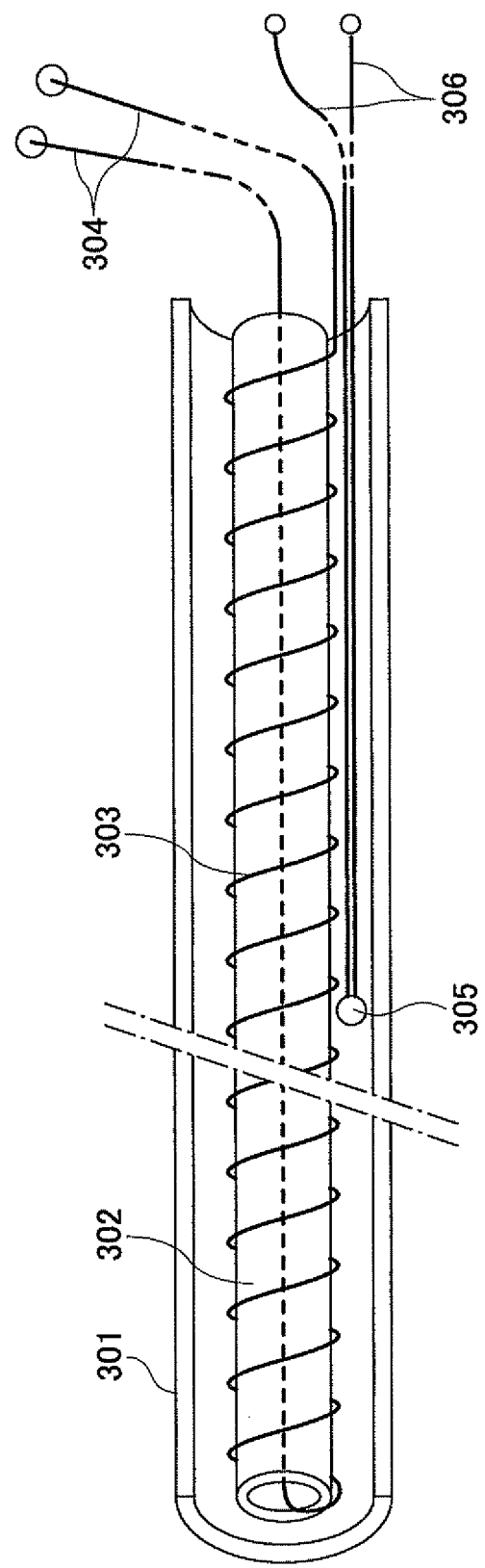
FIG. 21 is a partial fractured view illustrating a heater provided in the activated gas injector according to the third embodiment.

The heater 30 in the gas activation chamber 323 has a double cylinder structure. Specifically, the heater 30 has a cylindrical body 302 around which a resistive heating wire 303 is wound, and a cylindrical cover body 301 that covers the cylindrical body 302, as shown in FIG. 21. The cylindrical body 302 is made of, for example, ceramics such as alumina. The resistive heating wire 303 extends inside the cylindrical body 302 from the base end to the distal end of the cylindrical cover 302, and is wound around the outer circumferential surface of the cylindrical body 302 along the direction from the distal end to the base end of the cylindrical body 302. The resistive heating wire 302 is heated by electrical power supplied from an electrical power source, and thus heats the $NH_3$ gas supplied to the gas activation chamber 323, thereby activating the $NH_3$ gas.

The cover body 301 is an elongated cylindrical member that covers the cylindrical cover body 301, and is made of a transparent material such as quartz, which allows the heat radiated from the resistive heating wire 303 to transmit through to the gas activation chamber 323. As shown in FIG. 19, a distal end of the cover body 301 of the heater 30 is closed, and a base end of the cover body 301 is fixed at the side wall of the injector body 321, so that the inside of the cover body 301 is isolated from the gas activation chamber 323. In addition, the cylindrical body 302 penetrates through and is fixed at the side wall of the injector body 321. The resistive heating wire 303 is drawn out from the base end of the cylindrical body 302 and penetrates through the guard pipe 37 shown in FIG. 19. The resistive heating wire 303 drawn out from the cylindrical body 302 serves as a power feeding line 304 and is connected to an electrical power source 307.

In addition, a temperature sensing terminal 305 is inserted into a space between the cover body 301 and the cylindrical body 302, as shown in FIG. 21. A leading wire 306 drawn from the temperature sensing terminal 305 passes through the guard pipe 37 to the outside of the injector body 321 and is connected to a temperature sensing apparatus 308. The temperature sensing apparatus 308 outputs a signal indicating a temperature measured in accordance with, for example, a thermoelectric force caused in the temperature sensing terminal 305, which is, for example, a thermocouple, to the control portion 100 (FIG. 4). The control portion 100 adjusts an output voltage from an electrical power source in accordance with the temperature signal, thereby adjusting the temperature of the resistive heating wire 303.

In the following, functions of the activated gas injector 32c according to the third embodiment of the present invention are explained. The $NH_3$ gas introduced from the gas introduction port 39 flows from the base end to the distal end of the gas introduction chamber 322 and then flows into the gas activation chamber 323 through the through-holes 326. The $NH_3$ gas that has flowed into the gas activation chamber 323 is heated by radiation heat emitted from the heater 30 and thermally activated. The activated $NH_3$ gas flows toward the gas ejection holes 33. Even in this embodiment, because the activated $NH_3$ gas is supplied into the vacuum chamber 1 immediately after being activated, the $NH_3$ gas in a highly activated state is supplied to the wafers W. In addition, because the radiation heat from the heater 30 is used, the $NH_3$ gas flowing through the gas activation chamber 323 can be uniformly heated. Therefore, flow control of the $NH_3$ gas is not necessary and thus the activated gas injector 32c may be simply configured, while the flow control of the $NH_3$ gas is required in order for the $NH_3$ gas to flow through the plasma generation portion in the activated gas injectors employing plasma.

Figure 22:
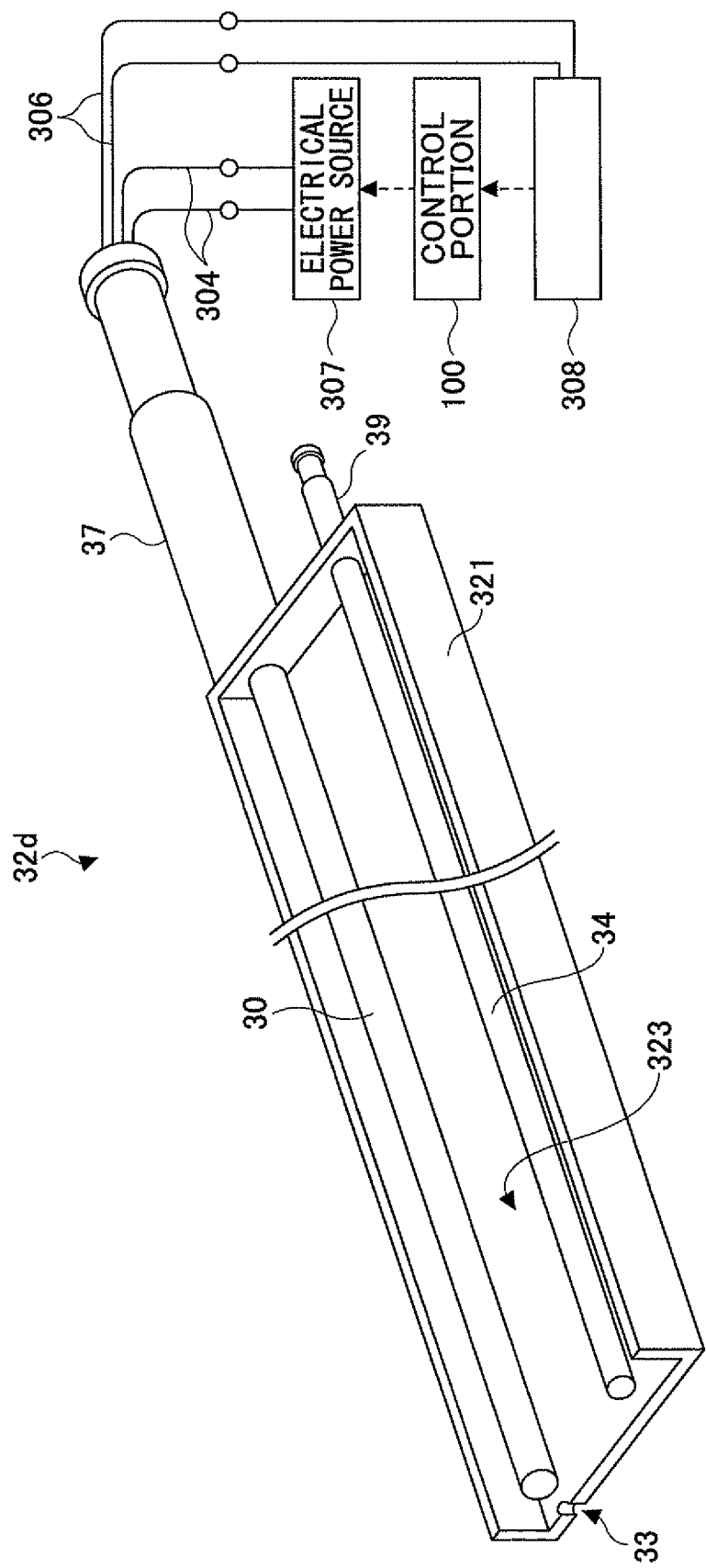
FIG. 22 is a perspective view illustrating an inner configuration of an activated gas injector according to a fourth embodiment of the present invention.
Figure 23:
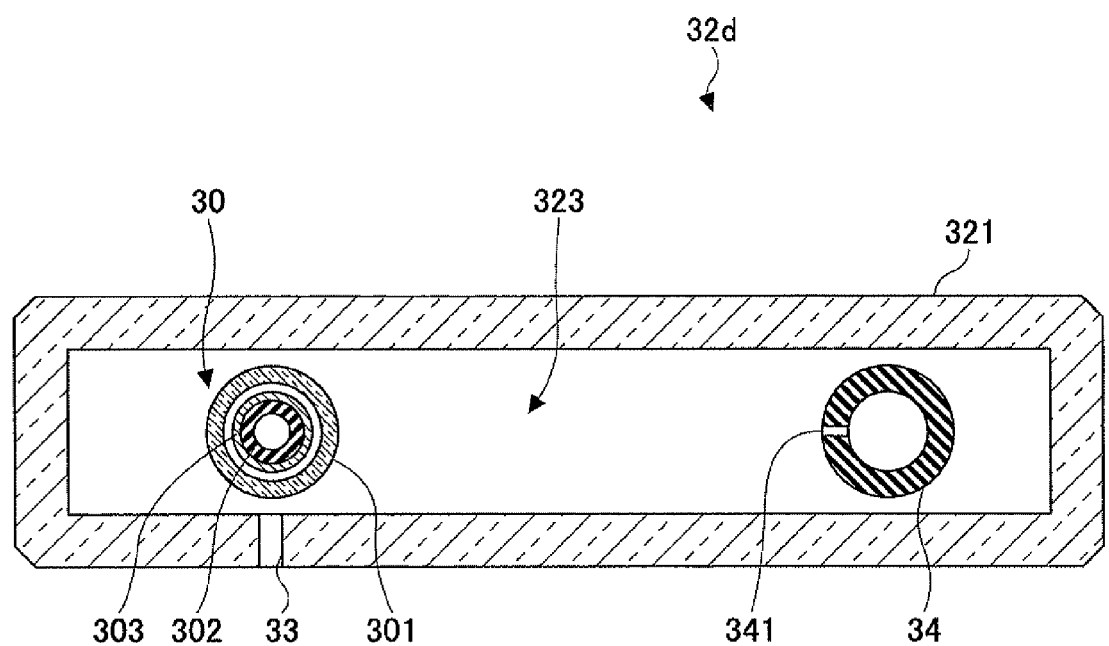
FIG. 23 is a cross-sectional view illustrating the activated gas injector according to the fourth embodiment.

In addition, when the heater 30 is used, the inside space of the injector body 321 may be entirely used as the gas activation chamber 323. An activated gas injector 32d according to a fourth embodiment of the present invention has such a configuration, as shown in FIGS. 22 and 23. Specifically, the activated gas injector 32d includes the gas introduction nozzle 34 that is connected to the gas introduction port 39 and extends in parallel with the heater 30 in the gas activation chamber 323. The $NH_3$ gas is introduced into the gas activation chamber 323 from the gas holes 341 formed in the circumferential wall of the gas introduction nozzle 34, heated to an activated state by the heater 30, and supplied to the wafers W through the gas ejection holes 33. In this case, the inside space of the gas introduction nozzle 34 corresponds to the gas introduction passage; the circumferential wall of the gas introduction nozzle 34 corresponds to the partition wall between the gas introduction passage and the gas activation chamber 323. In addition, the gas holes 342 of the gas introduction nozzle 34 correspond to the through-holes between the gas introduction passage and the gas activation chamber (gas activation passage) 323.

Even in this embodiment, the injector body 321 does not necessarily have a shape of a rectangular parallelepiped. For example, the activated gas injector 32b shown in FIGS. 17 and 18, which has a cylindrical shape, may be modified by replacing the electrodes 36a, 36b located below the gas introduction nozzle 34 with the heater(s) 30 exemplified in the third and the fourth embodiments in order to realize the injector body 321 having a cylindrical shape in this embodiment.

As reaction gases that may be used to deposit the silicon nitride film using the film deposition apparatus according to embodiments of the present invention, there are mono-silane, hexachlorodisilane (HCD), and the like as the silicon source and $N_2$, $N_2O$ or the like as the nitrogen source. The nitrogen-containing gases may be activated or the silicon-containing gases may be activated.

The film deposition apparatus according to an embodiment of the present invention is applicable to deposition of not only the SiN film but also a silicon oxide film and other films. For example, bis(tertiary-butylamino)silane (BTBAS), dichlorosilane (DCS), hexachlorodisilane (HCD), Trimethyl Aluminum (TMA), tris(dimethyl amino)silane (3 DMAS), tetrakis-ethyl-methyl-amino-zirconium (TEMAZr), tetrakis-ethyl-methyl-amino-hafnium (TEMHf), bis(tetra methyl heptandionate)strontium ($Sr(THD)_2$), (methyl-pentadionate)(bis-tetra-methyl-heptandionate)titanium (Ti(MPD)(THD)), monoamino-silane, or the like may be used as the first reaction gas; and ozone ($O_3$) and water vapor may be used as the second reaction gas that oxidizes the above-listed first reaction gases. The activated gas injectors 32 and 32a through 32d explained above may be used for the oxidizing gases. Alternatively, the activated gas injectors 32, and 32a through 32d may be used for the first reaction gases.

The activated gas injectors 32, 32a according to the first and the second embodiments may have slit-shaped gas ejection holes 33 that eject the activated $NH_3$ gas into the vacuum chamber 1. Additionally, in the activated gas injector 32a according to the second embodiment, the sheath members 352, 354 may be arranged side by side along a horizontal direction and such gas ejection holes 33 may be formed below the plasma generation portion 351 defined between the sheath members 352, 354. Moreover, another activated gas injector may be configured by modifying the activated gas injector 32a according to the second embodiment in such a manner that the gas introduction nozzle 34 shown in the first embodiment is provided in the inner space of the injector body 321 without the partition wall 324, in other embodiments. With this configuration, the $NH_3$ gas is introduced toward the plasma generation portion 351 from the gas introduction nozzle 34 in the inner space of the injector body 321.

Figure 24A:
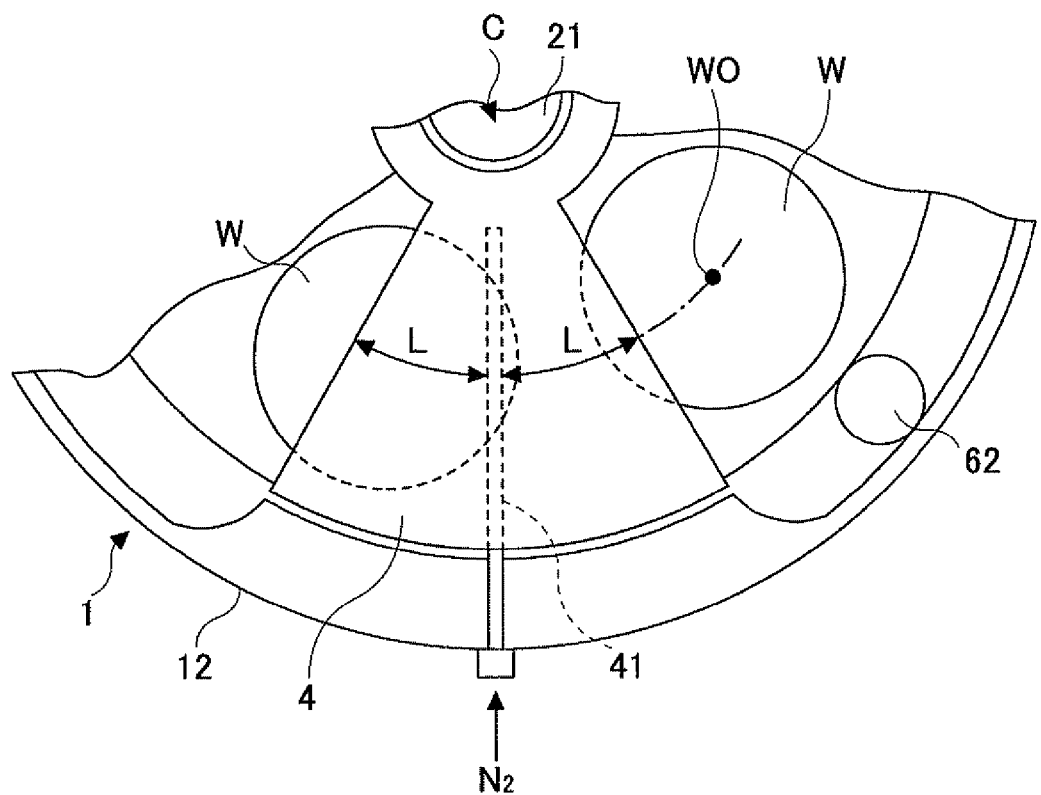
FIGS. 24A and 24B are explanatory views for explaining an example of dimensions of a convex portion to be used in a separation area.
Figure 24B:
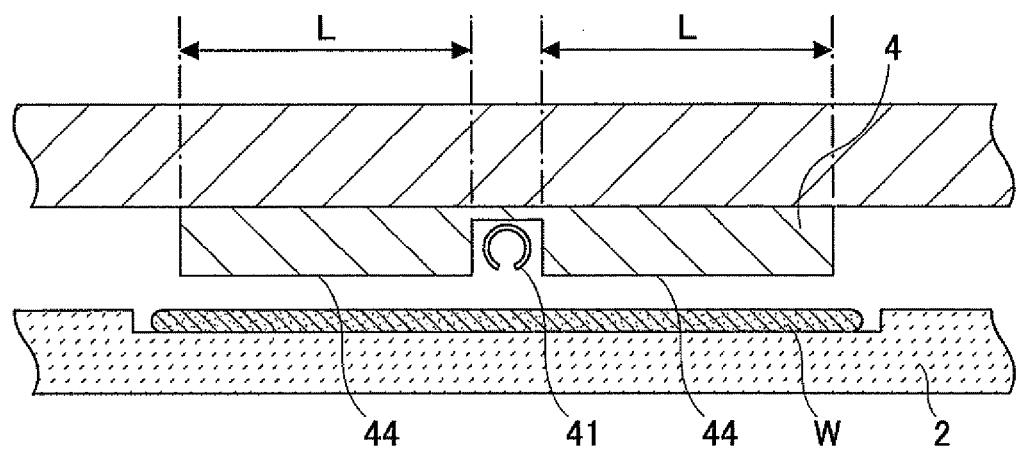

As shown in FIGS. 24A and 24B, the ceiling surface 44 that creates the thin space in both sides of the separation gas nozzle 41 (42) may preferably have a length L of about 50 mm or more, which is measured along a route through which a wafer center WO passes due to the rotation of the turntable 2, when the wafer W to be processed has a diameter of 300 mm. When the length L is set to be small, the height h of the ceiling surface 44 from the turntable 2 needs to be small accordingly in order to efficiently impede the reaction gases from entering the thin space below the ceiling surface 44 from both sides of the convex portion 4. In addition, because a circumferential speed of the turntable 2 becomes greater in a position farther away from the center of the turntable 2, the length L is required to be longer in the position farther away from the center of the turntable 2 in order to impede the reaction gases from entering the thin space below the ceiling surface 44. Taking account of the above, when the length L measured along the route through which the wafer center WO passes is smaller than 50 mm, the height h of the thin space needs to be significantly small. Therefore, measures to damp vibration of the turntable 2 are required in order to prevent the turntable 2 or the wafer W from hitting the ceiling surface 44 when the turntable 2 is rotated. In addition, when the rotational speed of the turntable 2 is higher, the reaction gas tends to enter the space below the convex portion 4 from the upstream side of the convex portion 4. Therefore, when the length L is smaller than 50 mm, the rotational speed of the turntable 2 needs to be reduced, which is inadvisable in terms of throughput. Therefore, the length L is preferably 50 mm or more, while the length L smaller than 50 mm can demonstrate the effect explained above depending on the situation. Specifically, the length L is preferably from about one-tenth of a diameter of the wafer W through about a diameter of the wafer W, more preferably, about one-sixth or more of the diameter of the wafer W along an arc that corresponds to a route through which a wafer center WO passes. Incidentally, the concave portion 24 is omitted in FIG. 24A, for simplicity of illustration.

Figure 25:
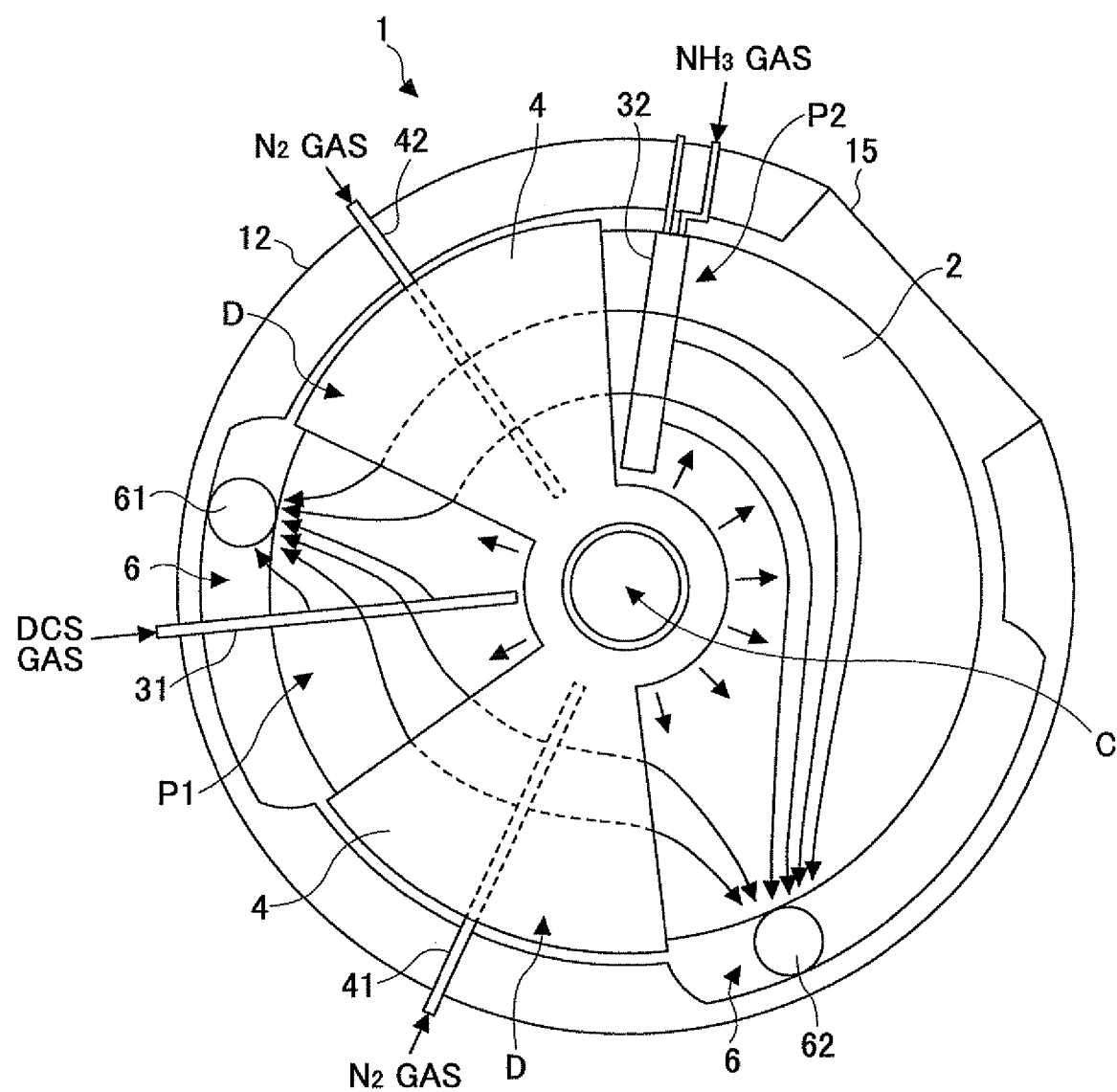
FIG. 25 is a plan view of a vacuum chamber of a film deposition apparatus according to another embodiment.

Other layouts of the process areas P1, P2 and the separation area D are explained. In FIG. 25, the activated gas injector 32 (32a, 32b, 32c, 32d) is located at the upstream side relative to the rotation direction of the turntable 2 with respect to the transfer port 15. Even in this layout, the same effects can be demonstrated.

Figure 26:
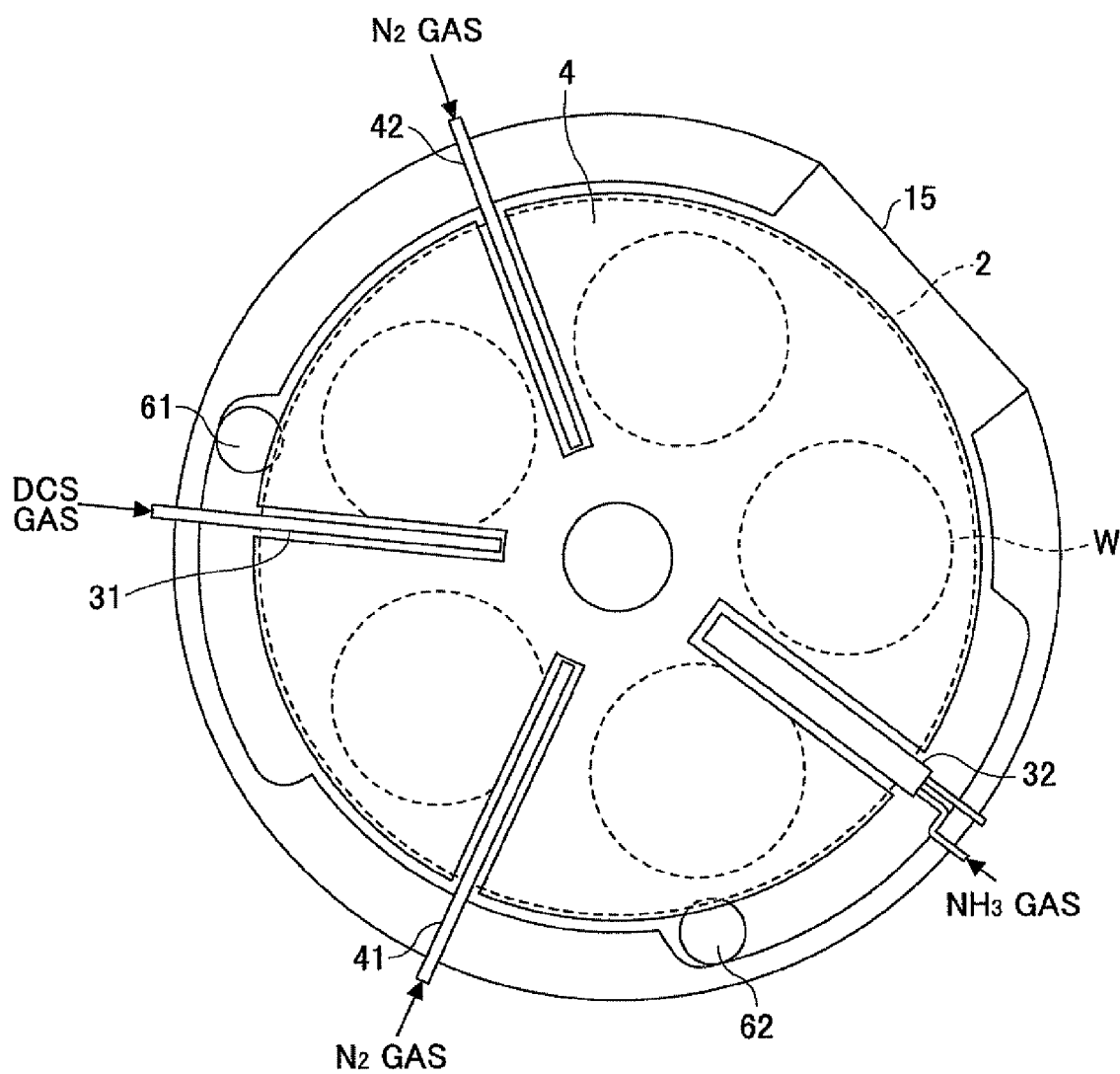
FIG. 26 is a plan view of a vacuum chamber of a film deposition apparatus according to another embodiment.

While the low ceiling surfaces 44 are required on both sides of the separation gas nozzle 41 (42) in the embodiments according to the present invention as stated above, these ceiling surfaces may be provided on both sides of the reaction gas nozzle 31 (activated gas injector 32) as well as shown in FIG. 26. In other words, the convex portion 4 may be extended substantially entirely to oppose the turntable 2 except for positions where the separation gas nozzles 41 (42), the reaction gas nozzles 31, and the activated gas injector 32 are provided. Even in such a configuration, the same separation effect can be demonstrated. From another viewpoint, the first ceiling surface 44 located on both sides of the separation gas nozzle 41 (42) is extended to the reaction gas nozzle 31 (activated gas injector 32). In this case, the separation gas spreads on both sides of the separation gas nozzle 41 (42) and the reaction gas spreads on both sides of the reaction gas nozzle 31 (activated gas injector 32). Then, the separation gas and the reaction gas flow into each other below the convex portion 4 (in the thin space) and are evacuated through the evacuation port 61 (62) located between the separation gas nozzle 31 (activated gas injector 32) and the reaction gas nozzle 42 (41).

Figure 27:
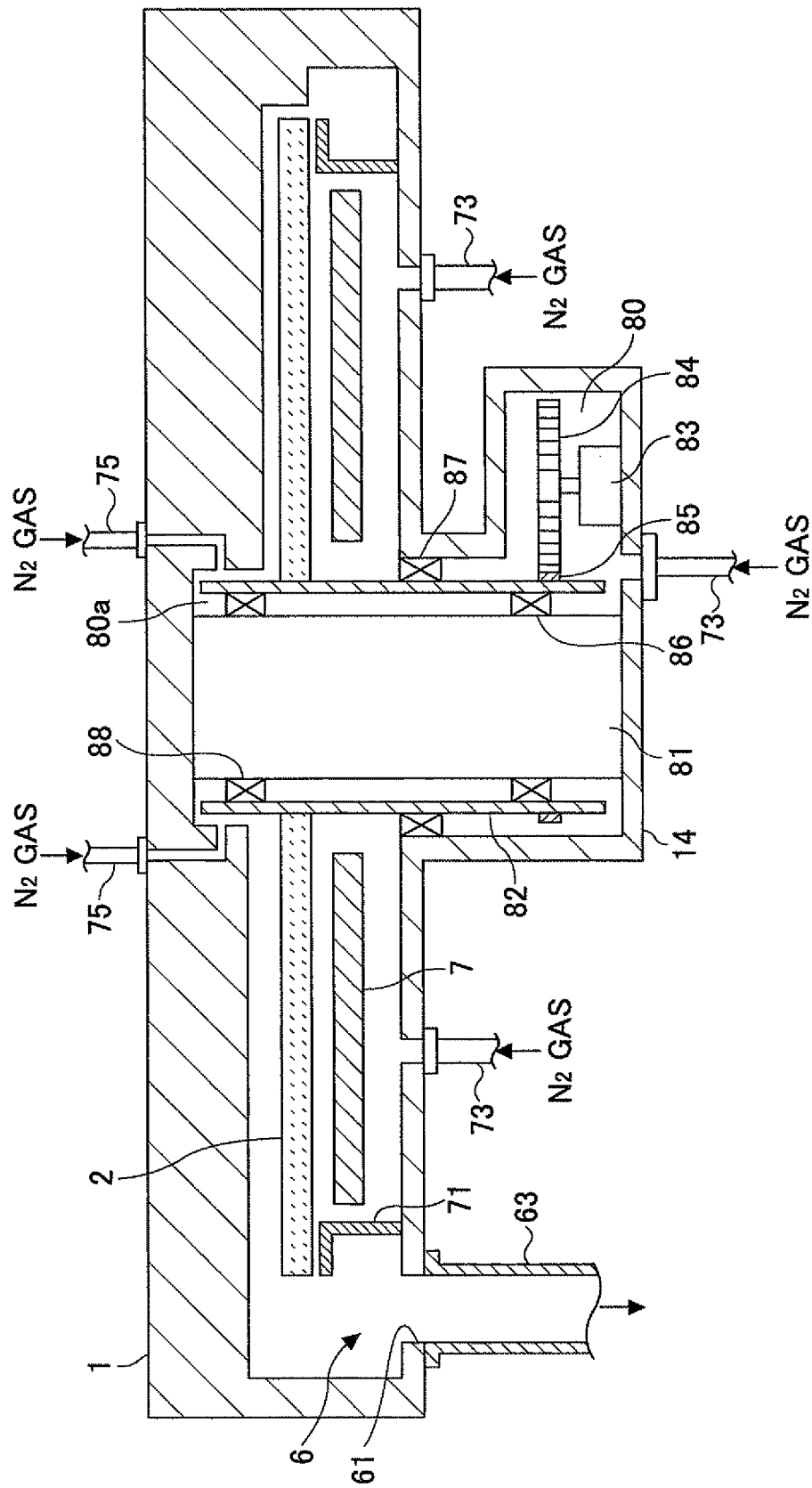
FIG. 27 is a cross-sectional view of a film deposition apparatus according to another embodiment.

In the above embodiments, the rotational shaft 22 for the turntable 2 is located in the center of the vacuum chamber 1 and the space defined by the center portion of the turntable 2 and the ceiling plate 11 is purged with the separation gas. However, the film deposition apparatus according to another embodiment may be configured as shown in FIG. 27. In the film deposition apparatus of FIG. 27, the bottom portion 14 of the chamber body 12 is extended downward at the center and a housing space 80 is formed in the extended area. In addition, an upper inner surface (ceiling surface) of the vacuum chamber 1 is dented upward at the center and a concave portion 80a is formed in the dented area. Moreover, a pillar 81 is provided so that the pillar 81 extends from a bottom surface of the housing space 80 through an upper inner surface of the concave portion 80a. This configuration can prevent a gas mixture of the DCS gas from the first reaction gas nozzle 31 and the $NH_3$ gas from the activated gas injector 32 from flowing through the center area of the vacuum chamber 1.

A driving mechanism for the turntable 2 is explained in reference to FIG. 27. A rotation sleeve 82 is provided so that the rotation sleeve 82 coaxially surrounds the pillar 81. The turntable 2, which is a ring shape, is attached on the outer circumferential surface of the rotation sleeve 82. In addition, a motor 83 is provided in the housing space 80 and a gear 84 is attached to a driving shaft extending from the motor 83. The gear 84 meshes with a gear 85 formed or attached on an outer circumferential surface of the rotation sleeve 82, and drives the rotation sleeve 82 via the gear 85 when the motor 83 is energized, thereby rotating the turntable 2. Reference numerals "86", "87", and "88" in FIG. 27 represent bearings.

A gas purge supplying pipe 73 is connected to the bottom of the housing space 80, and purge gas supplying pipes 75 are connected to an upper portion of the vacuum chamber 1. The purge gas supplying pipes 75 supply purge gas to the space defined by an inner side wall of the concave portion 80a and the upper portion of the rotation sleeve 82. While two purge gas supplying pipes 75 are shown in FIG. 27, three or more purge gas supplying pipes 75 may be provided, in other embodiments. The number of the purge gas supplying pipes 75 and their arrangements may be determined so that the DOCS gas and the $NH_3$ gas are not mixed through an area near the rotation sleeve 82.

In the film deposition apparatus of FIG. 27, the space defined by an inner side wall of the concave portion 80a and the upper portion of the rotation sleeve 82 corresponds to the separation gas ejection opening that ejects the separation gas toward the top surface of the turntable 2, when seen from the turntable 2. In addition, the center area C located in the center of the vacuum chamber 1 is defined by the ejection opening, the rotation sleeve 82 and the pillar 81.

Incidentally, the film deposition apparatuses are realized in a turntable-type film deposition apparatus in the above embodiments as shown in FIGS. 2, 3 and the like, the film deposition apparatus may be realized into a belt conveyer type, in other embodiments. In such a film deposition apparatus, the wafer W is placed on a belt conveyer rather than the turntable 2 and moved through a first process area, a separation area having a separation nozzle and a lower ceiling surface, a second process area, and another separation area having a separation nozzle and a lower ceiling surface, which are arranged along the belt conveyer. In addition, the film deposition apparatus may be realized into a single wafer type, in other embodiments. In this case, the wafer is placed on a fixed susceptor, and the reaction gas nozzles, the separation gas nozzles, the convex portions, and the like are moved in relation to the wafer on the susceptor.

Figure 28:
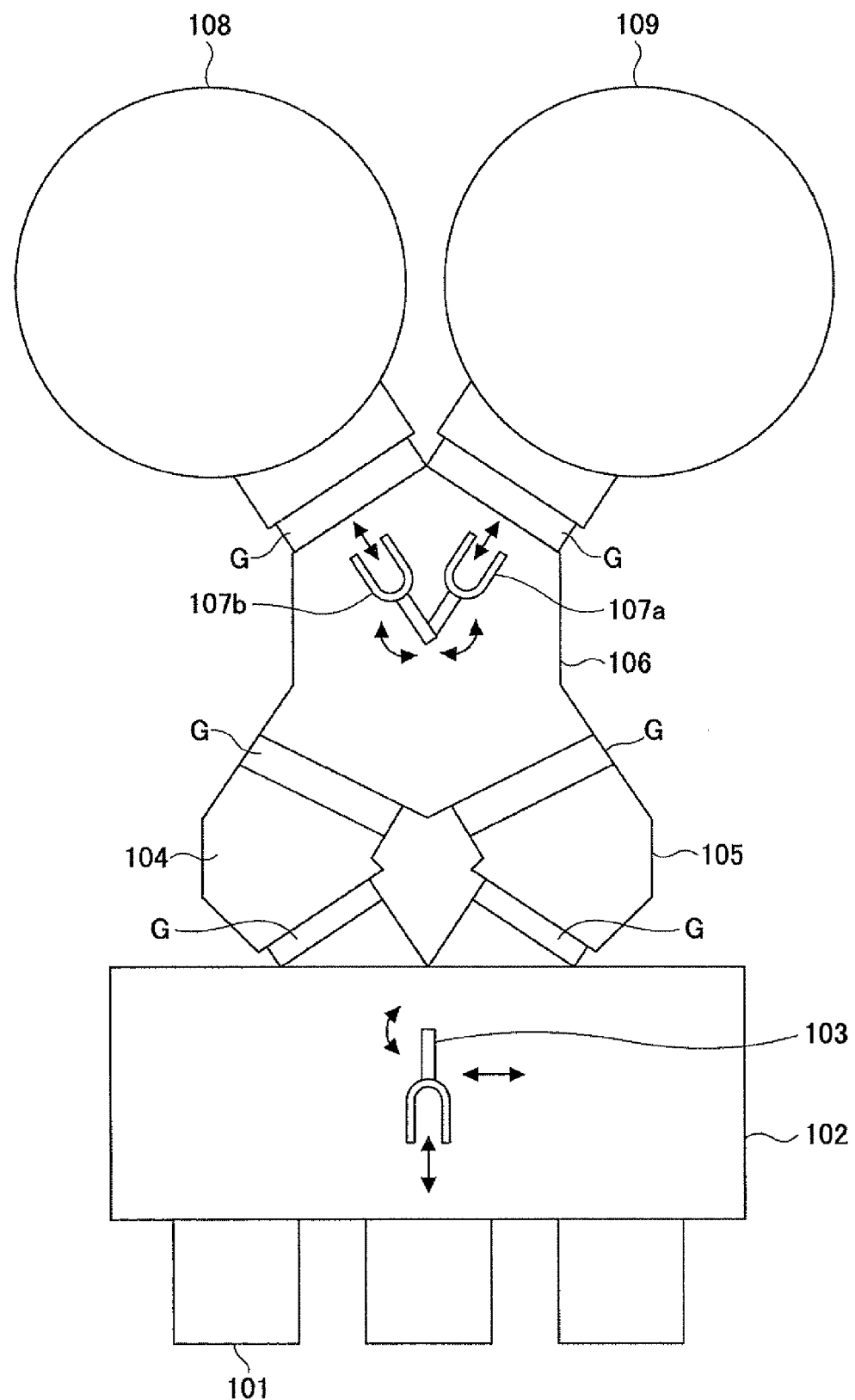
FIG. 28 is a schematic plan view illustrating an example of a substrate process apparatus according to an embodiment of the present invention.

The film deposition apparatus according to embodiments of the present invention may be integrated into a wafer process apparatus, an example of which is schematically illustrated in FIG. 28. In this drawing, reference numeral "101" indicates a closed-type wafer transfer cassette such as a Front Opening Unified Pod (FOUP) that houses, for example, 25 wafers; reference numeral "102" indicates an atmospheric transfer chamber where a transfer arm 103 is arranged; reference numerals "104" and "105" indicate load lock chambers (preparation chambers) whose inner pressure is changeable between vacuum and an atmospheric pressure; reference numeral "106" indicates a vacuum transfer chamber where two transfer arms 107a, 107b are provided; and reference numerals "108" and "109" indicate film deposition apparatuses according to an embodiment of the present invention. The wafer transfer cassette 101 is brought into a transfer port including a stage (not shown); a cover of the wafer transfer cassette 101 is opened by an opening/closing mechanism (not shown); and the wafer is taken out from the wafer transfer cassette 101 by the transfer arm 103. Next, the wafer is transferred to the load lock vacuum chamber 104 (105). After the load lock vacuum chamber 104 (105) is evacuated to a predetermined reduced pressure, the wafer is transferred further to one of the film deposition apparatuses 108, 109 through the vacuum transfer vacuum chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

As stated above, the BTBAS gas and the $O_3$ gas may be used as the first reaction gas and the second reaction gas, respectively, and the activated gas injector 32 (32a through 32d) may be used to activate the reaction gases in order to deposit the silicon oxide film in the film deposition apparatus according to the present invention. In addition, the activated gas injector 32 (32a through 32d) may be used to modify properties of the silicon oxide film. A film deposition apparatus employing an activated gas injector for modifying the properties of the deposited film is explained in the following with reference to FIGS. 29 through 35.

The same or corresponding reference numerals are given to the same or corresponding members or components as explained above, and repetitive explanation is omitted.

Figure 29:
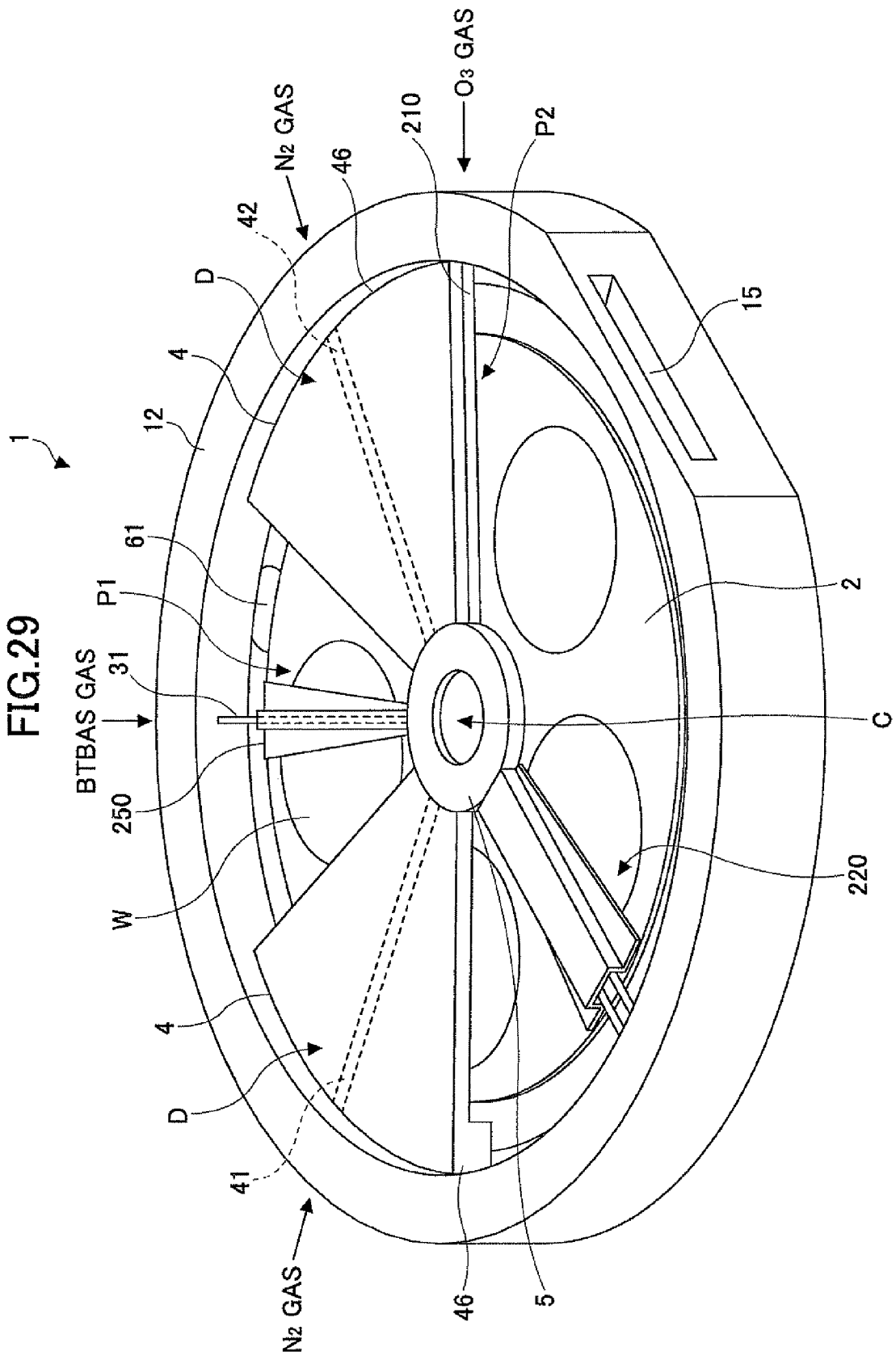
FIG. 29 is a perspective view illustrating a film deposition apparatus according to another embodiment of the present invention.
Figure 30:
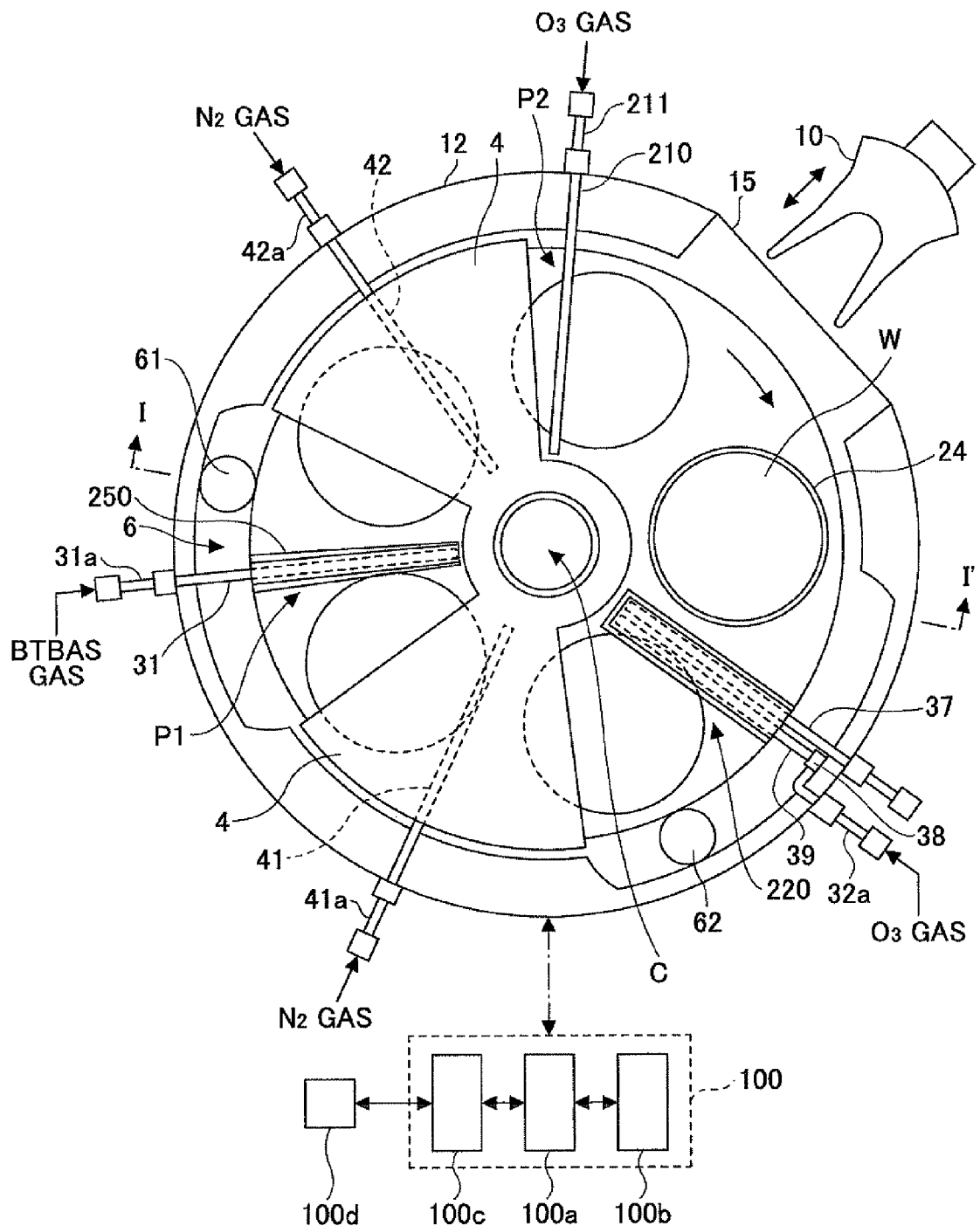
FIG. 30 is a plan view illustrating a film deposition apparatus according to an example.

As shown in FIGS. 29 and 30, the film deposition apparatus includes a second reaction gas nozzle 210 as a second gas supplying portion for supplying the $O_3$ gas as the second reaction gas. The second reaction gas nozzle 210 is located upstream relative to the rotation direction of the turntable 2 with respect to the transfer port 15. The second reaction nozzle 210 has substantially the same configuration as the first reaction gas nozzle 31, and extends in a direction intersecting the rotation direction of the turntable 2. The second reaction nozzle 210 is provided to the vacuum chamber 1 by hermetically attaching a gas supplying port 211, which is a base end of the second reaction gas nozzle 210, in the circumferential wall of the chamber body 12. In addition, the gas supplying port 211 is connected to a gas supplying source of the $O_3$ gas located outside of the film deposition apparatus. The second reaction gas nozzle 210 has ejection holes (not shown) having an inner diameter of about 0.5 mm arranged at predetermined intervals of 10 mm in the longitudinal direction of the second reaction gas nozzle 210 in order to eject the second reaction gas downward from the ejection holes. An area below the second reaction gas nozzle 210 corresponds to the second process area P2.

Figure 31:
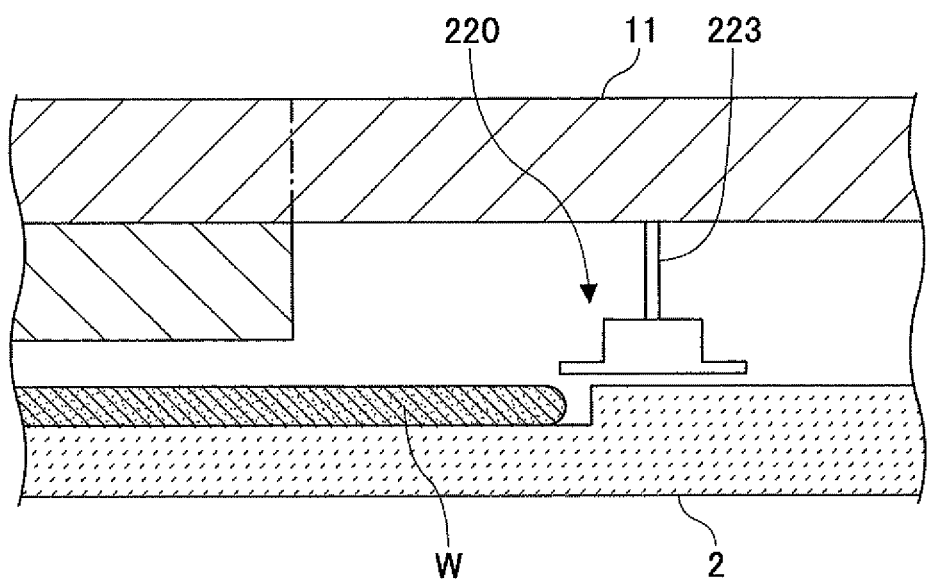
FIG. 31 is a cross-sectional view illustrating a film deposition apparatus according to another embodiment.

In addition, an activated gas injector (plasma gas injector) 220 is provided between the separation area D located upstream relative to the rotation direction of the turntable 2 with respect to the first reaction gas nozzle 31 and the transfer port 15 (or the second reaction gas nozzle 210), as shown in FIG. 31. The activated gas injector 220 can activate a process gas in substantially the same manner as the activated gas injector 32 described above.

Figure 32A:
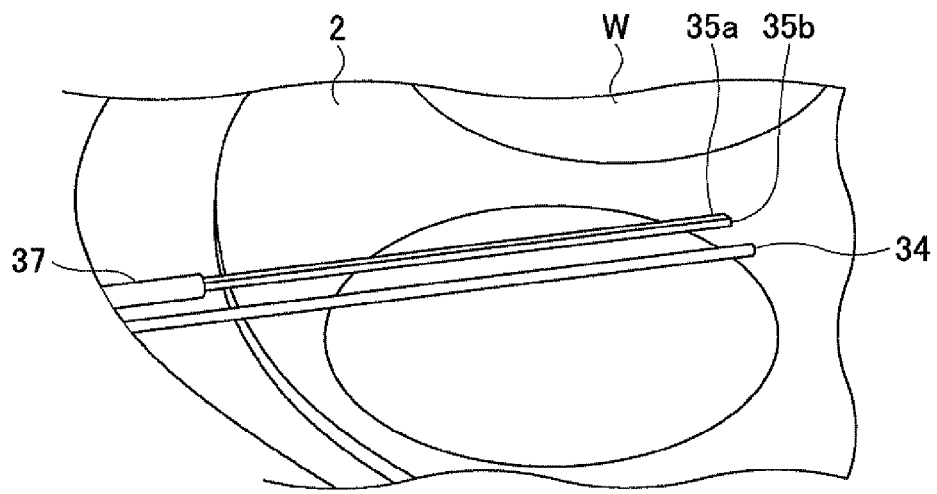
FIGS. 32A and 32B are perspective views of activated gas injectors in the film deposition apparatus according to another embodiment.
Figure 32B:
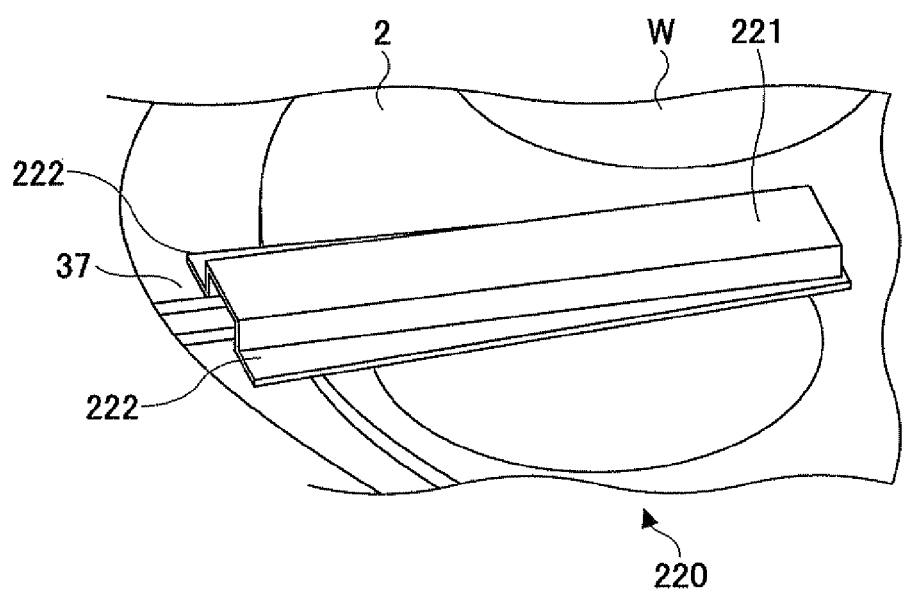

The activated gas injector 220 has a cover body (airflow control member) 221. FIG. 32A shows the activated gas injector 220 without the cover body 221, and FIG. 32B shows the activated gas injector 220 with the cover body 221. As shown in FIGS. 32A, 32B, and 33, the activated gas injector 220 has the cover body 221 having a shape of a box that is open toward the turntable 2 and extends from the circumferential wall of the chamber body 12 (FIG. 30) toward the center of the vacuum chamber 1 along a radial direction of the turntable 2. In addition, the activated gas injector 220 has the gas introduction nozzle 34 and the pair of the sheath pipes 35a, 35b that are housed in the cover body 221 along the longitudinal direction of the cover body 221. The sheath pipes 35a, 35b are arranged in parallel with each other in this embodiment.

The cover body 221 is made of, for example, quartz, and is suspended from the ceiling plate 11 of the vacuum chamber 1 by plural supporting members 223, as shown in FIG. 31. As shown in FIG. 32B, the cover body 221 has airflow control surfaces 222 that horizontally extend from both lower sides of the cover body 221 in a form of a flange, which makes the cover body 221 look like a hat as whole. Incidentally, the supporting members 223 are only shown in FIG. 31 and omitted in the other drawings.

The airflow control surfaces 222 are arranged in parallel with the upper surface of the turntable 2. A gap t between the airflow control surfaces 222 and the upper surface of the turntable 2 is, for example, 2 mm or less, in order to impede the gases from entering the inner space of the cover body 221 through the gap t. Because the gas flow speed becomes faster in a position closer to the circumferential edge of the turntable 2 due to an increased circumferential speed of the turntable 2 and thus the gases tend to enter the inner space of the cover body 221 in the position closer to the circumferential edge of the turntable 2, a width u of the airflow control surface 222 becomes greater toward the circumferential edge of the turntable 2. Specifically, the width u of the airflow control surface 222 may be about 80 mm in a position corresponding to the innermost edge of the concave portion 24, and about 130 mm in a position corresponding to the outermost edge of the concave portion 24 when the concave portion 24 of the turntable 2 is located so that the activated gas injector 220 extends substantially along the diameter of the concave portion 24. In addition, an upper surface of the cover body 221, which faces the lower surface of the ceiling plate 11, is located 20 mm or more and 30 mm or less below the lower surface of the ceiling plate 11 so that a gap between the upper surface of the cover body 221 and the ceiling plate 11 is larger than the gap t between the airflow control surface 222 and the turntable 2.

The gas introduction nozzle 34 and the sheath pipes 35a, 35b are arranged so that a process gas to be activated into plasma, for example, argon (Ar) gas can be horizontally ejected toward the sheath pipes 35a, 35b from the gas holes 341 of the gas introduction nozzle 34, as shown in FIG. 33. The gas introduction nozzle 34 and the sheath pipes 35a, 35b are hermetically attached at their base ends to the circumferential wall of the chamber body 12, as described below.

The sheath pipes 35a, 35b are made of, for example, high purity quartz and coated with, for example, a yttria (yttrium oxide, $Y_2O_3$) film having a thickness of about 100 μm. Yttrium oxide has an excellent resistance against plasma etching. The sheath pipes 35a, 35b have the electrodes 36a, 36b, respectively. The sheath pipes 35a, 35b are arranged so that a gap between the electrodes 36a, 36b is about 10 mm or less, preferably about 4.0 mm. High frequency power at a frequency of 13.56 MHz is applied at, for example, 500 W or less to the electrodes 36a, 36b from a high frequency power source via a matching box (not shown). In the illustrated example, an inner space of the gas introduction nozzle 34 corresponds to the gas introduction passage; the cover body 221 corresponds to the passage defining member; and an area where the sheath pipes 35a, 35b are arranged and the process gas is activated corresponds to the gas activation passage. In addition, the circumferential wall of the gas introduction nozzle 34 corresponds to the partition wall that separates the gas introduction passage and the gas activation passage in other embodiments; and the gas holes 341 of the gas introduction nozzle 34 correspond to the through-holes allowing the gaseous communications between the gas introduction passage and the gas activation passage. Moreover, an area below the sheath pipes 35a, 35b corresponds to the ejection holes that eject the activated gas toward the wafer W.

Figure 34A:
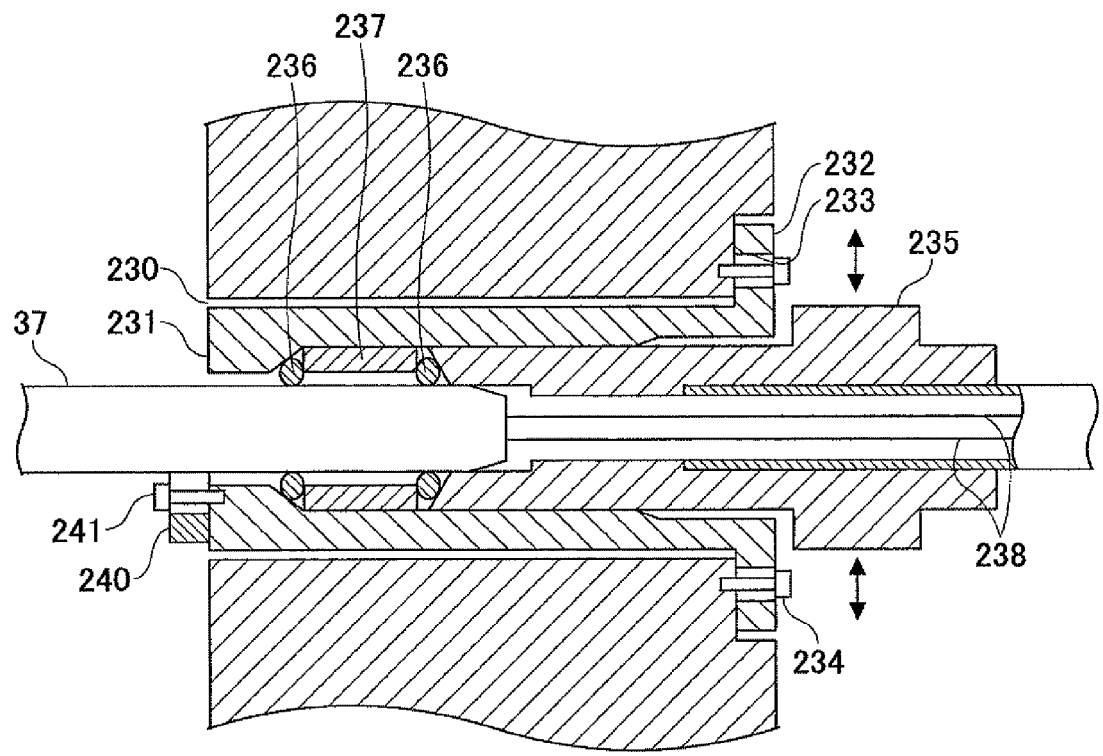
FIGS. 34A and 34B are schematic views illustrating how the activated gas injector shown in FIGS. 32A and 32B is attached to the vacuum chamber.
Figure 34B:
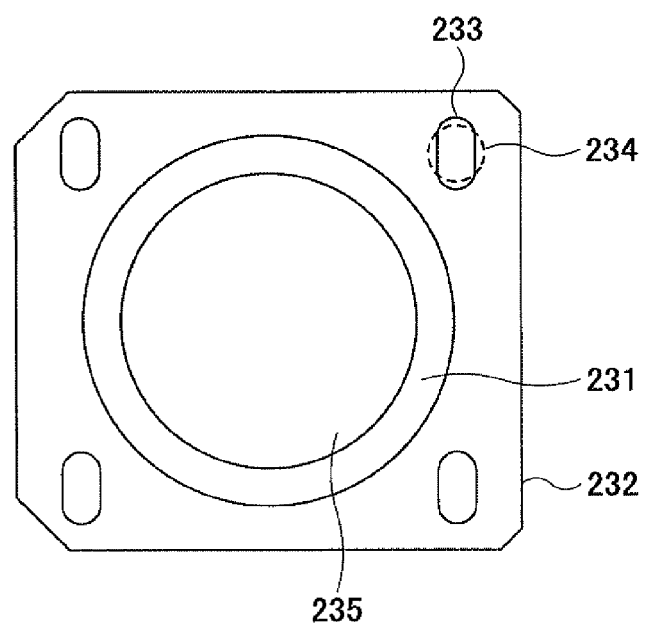

The sheath pipes 35a, 35b are attached to the circumferential wall of the chamber body 12 of the vacuum chamber 1 in the following manner. As shown in FIG. 34A, a through-hole 230 for attaching the guard pipe 37 therein is formed in the circumferential wall of the chamber body 12. Specifically, an outer sleeve 231 having an outer diameter slightly smaller than an inner diameter of the through-hole 230 is inserted into the through-hole 230. The outer sleeve 231 has substantially a cylindrical shape and taper portions where the inner diameter becomes smaller in a direction from the outer to the inner sides of the vacuum chamber 1. The outer sleeve 231 is hermetically attached to the circumferential wall of the chamber body 12 via an O-ring supported between a flange portion 232 formed at an outer end of the outer sleeve 231 and the chamber body 12. In FIGS. 34A and 34B, reference numeral 233 indicates a through-hole penetrating the flange portion 232. The through-holes 233 allow a screw 234 to pass therethrough, and thus the flange portion 232 and thus the outer sleeve 231 are attached to the chamber body 12. As shown in FIG. 34B, the through-hole 233 has an elongated shape that makes gaps above and below the screw 234 penetrating the through-hole 233. With these gaps, a position of the outer sleeve 231 can be adjusted in a vertical direction. Specifically, a distance between the sheath pipes 35a, 35b and the wafer W on the turntable 2 can be adjusted in a range, for example, from about 3.0 mm through about 9 mm, in this embodiment. The outer sleeve 231 and the guard pipe 37 inserted into the outer sleeve 231 may be vertically moved in order to adjust their positions, and fixed at the adjusted positions by the screws 234.

Inside the outer sleeve 231, an O-ring 236, an inner sleeve 237, another O-ring 236, and a connector pipe 235 are arranged in this order in a direction from the inside to the outside of the vacuum chamber 1 (chamber body 12). When the connector pipe 235 is pressed toward the inside of the vacuum chamber 1 by a fixing member (not shown), the outer sleeve 231 and the guard pipe 37 are hermetically sealed via the O-rings 236. In FIG. 34A, reference numeral 238 indicates power feeding wires that extend from the sheath pipes 35a, 35b to the outside of the chamber body 1.

Figure 35:
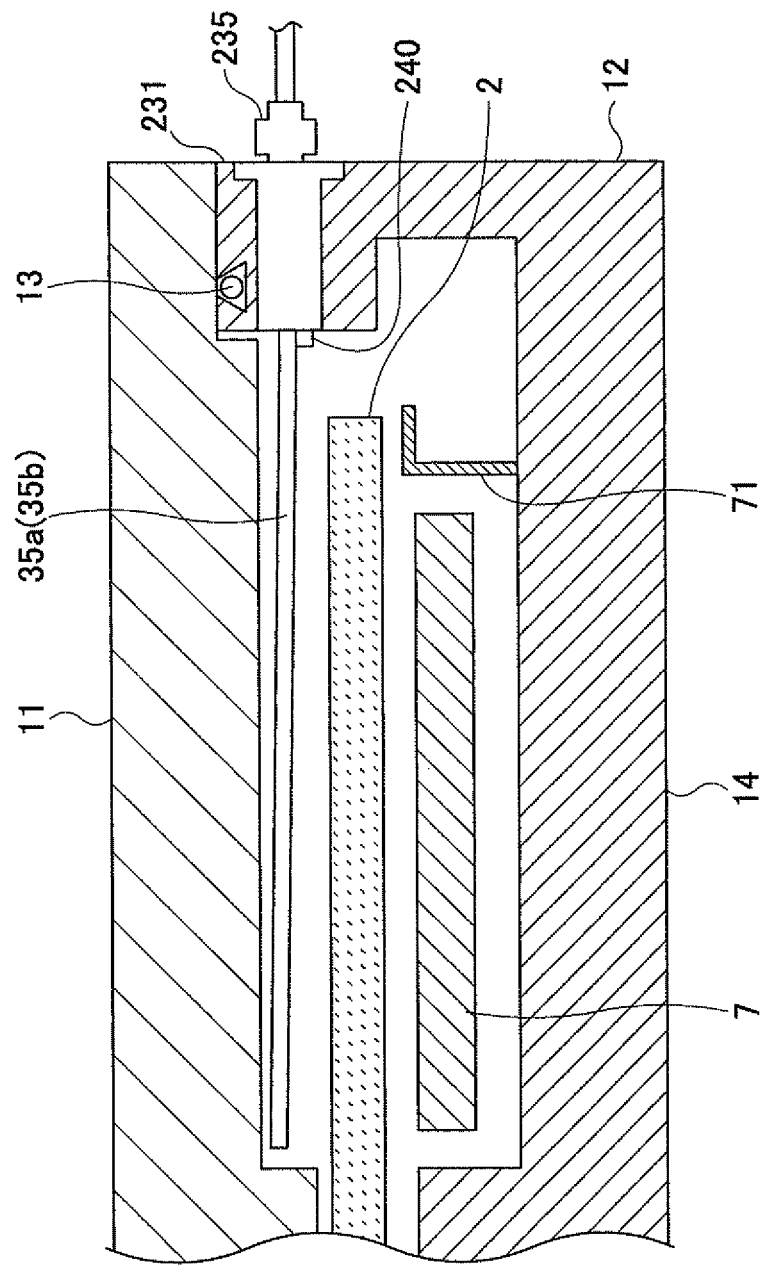
FIG. 35 is a cross-sectional view illustrating the activated gas injector in relation to the vacuum chamber.

In addition, an inclination adjustment mechanism 240 is provided inside the vacuum chamber 1 in such a manner that the inclination adjustment mechanism 240 supports the guard pipe 37. The inclination adjustment mechanism 240 is a plate-like member formed, for example, along an inner surface of the outer sleeve 231, and attached to the inner surface of the outer sleeve 231 by an adjustment screw 241 (e.g., a bolt) that can adjust an elevation of an upper surface of the inclination adjustment mechanism 240. With this, when the upper surface of the inclination adjustment mechanism 240 is vertically adjusted by the adjustment screw 241, the guard pipe 37 and thus the sheath pipes 35a, 35b may be inclined along the radial direction of the turntable 2 with respect to the turntable 2 because the guard pipe 37 is moved upward or downward by the inclination adjustment mechanism 240 while the base end (inside of the outer sleeve 231) of the guard pipe 37 is hermetically held by the O-rings 236. The guard pipe 37 and the sheath pipes 35a, 35b may be inclined so that the distal ends are located upward compared with the base ends. Specifically, the guard pipe 37 maybe inclined in such a manner that a distance between the guard pipe 37 and the wafer W placed in the concave portion 24 of the turntable 2 is about 6.0 mm and about 4.0 mm above the innermost edge and the outermost edge of the wafer W along the radial direction of the turntable 2 of the wafer W, respectively. The same configuration may be applicable to the gas introduction nozzle 34. Alternatively, the gas introduction nozzle 34 may be made inclined along with the guard pipe 37. Incidentally, FIG. 35 depicts the inclination of the sheath pipes 35a (35b) in an unproportional manner.

As shown in FIGS. 29 and 30, the first reaction gas nozzle 31 is configured to supply the BTBAS gas as the first reaction gas from a gas supplying source (not shown). In the illustrated example, the first reaction gas nozzle 31 is covered by an airflow control member 250 having substantially the same configuration as the cover body 221 in order to prevent the BTBAS gas from being diluted by the separation gas and to increase an exposure time during which the wafer W is exposed to the BTBAS gas.

Next, operations of the film deposition apparatus according to this embodiment are explained in the following. Five wafers W are placed in the turntable 2 in the same manner as the previous embodiments; the inner pressure of the vacuum chamber 1 is adjusted at, for example, 286.6 Pa (2 Torr) through 1.067 kPa (8 Torr); and the turntable 2 is rotated at, for example, 240 rpm. After the wafers W are heated at, for example, 350° C., the BTBAS gas and the $O_3$ gas are supplied from the first reaction gas nozzle 31 and the second reaction gas nozzle 210 at, for example, 100 sccm and 10000 sccm, respectively. The $N_2$ gas is supplied to each of the separation areas D at a predetermined flow rates of, for example, 20000 sccm, and the purge gas is supplied to the center area C and below the turntable 2 at a predetermined flow rate. In addition, the process gas for generating plasma, for example, Ar gas is supplied to the gas introduction nozzle 34 at a predetermined flow rate of 5000 sccm, and high frequency power is supplied to the electrodes 36a, 36b at a predetermined power of, for example, 500 W from a high frequency power source.

In the activated gas injector 220, the Ar gas ejected from the gas introduction nozzle 34 toward the sheath pipes 35a, 35b is activated by high frequency waves between the sheath pipes 35a, 35b into Ar ions and/or Ar radicals, which in turn flow downward. Because the sheath pipes 35a, 35b and the gas introduction nozzle 34 are covered by the cover body 221 and the airflow control surfaces 222 are located above the turntable 2 with a gap t of, for example, 2 mm or less, the ions and/or the radicals are less likely to flow out from the cover body 221. In other words, the inner space of the cover body 221 has a slightly higher pressure than the outside.

When the wafer W reaches below the first reaction gas nozzle 31 due to the rotation of the turntable 2, the BTBAS gas is adsorbed on the upper surface of the wafer W. Then, when the wafer W reaches below the second reaction gas nozzle 210, the $O_3$ gas reacts with the BTBAS gas adsorbed on the wafer W, thereby forming a monolayer or plural layers of silicon oxide as a reaction product of the reaction. This silicon oxide film is formed in an extremely short period of time, and may be oxygen-rich compared with the stoichiometric composition of Si:O=1:2.

Next, when the wafer W reaches below the activated gas injector 220, properties of the silicon oxide film formed on the wafer W are modified. Specifically, because the wafer W is bombarded with, for example, the Ar ions, part of the oxygen atoms are released from the silicon oxide film, which makes the composition of the silicon oxide closer to the stoichiometric composition. In addition, because of the bombardment of the Ar ions, the silicon and the oxygen atoms are rearranged, resulting in densification of the silicon oxide film. Therefore, the silicon oxide film has higher resistance against wet etching, as described later. In addition, when the silicon dioxide film contains impurities such as organic compounds, the impurities may be evaporated from the silicon oxide by the Ar ion bombardment.

Incidentally, the wafer W may undergo the property modification to a greater degree in a position closer to the center of the turntable 2, because the circumferential speed of the wafer W is increased in a position closer to the circumferential edge of the turntable 2 when the wafer W is rotated with the rotation of the turntable 2. However, because the sheath pipes 35a, 35b are inclined upward in a direction from the base end to the distal end by the inclination adjustment mechanism 240, the properties of the silicon oxide film can be uniformly modified along the longitudinal direction of the activated gas injector 220.

Because the separation area D is not provided between the activated gas injector 220 and the second reaction gas nozzle 210 in the vacuum chamber 1, the $O_3$ gas and the $N_2$ gas flow toward the activated gas injector 220 due to the rotation of the turntable 2. However, because the cover body 221 that covers the electrodes 36a, 36b and the gas introduction nozzle 34 are provided so that a space larger than the gap t between the airflow control surfaces 222 and the turntable 2 is formed above the cover body 221, the $O_3$ gas and the $N_2$ gas are less likely to flow into the cover body 221 through the gap t. In addition, because the inside pressure of the cover body 221 is slightly higher than the outside pressure, the $O_3$ gas and the $N_2$ gas do not easily flow into the cover body 221 through the gap t. Moreover, even when the gas flowing toward the activated gas injector 220 tends to flow into the cover body 221 in a position closer to the circumferential edge of the turntable 2 because the circumferential speed is increased in a position closer to the circumferential edge due to the rotation of the turntable 2, the gas is impeded from entering the inner space of the cover body 221 because the width u of the airflow control surfaces 222 is increased in a position closer to the circumferential edge of the turntable 2. Therefore, the gas flowing toward the activated gas injector 220 from the upstream side flows over the cover body 221 as shown in FIG. 33 and finally is evacuated through the evacuation port 62 (FIG. 30) Therefore, the $O_3$ gas and/or the $N_2$ gas is rarely influenced by the high frequency waves and the wafer W is rarely influenced by these gases. Incidentally, the oxygen atoms released from the silicon oxide film by the Ar ion bombardment are evacuated along with the Ar gas and the $N_2$ gas through the evacuation port 62.

Figure 36:
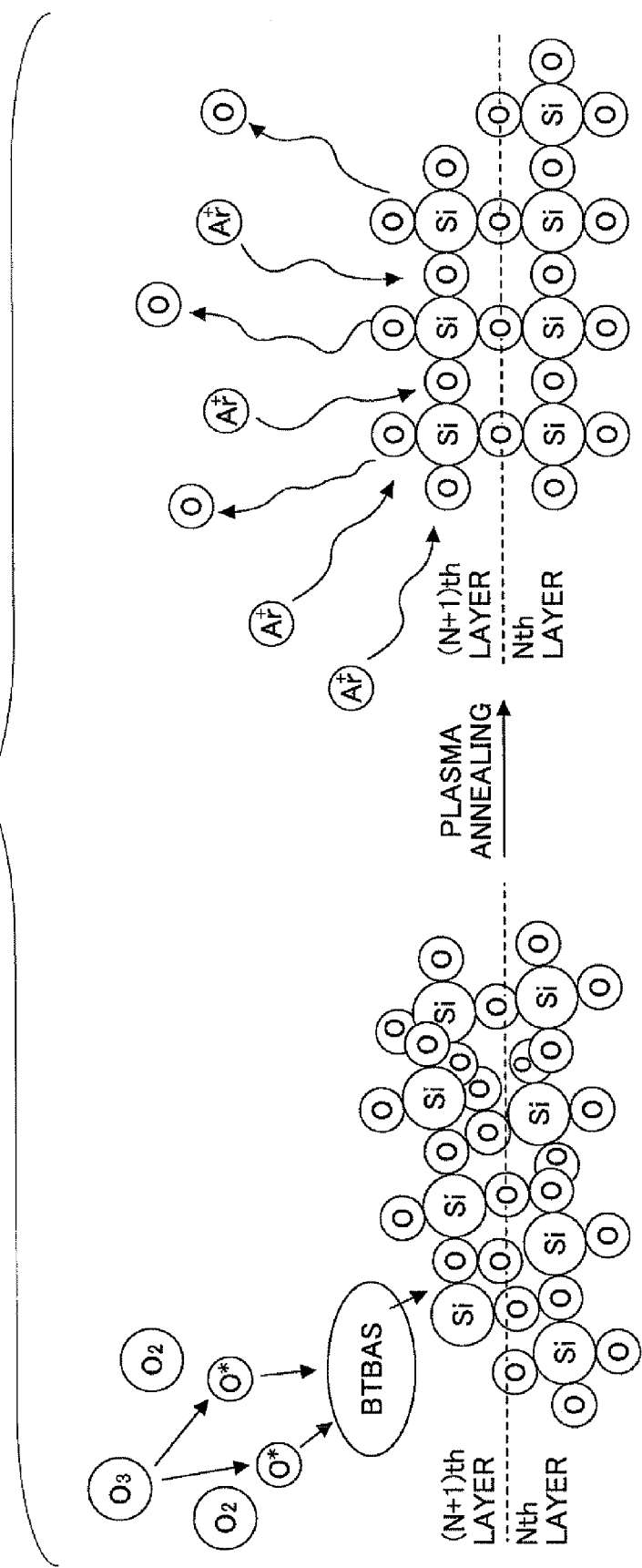
FIG. 36 is a schematic explanatory view illustrating a mechanism of property modification of silicon oxide.

Then, when the wafer W passes through the separation area D downstream relative to the rotation direction with respect to the activated gas injector 220, and further passes through the areas below the first reaction gas nozzle 31 and the second reaction gas nozzle 210, a layer(s) of oxygen-rich silicon oxide is additionally deposited on the wafer W. As shown in the left-hand side of FIG. 36, Si—O—Si bonds at the boundary of (N+1)th layer silicon oxide and the Nth silicon oxide may be disturbed (not properly arrayed). However, when the wafer W reaches below the activated gas injector 220, excessive oxygen atoms are released from the silicon oxide film due to the Ar ion bombardment, and thus the rearrangement of the atoms occurs mainly at and around the boundary. As a result, the Si—O—Si bonds in the silicon oxide film are rearranged three-dimensionally. In such a manner, deposition of the layer(s) of the silicon oxide (reaction of the BTBAS gas and the $O_3$ gas), and release of the oxygen atoms/rearrangement of the atoms in the silicon oxide film are repeatedly carried out. In such a manner, the silicon oxide film of about 100 nm having high density and low impurity concentrations is deposited after the turntable 2 is rotated predetermined times, for example, 1000 revolutions.

According to this embodiment, because the plasma source (the electrodes 35a, 35b) are located near the wafer W, active species can be produced near the wafer W. Therefore, ions and/or radicals can be supplied to the wafer W and thus the film deposited on the wafer W, even when the ions and/or radicals have a relatively shorter existence. When the BTBAS gas and the $O_3$ gas are alternately adsorbed on the wafer W due to the rotation of the turntable 2 in order to deposit the silicon oxide film, the Ar ions are supplied to the as-deposited silicon oxide film on the wafer W from the activated gas injector 220 immediately after the silicon oxide film is deposited. Therefore, the excessive oxygen atoms can be easily released, and the silicon atoms and the oxygen atoms in the silicon oxide film are rearranged three-dimensionally, thereby densifying the silicon oxide film. In addition, because the Ar ions are supplied to the wafer W, the impurities can be evaporated from the silicon oxide film, thereby depositing the silicon oxide film with a low impurity concentration. Such a silicon oxide film having high density and low impurities can have a better resistance against wet etching, compared with the silicon oxide film that is not modified in terms of properties by the activated gas injector 220. Therefore, the silicon oxide film obtained by the film deposition apparatus according to this embodiment may contribute to an improved reliability of semiconductor devices. Moreover, use of the activated gas injector 220 results in more efficient property modification of the silicon oxide film, compared with a so-called remote plasma. Because the oxygen radicals are generated through the thermal decomposition of the $O_3$ gas in the remote plasma, the oxygen radicals easily lose chemical activity while being transported.

Moreover, because the distance between the sheath pipes 35a, 35b and the wafers W on the turntable 2 can be adjusted when the property modification is carried out by using the activated gas injector 220, a degree of effects in the property modification of the silicon oxide film can also be adjusted. Furthermore, because the sheath pipes 35a, 35b can be inclined, the distance can vary along the longitudinal direction of the sheath pipes 35a, 35b, thereby equalizing the degree of the effects of the property modification in the silicon oxide film along the radial direction of the turntable 2.

In addition, because the property modification is carried out every time a layer(s) of silicon oxide is deposited in the vacuum chamber 1 (or in the middle of the wafer W moving from the second process area P2 to the first process area P1) without disturbing the film deposition, no additional process time is required in order to modify the properties of the silicon oxide film. Moreover, because the property modification of the silicon oxide film using the Ar ions is effective to a depth of about 2 nm, when the property modification is preferably carried out every time a layer(s) of silicon oxide is deposited, the properties of the silicon oxide film may be modified throughout the thickness. Moreover, because the activated gas injector 220 is provided with the cover body 221, the gas flowing toward the activated gas injector 220 is impeded from entering the inner space of the cover body 221, which makes it possible to carry out the property modification during the film deposition without being influenced by the gas. In addition, because the separation area D is not necessary between the second reaction gas nozzle 210 and the activated gas injector 220, the film deposition apparatus can be made less costly.

In addition, because the distance between the electrodes 36a, 36b is set to be small, the Ar gas can be activated (ionized) to a degree that enables the property modification due to the Ar ions with relatively low high-frequency power, even if the pressure, which is suited for the film deposition, is relatively high for ionizing the Ar gas. Incidentally, a higher pressure in the vacuum chamber 1 can facilitate ionization of the Ar gas. However, an adsorption rate of the BTBAS gas is reduced with an increase in the chamber pressure. Therefore, the pressure has to be determined taking account of efficacies of the film deposition and the property modification. In addition, the high frequency power supplied to the electrodes 36a,

36b needs to be determined taking into account the effectiveness of the property modification and an adverse effect by the high frequency power caused on the film deposition.

Although the property modification is carried out every cycle of the BTBAS gas adsorption and the $O_3$ adsorption in the above example, the property modification may be carried out every plural cycles, for example, 20 cycles. In this case, while the BTBAS gas, the $O_3$ gas, and the $N_2$ gas may be stopped, the Ar gas is supplied toward the electrodes 35a, 35b from the gas introduction nozzle 34 and high frequency power is supplied to the electrodes 35a, 35b. Under these circumstances, the turntable 2 is rotated about 200 revolutions so that the five wafers W pass through in turn the area below the activated gas injector 220. After such property modification is carried out, the BTBAS gas, the $O_3$ gas, and the $N_2$ gas are supplied from the corresponding nozzles to carry out the deposition process, and then the above property modification may be carried out again. According to such alternately repeated processes, the high purity silicon oxide film having low impurity concentration can be obtained in the same manner as described above. Incidentally, when the $O_3$ gas and the $N_2$ gas are stopped at the time of this property modification, the activated gas injector 220 is not necessarily provided with the cover body 221 (FIG. 32A).

While the activated gas injector 220 serves as an activating unit which activates the process gas in order to carry out the property modification, the activating unit is not limited to the activated gas injector 220 described above, but may have a different configuration. For example, the activating unit may be configured to have an injector, which is made of, for example, ceramics, having gas ejection holes along the longitudinal direction and an antenna (preferably a rod antenna) configured to emit microwaves. With such configuration, the microwaves emitted from the antenna can activate the process gas inside the injector and the activated process gas is supplied toward the wafers W.

Although detailed description is omitted here, the properties of the silicon oxide film can be modified through release of the redundant oxygen atoms and rearrangement of the Si—O—Si bonds rather than replacement of the atoms in the silicon oxide film by the oxygen radicals, which has been confirmed through experiments carried out using the $N_2$ gas instead of the Ar gas or gas mixtures of the Ar gas and the $O_2$ gas with various Ar/O2 concentration ratios.

While the activated gas injector 220 is arranged between the transfer port 15 and the separation area D upstream relative to the rotation direction of the turntable 2 with respect to the first reaction gas nozzle 31, the activated gas injector 220 may be arranged between the first reaction gas nozzle 31 and the second reaction gas nozzle 210, or within the separation area D upstream relative to the rotation direction of the turntable 2 with respect to the first reaction gas nozzle 31. In addition, the activated gas injector 220 may be configured so that the gas introduction nozzle 34 is arranged above the electrodes 36a, 36b in the same manner as shown in FIGS. 14 through 18. Moreover, the activated gas injector 220 may be provided with the heater 30 shown in FIG. 19 instead of the electrodes 36a, 36b. In this case, the heater 30 may be set at, for example, about 1000° C.

Moreover, the activated gas injector 220 may be employed along with the activated gas injector 32 (32a through 32d) in the film deposition apparatus in FIG. 2. In this case, the activated gas injector 220 is preferably arranged downstream relative to the rotation direction of the turntable 2 with respect to the activated gas injector 32 (32a through 32d), and the property modification is carried out with respect to the silicon nitride film deposited on the wafer W. As a result, impurities in the silicon nitride film are reduced, for example. Furthermore, when the silicon oxide film is deposited in the film deposition apparatus shown in FIG. 2, the activated gas injector 220 may be used. In addition, when other reaction gases are used in the film deposition apparatus shown in FIG. 2, the activated gas injector 220 may be used in order to reduce impurity concentration in the deposited films.

As the process gas to be supplied from the gas introduction nozzle 34, at least one of helium (He) gas, $NH_3$ gas, hydrogen ($H_2$) gas, and a gas containing N and O may be used.

It has been explained so far that the silicon oxide can be deposited using the BTBAS gas and the $O_3$ gas and the properties of the deposited silicon oxide can be modified every cycle of alternately supplying the reaction gases (every revolution of the turntable 2) in order to improve density and reduce impurity concentration. Another preferable reaction gas may be used in other examples, as described in the following.

Figure 37A:
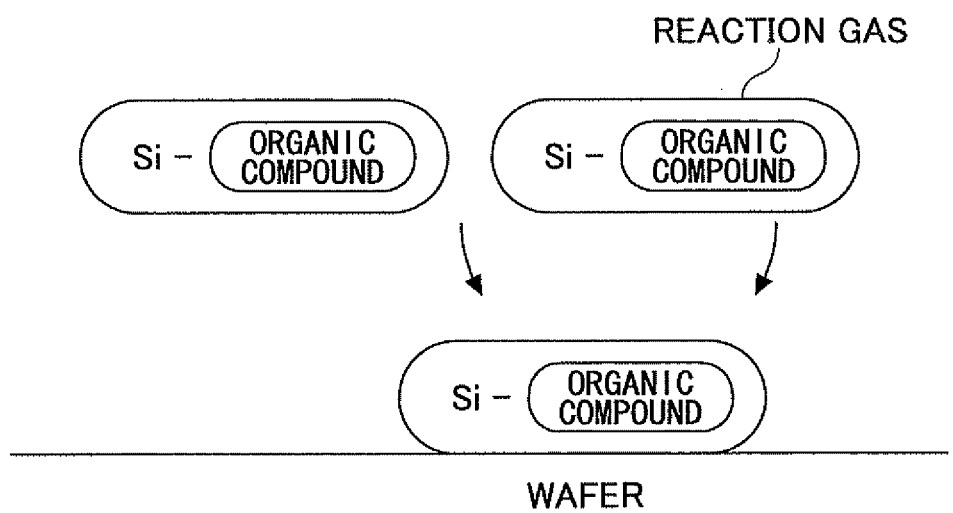
FIGS. 37A through 37D are schematic views illustrating an ALD mode film deposition.
Figure 37B:
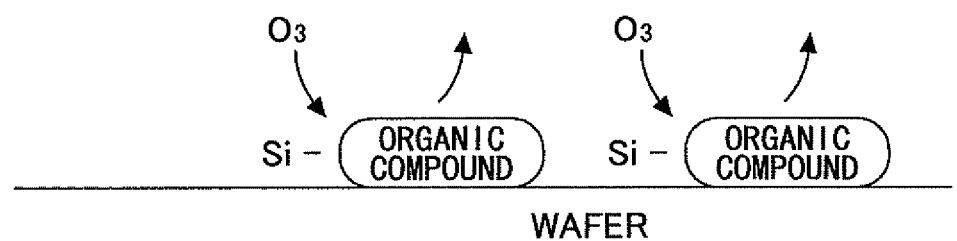
Figure 37C:
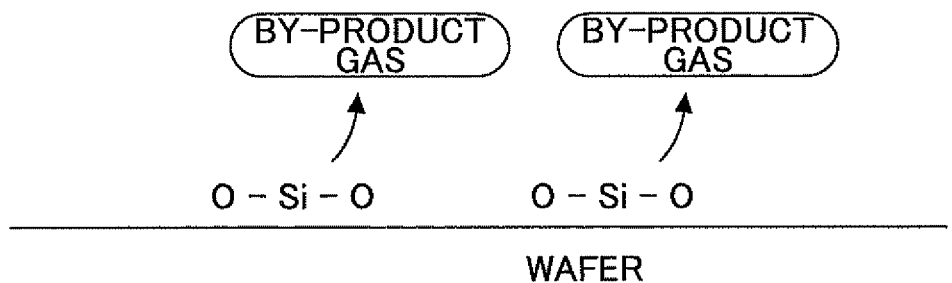
Figure 37D:
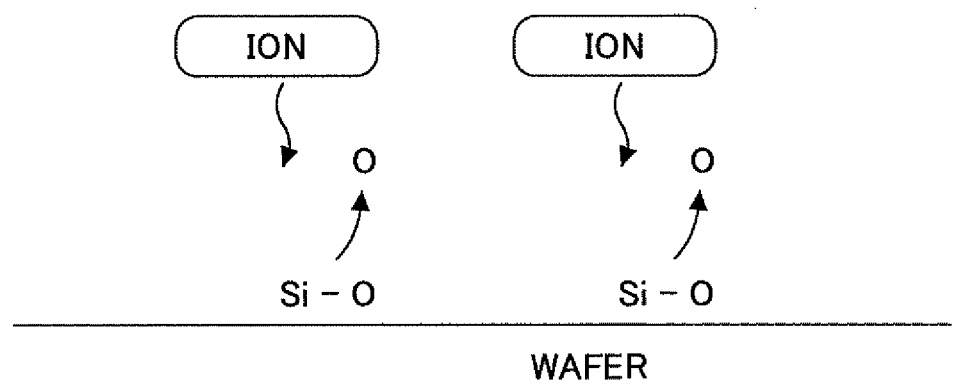

First, the above ALD mode film deposition of the silicon oxide film using the BTBAS gas is reviewed. As stated above, the BTBAS molecules are adsorbed on the wafer W in the first process area P1, as shown in FIG. 37A; the BTBAS molecules are oxidized by the $O_3$ gas in the second process area P2, as shown in FIG. 37B; a reaction product including the oxygen from the $O_3$ gas and the silicon from the BTBAS gas and organic compounds are released as by-product gases from the BTBAS molecules, as shown in FIG. 37C; and thus property modification is carried out below the activated gas injector 220, as shown in FIG. 37D, so that excessive oxygen atoms are released from the reaction product, and rearrangement of atoms in the reaction product takes place. In such a manner, the silicon oxide film having high density and reduced impurity concentration can be deposited on the wafer W, namely, through adsorption of the BTBAS molecules, oxidization of the BTBAS molecules by the $O_3$ gas, and property modification of the deposited silicon oxide film.

Figure 38A:
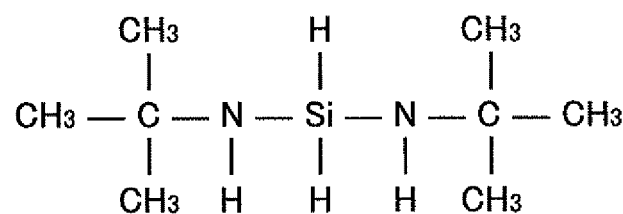
FIGS. 38A and 38B show molecular structures of bis (tertiary-butylamino) silane (BTBAS) and diisopropyl amine silane (DIPAS)

A BTBAS molecule has a relatively low vapor pressure and a relatively large molecular structure as shown in FIG. 38A. Namely, the BTBAS molecule is composed of a silicon atom, two nitrogen atoms one on each side of the silicon atom, and two t-butyl groups (—$C(CH_3)_3$) bonded with the corresponding nitrogen atoms. Therefore, the BTBAS may be somewhat disadvantageous in terms of a deposition rate, gap-filling characteristic, and properties of the silicon oxide film, depending on places where the silicon oxide film is deposited using the BTBAS gas in a semiconductor device, or performance requirements of the device. As a more preferable reaction gas for depositing the silicon oxide film, there is a diisopropyl amine silane (DIPAS) gas.

The DIPAS has a vapor pressure higher than the vapor pressure of the BTBAS. When the BTBAS gas is used, it is rather difficult to obtain a higher deposition rate. This is because the vapor pressure of the BTBAS gas is relatively lower, which makes it difficult to supply the BTBAS gas at a sufficiently high flow rate when the process pressure in the vacuum chamber 1 is relatively higher. On the other hand, a higher deposition rate can be obtained by using the DIPAS gas because the vapor pressure of the DIPAS is, for example, about ten times higher than that of the BTBAS at a temperature of 50° C., and thus a gas flow rate and a process pressure can be increased.

Figure 38B:
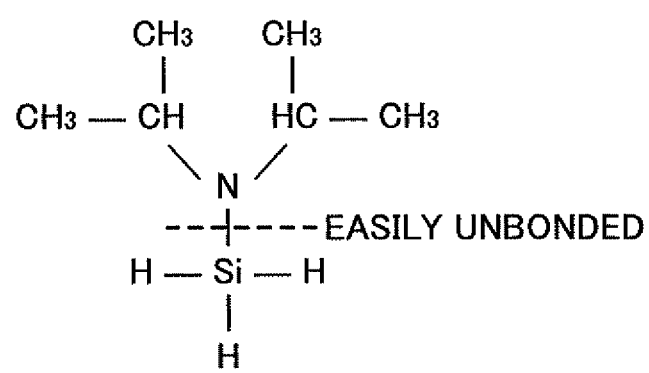

In addition, it is understood when comparing FIGS. 38A and 38B that the DIPAS molecule is smaller than the BTBAS molecule. Specifically, the BTBAS molecule has the t-butyl groups on both sides of the Si atom, as shown in FIG. 38A. Therefore, a steric hindrance problem may be caused to a relatively higher degree in the BTBAS. On the other hand, such a steric hindrance problem is caused to a lesser degree in the DIPAS. Moreover, a chemical bond between the silicon atom and the nitrogen atom in the DIPAS molecule is relatively easily unbonded by $O_3$ because the $O_3$ molecules can reach the Si atom without being hindered by the organic group. Therefore, an increased deposition rate may possibly be obtained when the DIPAS is used. Furthermore, the organic compounds and nitric compounds as the by-products are relatively rapidly released from the DIPAS molecules, because the chemical bond between the silicon atom and the nitrogen atom is relatively easily unbonded. Therefore, residual impurities are reduced in the resultant silicon oxide film, thereby yielding a better electric characteristic.

Furthermore, because the DIPAS has the relatively smaller molecular structure, the DIPAS molecules can be densely adsorbed on the wafer W, and thus the silicon oxide film having a higher density can be obtained. In addition, because of the higher density, the silicon oxide film is shrunk only to a limited degree by the subsequent annealing process. Therefore, even after the silicon oxide film is etched into a micro- (or nano-) pattern, such micro (or nano-) pattern structure is less likely to collapse, which may be caused by internal stress in a greatly shrunken film. Moreover, because the DIPAS has the smaller molecular structure and the gas flow rate and/or the process pressure can be increased when using the DIPAS gas, a gap-filling characteristic can be improved when a gap in the micro- (or nano-) pattern is filled with the silicon oxide.

In addition, the DIPAS molecules can be adsorbed at a higher rate on the wafer W, thereby reducing gas consumption. Moreover, because an across-wafer uniformity can be generally adjusted by adjusting the flow rate of the reaction gas and/or the process pressure in a process chamber, a process window regarding the across-wafer uniformity can be widened by using the DIPAS gas that can widen a process window for the flow rate and/process pressure originated from a higher vapor pressure.

An example of process parameters preferable in using the DIPAS gas in the film deposition apparatus according to this embodiment is as follows. A rotational speed of the turntable 2 is about 240 rpm; a process pressure is about 2.13 kPa (16 Torr); a deposition temperature is in a range from 350° C. through 500° C.; a flow rate of DIPAS gas is about 275 sccm; a flow rate of the process gas (Ar gas/$O_2$ gas) for the property modification is 4500/500 sccm; a flow rate of $O_3$ gas is about 10,000 sccm; and a flow rate of $N_2$ gas from the separation gas nozzles 41, 42 is about 10,000 sccm.

Even when the DIPAS gas is used, at least one of helium (He) gas, $NH_3$ gas, hydrogen ($H_2$) gas, and a gas containing N and O may be used as the process gas for the property modification. In addition, the property modification is preferably carried out every cycle of alternate supplying the DIPAS gas and the $O_3$ gas. Alternately, the property modification may be carried out every plural cycles, for example, 20 cycles of alternate supplying.

Although the turntable 2 is rotated relative to members or components above the turntable 2 such as the gas supplying systems (the first reaction gas nozzles 31, the activated gas injector 32, the separation gas nozzles 41, 42 and the like) and the convex portions 4 in the separation areas D in the foregoing examples, these members or components may be rotated relative to the turntable 2. Namely, the turntable 2 and the members or components above the turntable 2 may be rotated relative to each other.

In order to rotate such members or components relative to the turntable 2, the following configurations can be employed, for example. First, a rotatable sleeve, which can be rotated around a vertical axis (center axis), is provided at the center portion of the vacuum chamber 1, and the convex portion 4 and the activated gas injector 32 are attached to an outer circumferential surface of the rotatable sleeve. Next, gas supplying pipes are inserted into the inner space of the rotatable sleeve from outside, and bent upward in the inner space of the rotatable sleeve. The supplying pipes correspond to the reaction gas nozzle 31, the separation gas nozzle 41, 42, the gas port 39 of the activated gas injector 32 or the like, and have gas ejection holes along a predetermined range toward an end opposite to the inserting end. In this case, the gas supplying pipes corresponding to the separation gas nozzles are housed in the groove portion 43 of the convex portion 4.

Then, the gas supplying pipes vertically extending in the inner space of the rotatable sleeve are bent in substantially a horizontal direction toward the inner circumferential surface of the rotatable sleeve at different elevations, and distal ends of the gas supplying nozzles are inserted into corresponding through-holes made in the rotatable sleeve, so that the distal ends are open toward the outside space of the rotatable sleeve. The distal ends open toward the outside serve as gas inlet ports, as understood in the following explanation.

Next, a fixed sleeve is provided concentrically outside of the rotatable sleeve in order to surround a portion of the rotatable sleeve where the distal ends of the gas supplying pipes appear. In addition, plural pairs of bearings and magnetic fluid seals are provided one above another between the rotatable sleeve and the fixed sleeve so that plural gaseous communication spaces for the corresponding distal ends (gas inlet ports) are formed in the vertical direction.

On the other hand, first ends of gas lines are inserted from the outside of the fixed sleeve into the inner space of the fixed, so that the gas lines are in gaseous communication with the corresponding communication spaces. The other ends of the gas lines are connected to corresponding gas supplying sources. With these configurations, the gases are supplied to the corresponding distal ends (gas inlet ports) of the gas supplying pipes from the corresponding gas supplying sources through the corresponding gas lines and communication spaces. Even when the rotatable sleeve is rotated in relation to the fixed sleeve and thus the convex portion, the activated gas injector and the gas supplying nozzles are rotated, the gases from the corresponding gas supplying sources can be supplied into the vacuum chamber 1 through the gas supplying nozzles, because the distal ends (gas inlet ports) of the gas supplying pipes are kept in gaseous communication with the corresponding communication spaces.

(Simulation)

Simulation is carried out with respect to the activated gas injector 32 according to the first embodiment and an activated gas injector for comparison in order to study a gas flow pattern in each injector. This activated gas injector for comparison does not have the partition 324, so that the gas introduction chamber 322 and the gas activation chamber 323 are not separated, and has a gas introduction/activation chamber 327 (see FIG. 39B) instead. The activated gas injector for comparison has substantially the same configuration as the activated gas injector 32 except for the above difference.

A. Simulation Conditions

A gas used in the simulation is $NH_3$ gas at a flow rate of 3000 sccm; a process pressure in the vacuum chamber 1 is 1.33 kPa (10 Torr); and a gas temperature is 0° C. (273 K).

Example 1

The gas flow pattern in the injector body 321 of the activated gas injector 32 according to the first embodiment is first simulated.

Comparison Example 1

The gas flow pattern in the injector body of the activated gas injector is simulated. This activated gas injector has the same configuration as Example 1 except that the partition 324 is not provided.

B. Simulation Results

Figure 39A:
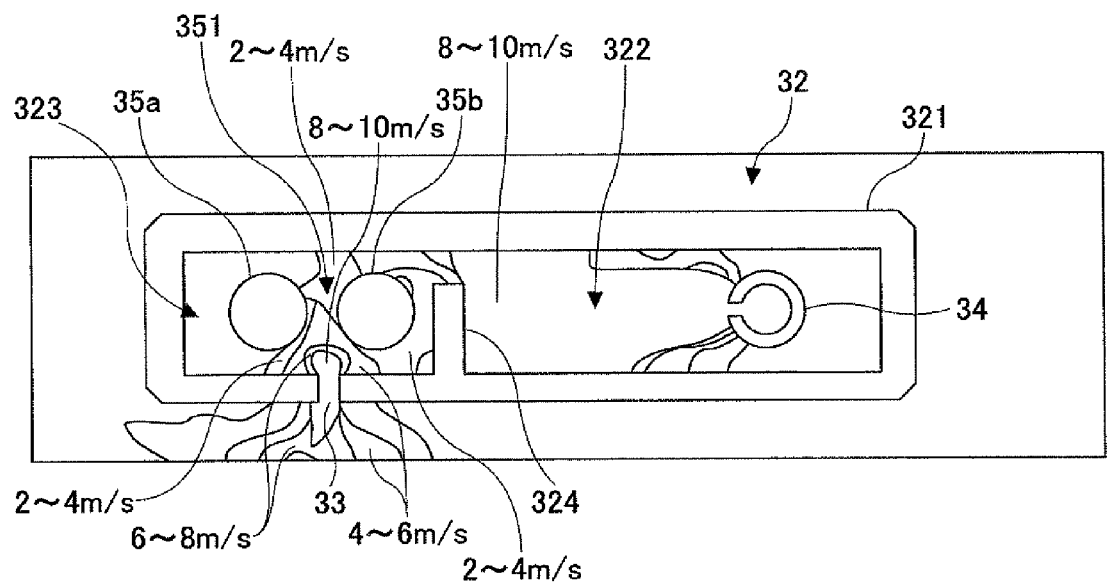
FIGS. 39A and 39B show simulation results on gas flow patterns in activated gas injectors.
Figure 39B:
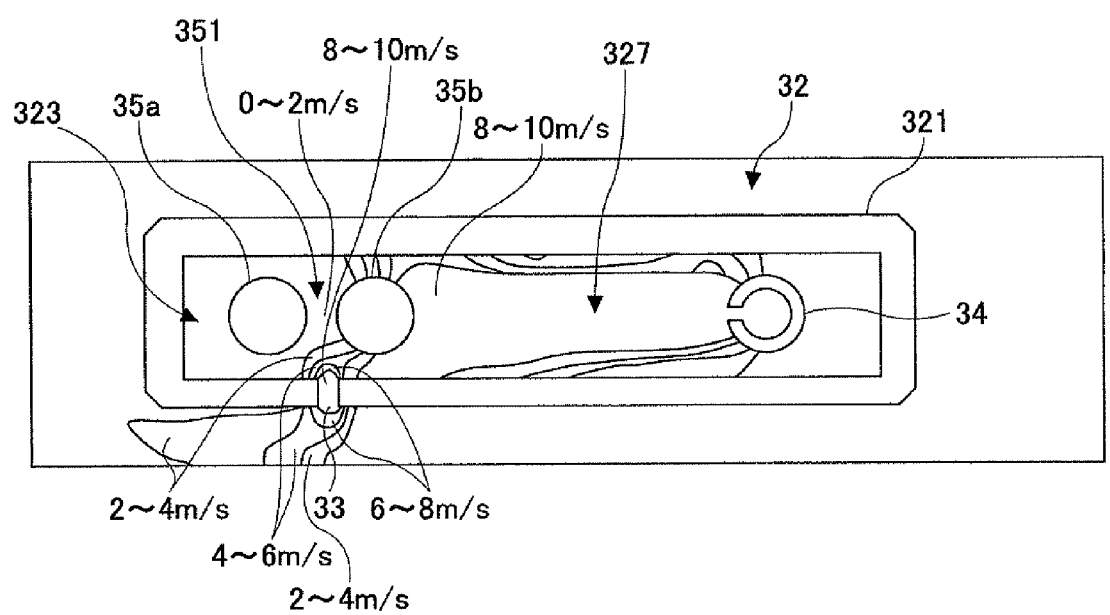

The simulation result for Example 1 is shown in FIG. 39A, and the simulation result for Comparison example 1 is shown in FIG. 39B. In these drawings, gas flow speeds in the injector body 321 are indicated with contour lines. Values shown in the drawings indicate a flow speed range in an area between every two adjacent contour lines.

As shown in FIG. 39A, the $NH_3$ gas flows through the plasma generation portion 351 between the sheath pipes 35a and 35b at relatively higher speeds in the case of the activated gas injector 32. Namely, it is understood from this result that the $NH_3$ gas can be made to efficiently flow through the plasma generation portion 351 because the partition wall 324 has the cut-out portions 325 in order to guide the $NH_3$ gas into the upper portion of the gas activation chamber 323.

On the other hand, the $NH_3$ gas flows through an area between the right sheath pipe 35b and the injector body 321 at relatively higher speeds to reach the gas ejection holes 33 without flowing through the plasma generation portion 351 in the activated gas injector of Comparison example 1, as shown in FIG. 39B. Therefore, it is thought that the NH3 gas may not be effectively activated into plasma.

From these results, it has been found that the $NH_3$ gas can be efficiently activated into plasma by providing the partition wall 324 in order to guide the $NH_3$ gas toward the plasma generation portion 351 between the electrodes 36a, 36b, when the activated gas injector is configured so that the electrodes 36a, 36b are arranged side by side in the gas activation chamber 323.

(Experiments)

The ALD mode film deposition was carried out using the activated gas injector 32d according to the fourth embodiment of the present invention. The BTBAS gas and the $O_3$ gas were used as the reaction gases in order to deposit the silicon oxide film. The activated gas injector 32d employing the heater 30 was used to heat and activate the $O_3$ gas. A process pressure was about 1.067 kPa (8 Torr); a deposition temperature was about 100° C.; a rotational speed of the turntable 2 was about 120 rpm; a flow rate of the BTBAS gas was about 100 sccm; and a flow rate of the $O_3$ gas was about 10000 sccm. In addition, five wafers W were placed in the turntable 2, and deposition time was about 31 minutes.

A. Experimental Conditions

Example 2-1

Electrical power supplied to the heater 300 is adjusted so that a temperature measured by the temperature sensing terminal 305 is about 300° C.

Example 2-2

Electrical power supplied to the heater 300 is adjusted so that a temperature measured by the temperature sensing terminal 305 is about 400° C.

Example 2-3

Electrical power supplied to the heater 300 is adjusted so that a temperature measured by the temperature sensing terminal 305 is about 500° C.

Example 2-4

Electrical power supplied to the heater 300 is adjusted so that a temperature measured by the temperature sensing terminal 305 is about 600° C.

Comparison Example 2

For comparison, the ALD mode film deposition of the silicon oxide was carried out without heating the $O_3$ gas supplied to the activated gas injector 32d.

B. Experimental Results

The experimental results for Examples and Comparison example are summarized in Table 1. In Table 1, an across-wafer-uniformity (%) was obtained by measuring a maximum thickness and a minimum thickness in each of the five wafers W, obtaining a value using an expression: (maximum thickness−minimum thickness)/(maximum thickness+minimum thickness)×100 for all the five wafers W obtained in each of Examples and Comparison example, and finally averaging the obtained five values. In addition, wafer-to-wafer uniformity was obtained by calculating an average thickness for each of the all the five wafers W, obtaining a maximum average thickness and a minimum average thickness from the five average thicknesses, and calculating a value using an expression: (maximum average thickness−minimum average thickness)/(maximum average thickness+minimum average thickness)×100.

TABLE 1

|  | Ex. 2-1 | Ex. 2-2 | Ex. 2-3 | Ex. 2-4 | Comp. 2 |
| --- | --- | --- | --- | --- | --- |
| temperature (° C.) | 300 | 400 | 500 | 600 | — |
| thickness (nm) | 24.91 | 26.18 | 27.24 | 33.01 | 20.65 |
| deposition rate (nm/min) | 0.8 | 0.84 | 0.88 | 1.07 | 0.66 |
| depo. rate per cycle (nm/cycle) | 0.007 | 0.007 | 0.007 | 0.009 | 0.005 |
| across-wafer-uniformity (+/−%) | 31.97 | 33.12 | 34.32 | 39.88 | 36.55 |
| wafer-to-wafer uniformity (+/−%) | 0.86 | 0.91 | 0.81 | 0.66 | 0.92 |

When comparing the experimental results for Examples 2-1 through Example 2-3 and Comparison result in Table 1, it is understood that the deposition rate (nm/min) and the deposition rate per cycle (nm/cycle) are greater when the heater 30 was used than when the heater 30 was not used. In addition, the deposition rate is increased with an increase in the temperature of the heater 30. From these results, it can be thought that the $O_3$ gas can absorb higher energy in the activated gas injector 32d as the temperature of the heater 30 is increased, and as a result, a concentration of active species such as oxygen radicals in the gas supplied to the wafers W is increased.

Regarding the across-wafer-uniformity and the wafer-to-wafer uniformity, the smaller values mean the better uniformity. Referring to Table 1, the across-the-wafer-uniformities are better in Examples 2-1 through 2.3 than in Comparison example 2. In addition, the across-wafer-uniformity becomes worse as the temperature of the heater 30 is increased.

In summary, the across-wafer-uniformity becomes better by using the heater 30, but worse when the temperature of the heater 30 is further increased. This may be explained as follows. When the heater 30 is not used (Comparison example 2), the reaction between the BTBAS gas and the $O_3$ gas is facilitated only by heat from the wafer W (turntable 2). Therefore, the deposition rate is relatively lower and rather dominated by the rotational speed of the turntable 2. As a result, the silicon oxide film is rather thicker in an area of the wafer W near the center of the turntable, where the circumferential speed is lower, and gradually thinner toward the circumferential edge of the turntable 2, where the circumferential speed is higher. On the other hand, because the active species are directly supplied to the upper surface of the wafer W in Example 2-1 in which the heater 30 was used, the reaction speed becomes higher. As a result, the rotational speed of the turntable 2 becomes less influential in terms of the deposition rate, thereby improving the across-wafer-uniformity. However, it can be thought that the rotational speed of the deposition rate is still influential in an area near the circumferential edge of the turntable 2, and therefore the active species supplied to such an area is not dominant, which results in substantially no increase in the deposition rate in the area. Therefore, when the temperature of the heater 30 becomes higher (Examples 2-2 through 2-4), an amount of the active species is increased in an area (a radially inward area of the turntable 2) where the active species play a dominant role on the deposition rate, and thus the deposition rate is increased, leading to a thicker film in the area. On the other hand, the deposition rate is scarcely increased in another area (a radially outward area of the turntable 2) where the rotational speed of the turntable 2 is dominant in the deposition rate, even when the amount of the active species supplied to the area is increased, and thus the film thickness is not changed. As a result, a thickness difference between the radially inward area where the thickness is increased and the radially outward area where the thickness is not changed becomes greater, and thus degradation in the across-wafer-uniformity is observed. However, although the across-wafer-uniformity becomes worse in Example 2-4, the uniformity is still practically suitable in semiconductor device manufacturing. An increased deposition rate due to the use of the heater 30 should be emphasized.

Incidentally, the above experiments were carried out in a prototype film deposition apparatus under development, and this is why the across-wafer-uniformities of thickness in Table 1 are relatively higher, for example, about 30%. It is thought that the across-wafer-uniformities will be decreased to a practical level when the film deposition apparatus according to the present invention is well-organized, and the same results as above will be observed in such a well-organized apparatus.

Referring back to Table 1, the wafer-to-wafer uniformity is better in Examples 2-1 through 2-4 than in Comparison example 2. In addition, while the wafer-to-wafer uniformity becomes worse when the temperature of the heater 30 is increased from 300° C. (Example 2-1) to 400° C. (Example 2-2), the wafer-to-wafer uniformity is improved when the temperature of the heater 30 is increased from 400° C. (Example 2-2) to 600° C. (Example 2-4).

Although more studies are required in order to explain the reason why the uniformity becomes worse from 300° C. to 400° C., the uniformity improvement due to an increased temperature from 400° C. to 600° C. can be explained in the following manner. Namely, the BTBAS molecules adsorbed on the wafer W can be thoroughly oxidized into the silicon oxide because the circumferential flow speed of the reaction gases is lower in the radially inward area of the turntable 2, which allows a sufficiently long reaction time. In other words, the thickness of the silicon oxide film is not increased but saturated, because of depletion of the BTBAS molecules in the radially inward area.

On the other hand, in the area where the film thickness is not saturated, the film thickness is influenced by various factors such as how the gas including the active species flows over the area, how the BTBAS molecules on the wafer W contacts the active species, and the like. Therefore, when the temperature of the heater 30 is increased to increase a concentration of the active species to be supplied to the wafer W, the area where the thickness of the silicon oxide is saturated is increased, and the area where the thickness is influenced by various factors is decreased, which results in an improved wafer-to-wafer uniformity.

As stated above, the activated gas injector 32*d* having the heater 30 for activating the process gas is advantageous in improving the across-wafer-uniformity and the wafer-to-wafer uniformity as well as increasing the deposition rate.

Example 3-1

Next, another simulation is explained. This simulation is carried out in order to study a flow pattern in the vacuum chamber 1 when the activated gas injector 220 is used, specifically to study whether the flow patterns of the Ar gas ejected from the gas introduction nozzle 34 are different when the cover body 221 is used and not used. Simulation conditions used are:
pressure in the vacuum chamber 1: 400 Pa (3 Torr)
rotational speed of the turntable 2: 240 rpm
first reaction gas: $O_2$ (10 standard liters per minute (slm))
second reaction gas: $O_3$ (10 slm)
process (modification) gas: Ar (2 slm)
purge gas supplied from the center area C: $N_2$ (15 slm)
separation gas supplied from each separation area D: $N_2$ (3 slm)
purge gas supplied to the area below the turntable 2: $N_2$ (10 slm)
(Simulation Results)

Figure 40A:
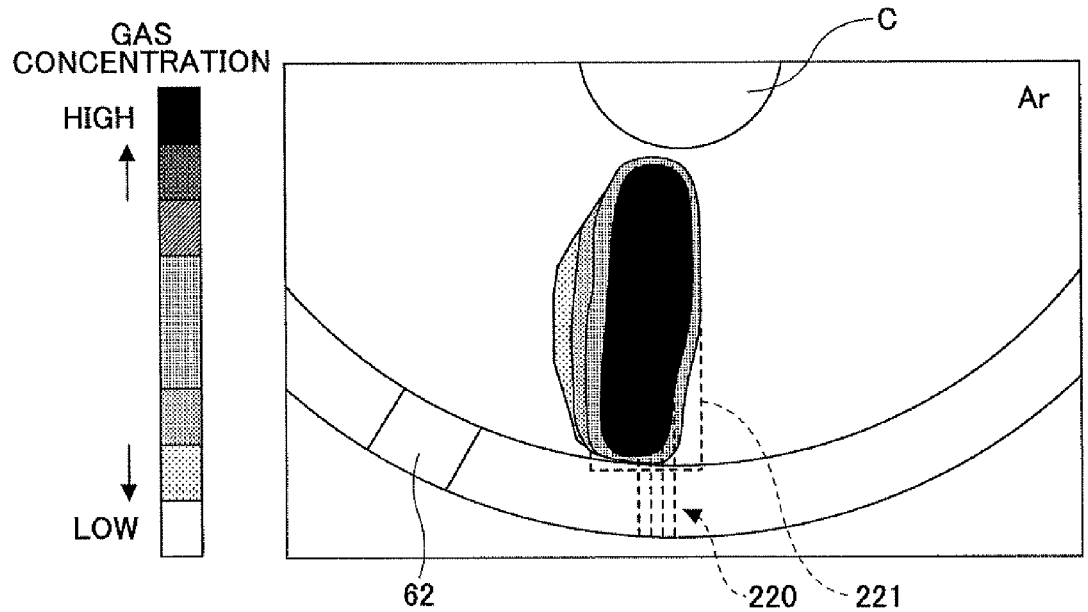
FIGS. 40A through 40D show simulation results on gas distributions around the activated gas injectors in the vacuum chamber of the film deposition apparatus.
Figure 40B:
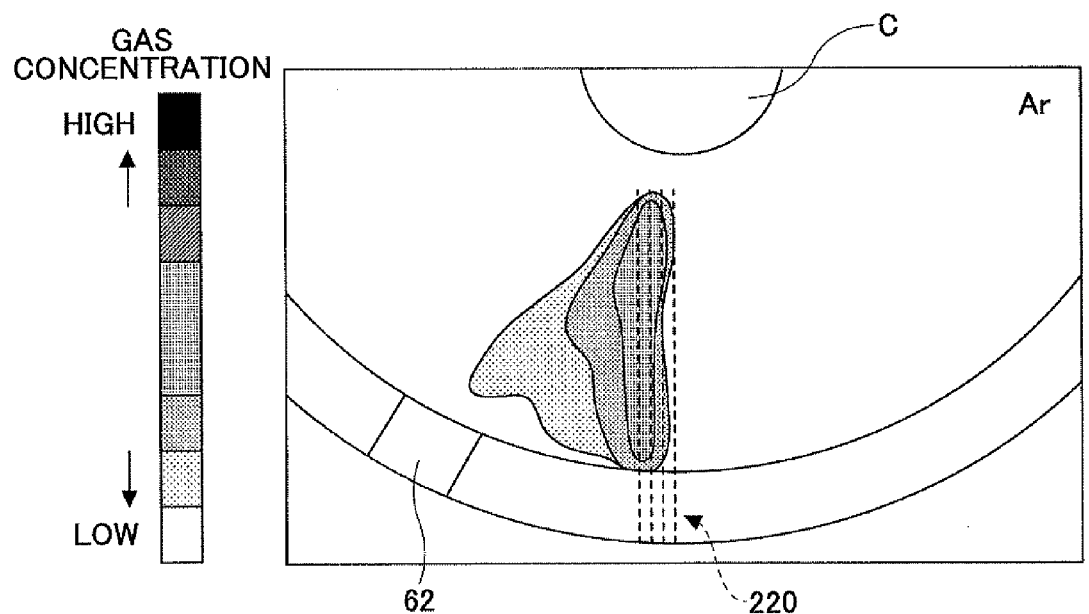
Figure 40C:
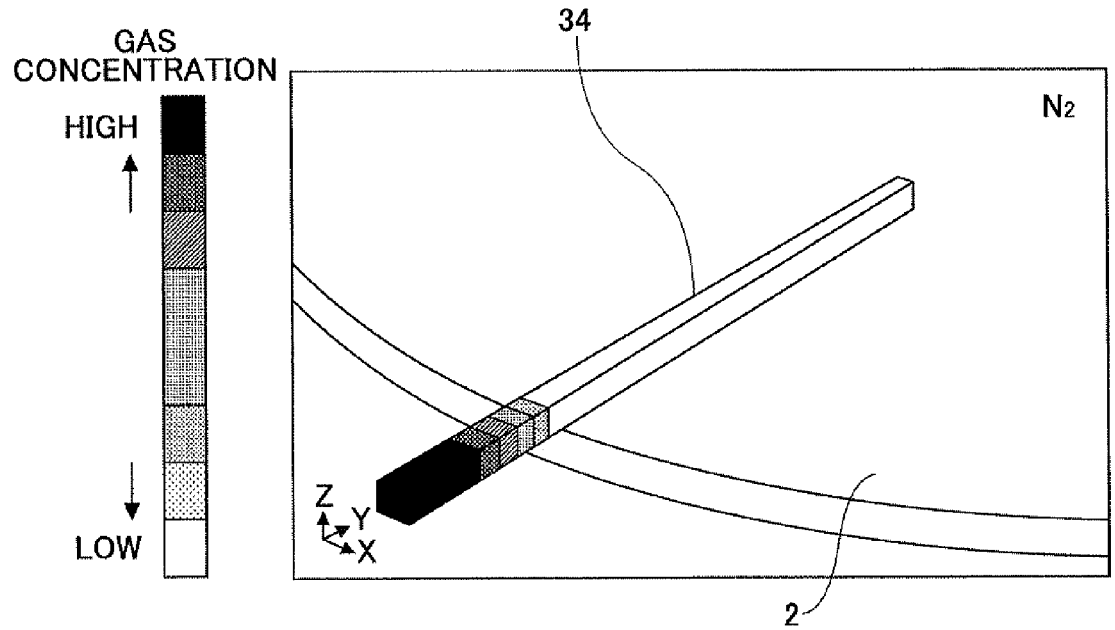
Figure 40D:
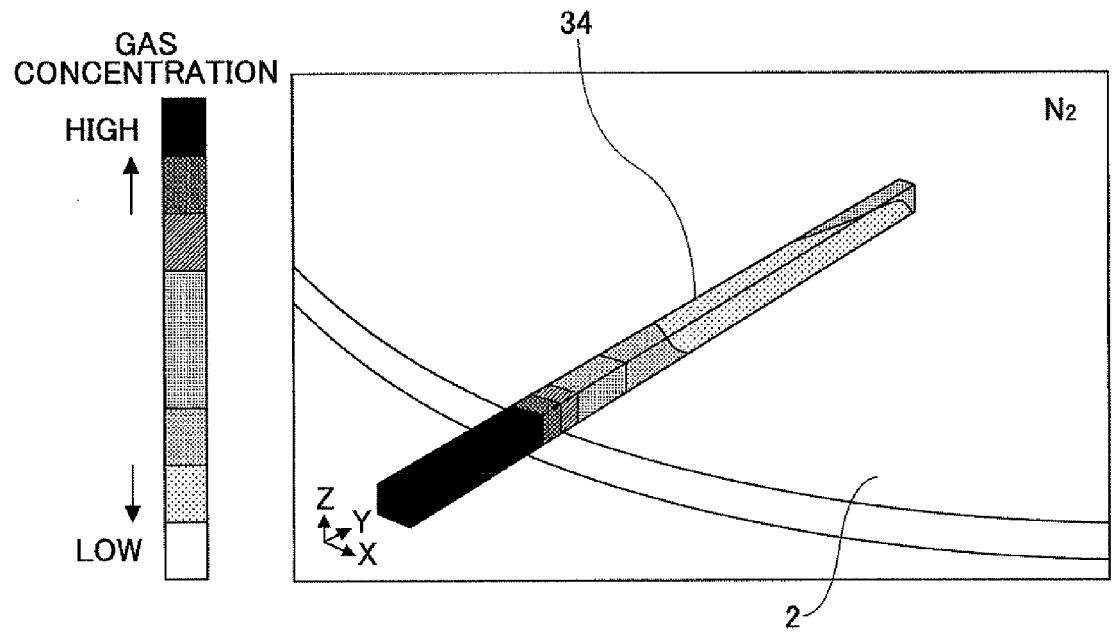

Simulation results obtained using the above conditions are shown in FIGS. 40A through 40D. FIGS. 40A and 40B are plan views showing distributions of Ar gas concentration near the activated gas injector 220 above the turntable 2. FIGS. 40C and 40D are perspective views showing distributions of $N_2$ gas (separation gas) concentration near the gas introduction nozzle 34. FIGS. 40A and 40C show the results when the cover body 221 is used, and FIGS. 40B and 40D show the results when the cover body 221 is not used.

From the results shown in FIGS. 40A through 40D, it is found that the Ar gas remains inside the activated gas injector 220 at a higher concentration and thus the gas flow can be controlled by the cover body 221. On the other hand, when the cover body 221 is not used, the Ar gas spreads toward the downstream side of the activated gas injector 220. In addition, the $N_2$ gas concentration is lower near the activated gas injector 220 when the cover body 221 is used, which indicates that the cover body 221 can impede the $N_2$ gas from flowing into the inner space of the activated gas injector 220. On the other hand, when the cover body 221 is not used, the $N_2$ gas reaches the gas introduction nozzle 34 at a relatively high concentration.

Example 3-2

Another simulation is carried out with the same conditions as in Example 3-1 except that the process flow rate is 5 slm.

Figure 41A:
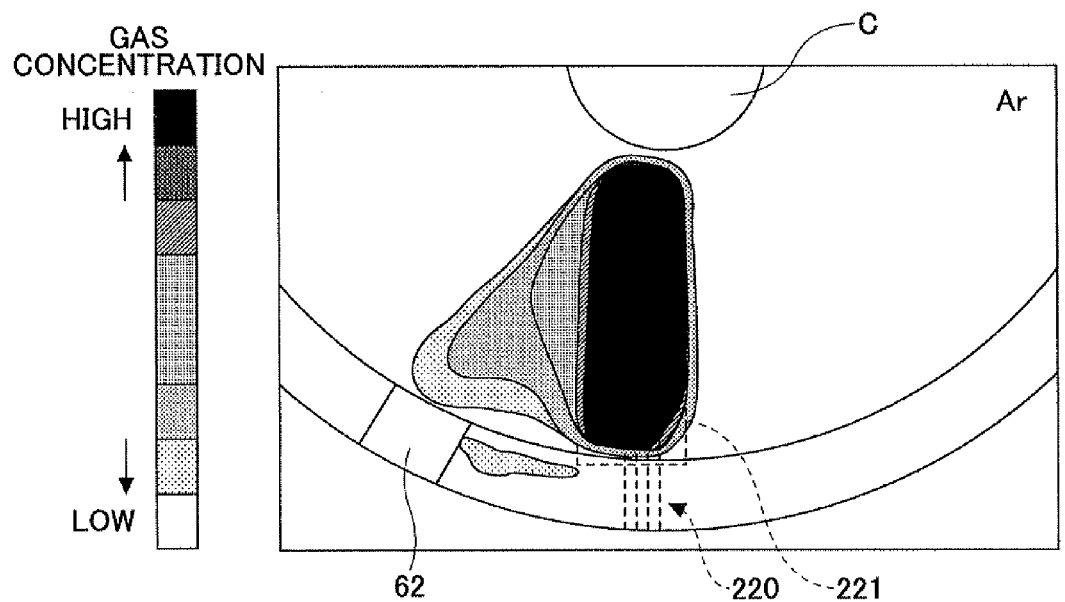
FIGS. 41A through 41D show other simulation results on gas distributions around the activated gas injectors in the vacuum chamber of the film deposition apparatus.
Figure 41B:
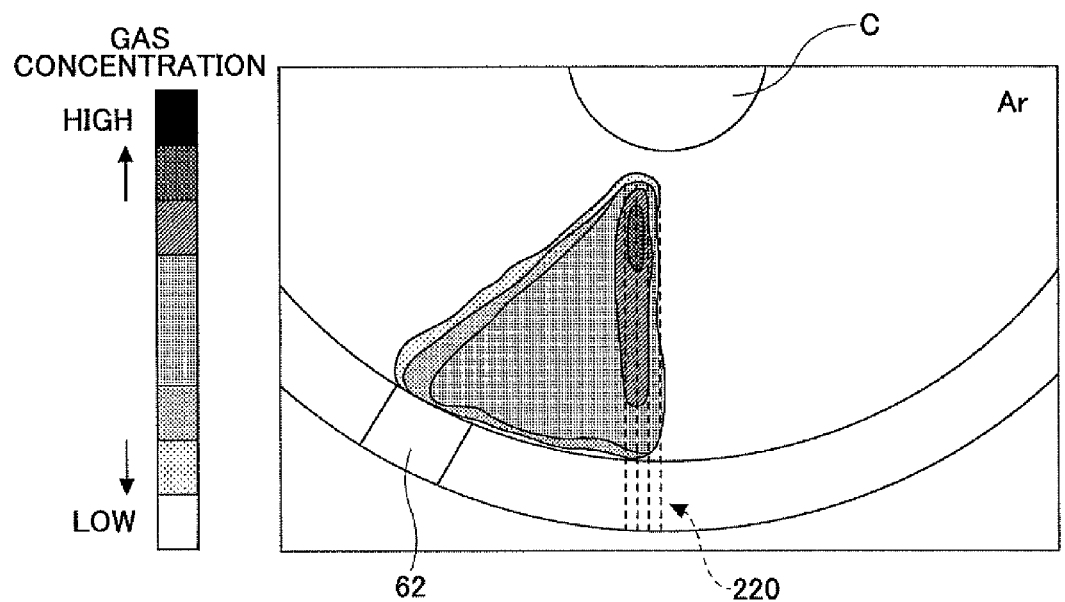
Figure 41C:
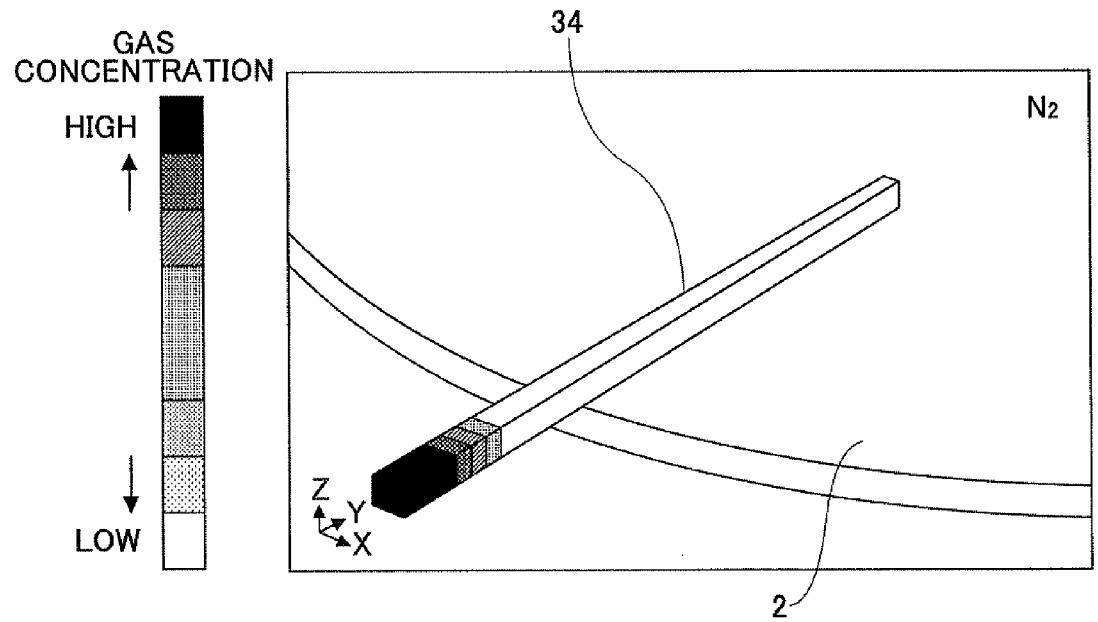
Figure 41D:
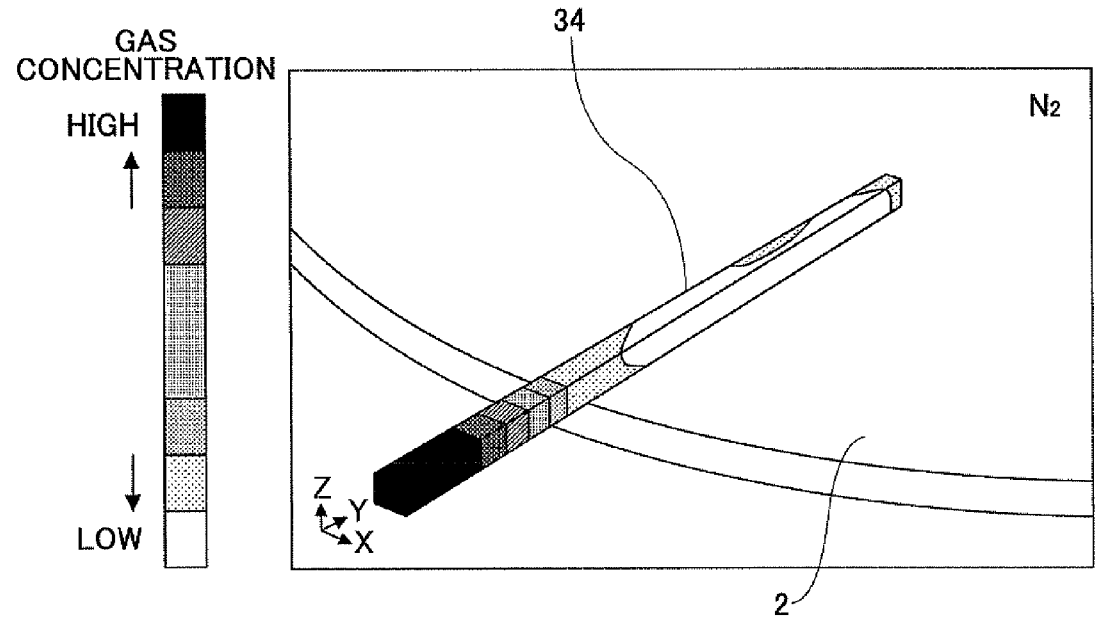

As a result, the Ar gas concentration can be increased near the activated gas injector 220 by use of the cover body 221, as shown in FIG. 41A, and the $N_2$ gas is impeded from flowing into the activated gas injector 220, as shown in FIG. 41B. From the results of Examples 3-1 and 3-2, the flow rate of the process (Ar) gas is preferably about 2 slm in order to impede the gas from flowing into the activated gas injector 220.

Example 4

Figure 42:
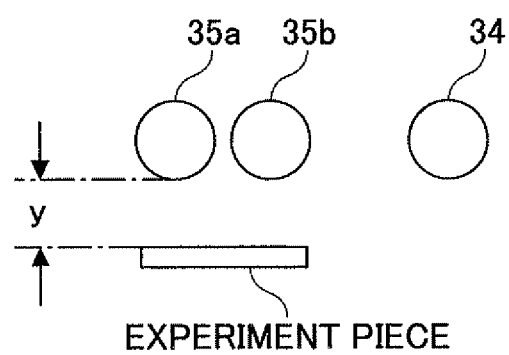
FIG. 42 is an explanatory view of a simulation model.

Next, other experiments were carried out in order to confirm the effects of the property modification of the silicon oxide film and dependence of the modifying effect on a distance y between the sheath pipes 35a, 35b and the wafer W (see FIG. 42).

In this experiment, an experiment piece on which the silicon dioxide film had been deposited was prepared and placed below and in the middle of the sheath pipes 35a, 35b, and the property modification was carried out with respect to the experiment piece. Then, the piece was immersed in hydrofluoric acid solution, and a wet-etching rate of the silicon oxide film by the solution was measured.
(Experiment Conditions)
temperature in the vacuum chamber: Room Temperature
pressure: 240 Pa (1.8 Torr)
high frequency power: 200 W
process (modification) gas: Ar (300 sccm)
process time: 5 minutes
distance y between the sheath pipes 35a, 35b and the experiment piece: 6, 9, 12 mm
(Experimental Result)

Figure 43:
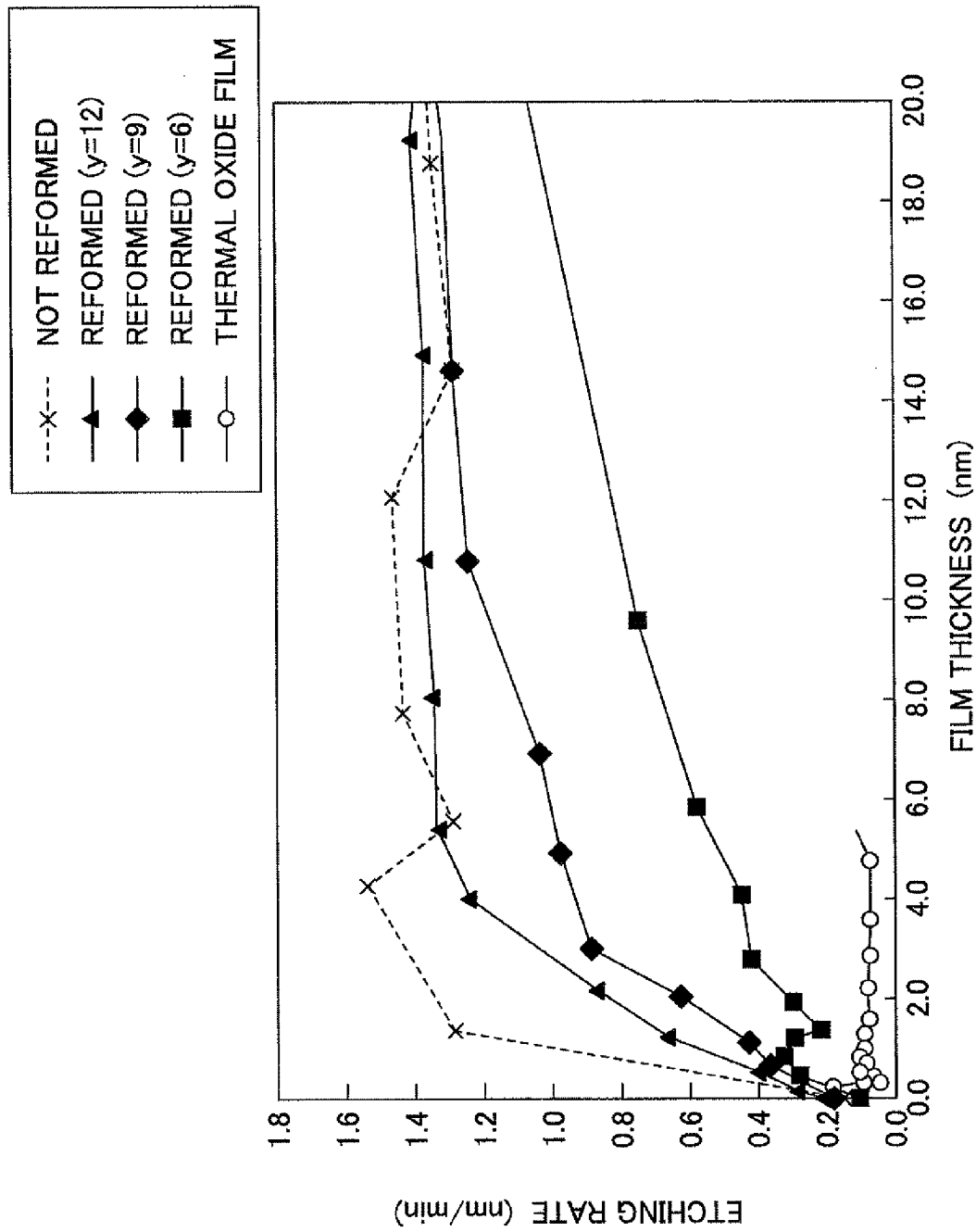
FIG. 43 shows an etching rate as a function of a thickness of silicon oxide film prepared in an experiment.

FIG. 43 shows the experimental results of Example 4. As shown, the wet-etching rate becomes lower when the property modification is carried out than when the property modification is not carried out. In addition, as the distance y between the sheath pipes 35a, 35b and the experiment piece is reduced, the wet-etching rate is reduced, which indicates the silicon oxide film is more densified. Moreover, because the wet-etching rate becomes lower toward the surface of the silicon oxide films as shown in FIG. 43, the silicon oxide films are more densified near the surface. This means that the property modification has a great influence on the surface of the silicon oxide film. Therefore, when the property modification is carried out during film deposition, namely, every cycle of alternately supplying the reaction gases, the oxide film can be densified throughout the thickness, as described above.

Example 5

Next, results of an experiment carried out using the DIPAS gas as the first reaction gas for depositing the silicon oxide film are explained. In this experiment, the silicon oxide films were deposited in the film deposition apparatus shown in FIGS. 29 through 35 under deposition conditions summarized in Table 2, and the deposition rates were calculated. During the deposition, the property modification was carried out for every cycle of alternately supplying the reaction gases (DIPAS, $O_3$), or for every revolution of the turntable 2. For comparison, the silicon oxide films were deposited using the DIPAS gas and the BTBAS gas, without the property modification. Incidentally, wafers having a diameter of 300 mm were used in this experiment.

TABLE 2

| Exp. # | Rotational speed (rpm) | Dep. Temp. ° C. | Press. (kPa (Torr)) | High Freq. Power (W) | Gases |
|---|---|---|---|---|---|
| Comp. 5-1 | 240 | 350 | 1.07 (8) | 0 | BTBAS |
| Comp. 5-2 |  | 450 |  |  | DIPAS |
| Comp. 5-3 |  | 350 |  |  |  |
| Comp. 5-4 | 120 |  |  |  |  |
| Comp. 5-5 | 60 |  |  |  |  |
| Comp. 5-6 | 30 |  |  |  |  |
| Comp. 5-7 | 240 |  | 0.50 (4) |  |  |
| Comp. 5-8 | 30 |  |  |  |  |
| Comp. 5-9 | 20 |  |  |  |  |
| Ex. 5-1 | 240 |  | 1.07 (8) | 200 |  |
| Ex. 5-2 | 30 |  |  |  |  |
| Ex. 5-3 | 240 | 450 |  | 400 |  |
| Ex. 5-4 |  | 350 |  |  |  |
| Ex. 5-5 | 120 |  |  |  |  |
| Ex. 5-6 | 60 |  |  |  |  |
| Ex. 5-7 | 30 |  |  |  |  |
| Ex. 5-8 | 240 |  | 0.50 (4) |  |  |
| Ex. 5-9 | 30 |  |  |  |  |
| Ex. 5-10 | 20 |  |  |  |  |

In Table 2, high frequency power supplied to the electrodes 36a, 36b is shown as "High Freq. Power (W)". At each row in Table 2, the flow rate of the DIPAS gas was 275 sccm; the concentration and the flow rate of the $O_3$ gas were 300 g/Nm$^3$ and 10 slm, respectively; the flow rate of the process (modifying) gas (Ar/$O_2$) is 5 slm/0.1 slm. Incidentally, in Comparison example 5-1, the flow rate of the BTBAS gas was 200 sccm, which yields the highest deposition rate in all the experiments carried out using the BTBAS gas.

Figure 44:
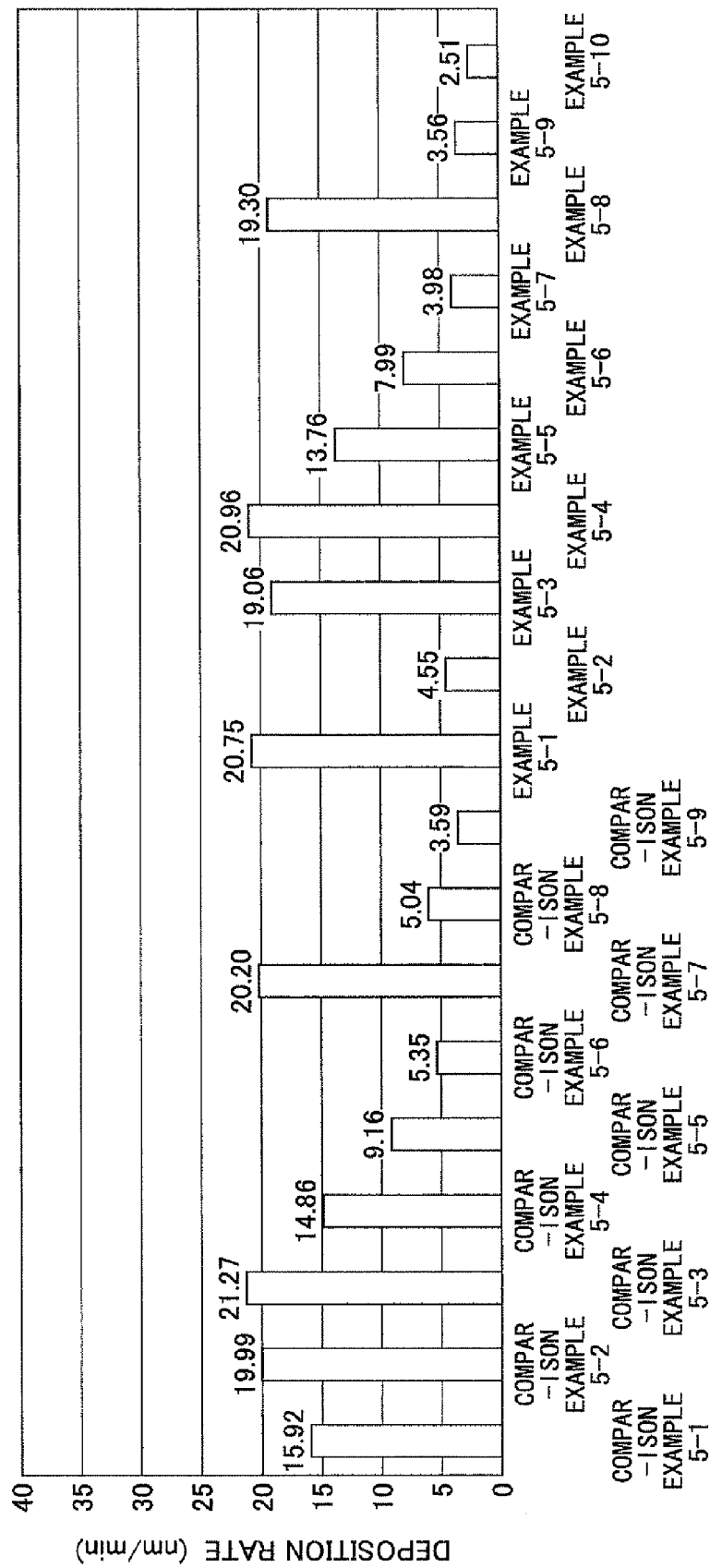
FIG. 44 shows experimental results of an experiment carried out using a film deposition apparatus according to an embodiment of the present invention.

FIG. 44 shows the experimental results in Example 5. As shown, a higher deposition rate is obtained by using the DIPAS gas than using the BTBAS gas under the same conditions (see Comparison examples 5-1, 5-3). In addition, when the DIPAS gas is used, the gas flow rate and the process pressure can be set higher than the upper limits of the BTBAS gas, and the deposition rates are higher by an incremental amount of the DIPAS gas. Moreover, when the DIPAS gas is used at the deposition temperature of 350° C. and the pressure of 1.067 kPa (8 Torr), while no significant changes in the deposition rate depending on the high frequency power for the property modification is observed at the rotational speed of 24 rpm, the deposition rate becomes smaller at the rotational speed of 30 rpm when the high frequency power is increased. In this case, as the high frequency power is increased from 0 W to 400 W, the deposition rate is reduced as much as about 25.6%.

From these results, it has been found that the effects of the property modification are clearly observed when the rotational speed of the turntable 2 is lower because the wafer W can undergo the property modification for a longer time (or the wafer W can stay under the activated gas injector 220 for a longer time). The reduced deposition rate may suggest densification of the silicon oxide film due to the property modification. In addition, the higher deposition temperature or the lower pressure results in a more densified silicon oxide film. As stated, when a period of time when the wafer W stays under the activated gas injector 220 is increased, and/or an amount and/or chemical activity of ions generated from the process (modifying) gas is increased, the effects of the property modification becomes more significant.

Example 6

Next, the wet-etching rates are studied for the silicon oxide films deposited under deposition conditions summarized in Table 3. The wet-etching rates were measured by immersing the silicon oxide films in a diluted hydrofluoric acid solution (1 wt %).

TABLE 3

| Exp. # | Rotational speed (rpm) | Dep. Temp. (° C.) | Press. (kPa (Torr)) | High Freq. Power (W) | Gases |
|---|---|---|---|---|---|
| Comp. 6-1 | 240 | 350 | 1.07 (8) | 0 | BTBAS |
| Comp. 6-2 |  | 450 |  |  | DIPAS |
| Comp. 6-3 |  | 350 |  |  |  |
| Comp. 6-4 | 30 |  |  |  |  |
| Comp. 6-5 | 240 |  | 0.50 (4) |  |  |
| Comp. 6-6 | 30 |  |  |  |  |
| Comp. 6-7 | 20 |  |  |  |  |
| Ex. 6-1 | 240 | 450 | 1.07 (8) | 400 |  |
| Ex. 6-2 |  | 350 |  |  |  |
| Ex. 6-3 | 30 |  |  |  |  |
| Ex. 6-4 | 240 |  | 0.50 (4) |  |  |
| Ex. 6-5 | 30 |  |  |  |  |
| Ex. 6-6 | 20 |  |  |  |  |

Figure 45:
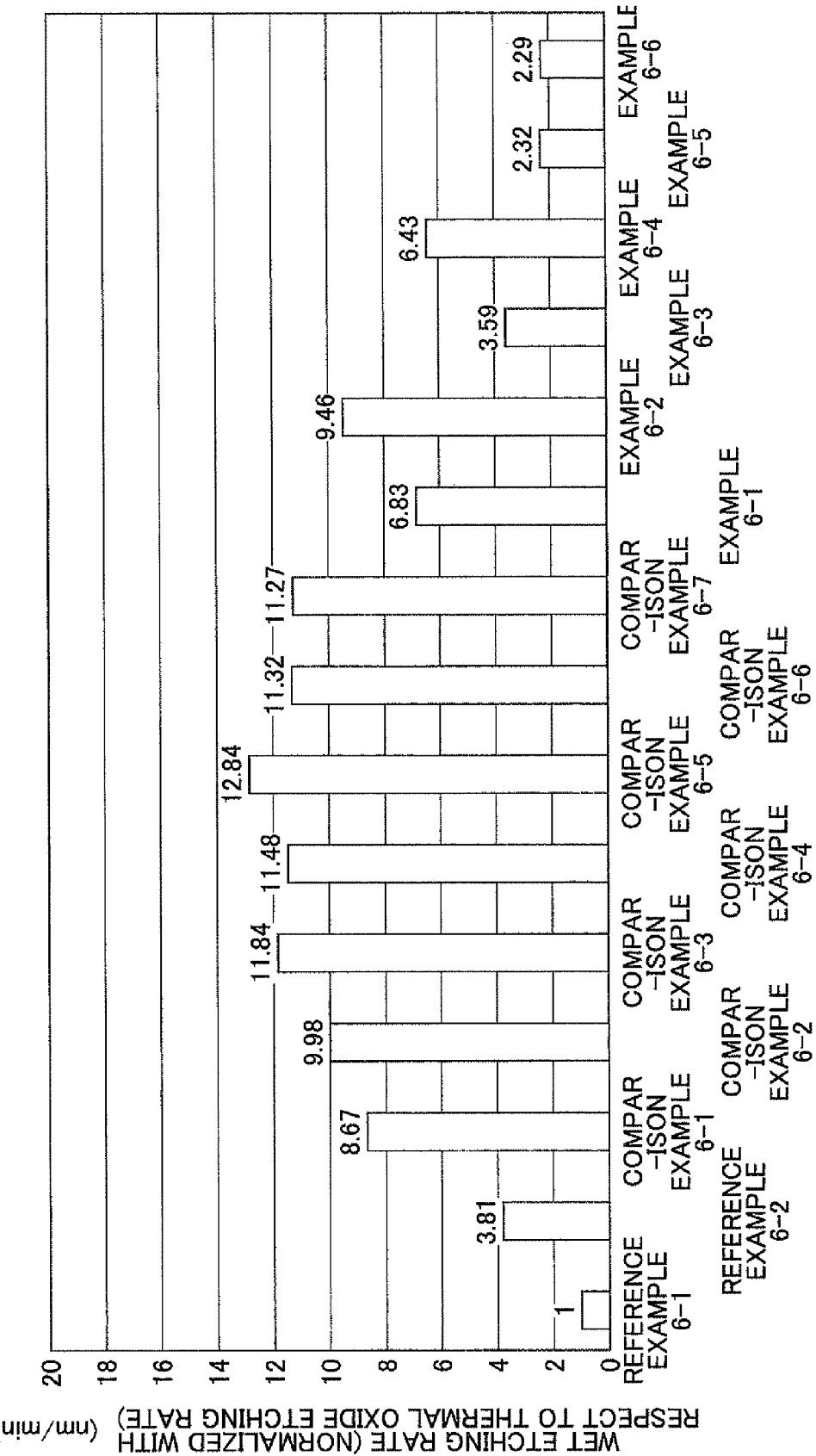
FIG. 45 shows experimental results of another experiment carried out using a film deposition apparatus according to an embodiment of the present invention.

The experimental results are shown in FIG. 45. Incidentally, the wet-etching rates of silicon oxide films obtained by a thermal oxidation of silicon and a CVD method using a dichlorosilane gas and $N_2O$ are also shown in FIG. 45, as reference examples 6-1 and 6-2, respectively. The etching rates in FIG. 45 are normalized with the etching rate of the thermal silicon dioxide.

From FIG. 45, it has been found that the silicon oxide film deposited using the DIPAS gas and modified in terms of properties has an improved resistance against the wet etching. Depending on the deposition conditions, such a silicon oxide film has comparable etching resistance with the thermally grown silicon dioxide film. This result may indicate that the film deposition of silicon oxide using the DIPAS gas with the property modification carried out every cycle is an extremely effective method, taking account of the fact that the silicon oxide film deposited using the BTBAS gas without the property modification can only have wet etching resistance one-fifth or less of the wet etching resistance of the thermally grown silicon oxide even when such a silicon oxide film undergoes thermal processing at 800° C. or more.

In addition, the wet-etching resistance may be improved when a period of time when the wafer W stays under the activated gas injector 220 is increased, and/or an amount or chemical activity of ions generated from the process (modifying) gas is increased, which is similar to the results explained in Example 5.

On the other hand, some silicon oxide films deposited using the DIPAS gas without the property modification have a wet-etching rate greater than the wet-etching rate of the silicon oxide film deposited using the BTBAS gas. This is thought to be because the BTBAS originated silicon oxide film may include a relative large quantity of nitrogen as impurities, which enhances the wet-etching resistance. This may indicate that the DIPAS originated silicon oxide film has a smaller quantity of nitrogen even before the property modification is carried out.

Example 7

Next, experimental results of another experiment carried out to study shrinkage of the silicon oxide film are explained. In the experiment, the silicon oxide films were annealed at 850° C. under a nitrogen environment. The silicon oxide films of Examples 7-1 through 7-6 and Comparison examples 7-1 through 7-7 were prepared under the same conditions as Examples 6-1 through 6-6 and Comparison examples 6-1 through 6-7. In addition, the shrinkage measured for a silicon oxide film deposited by the CVD method mentioned above is also shown in the following as a reference example 7-1.

Figure 46:
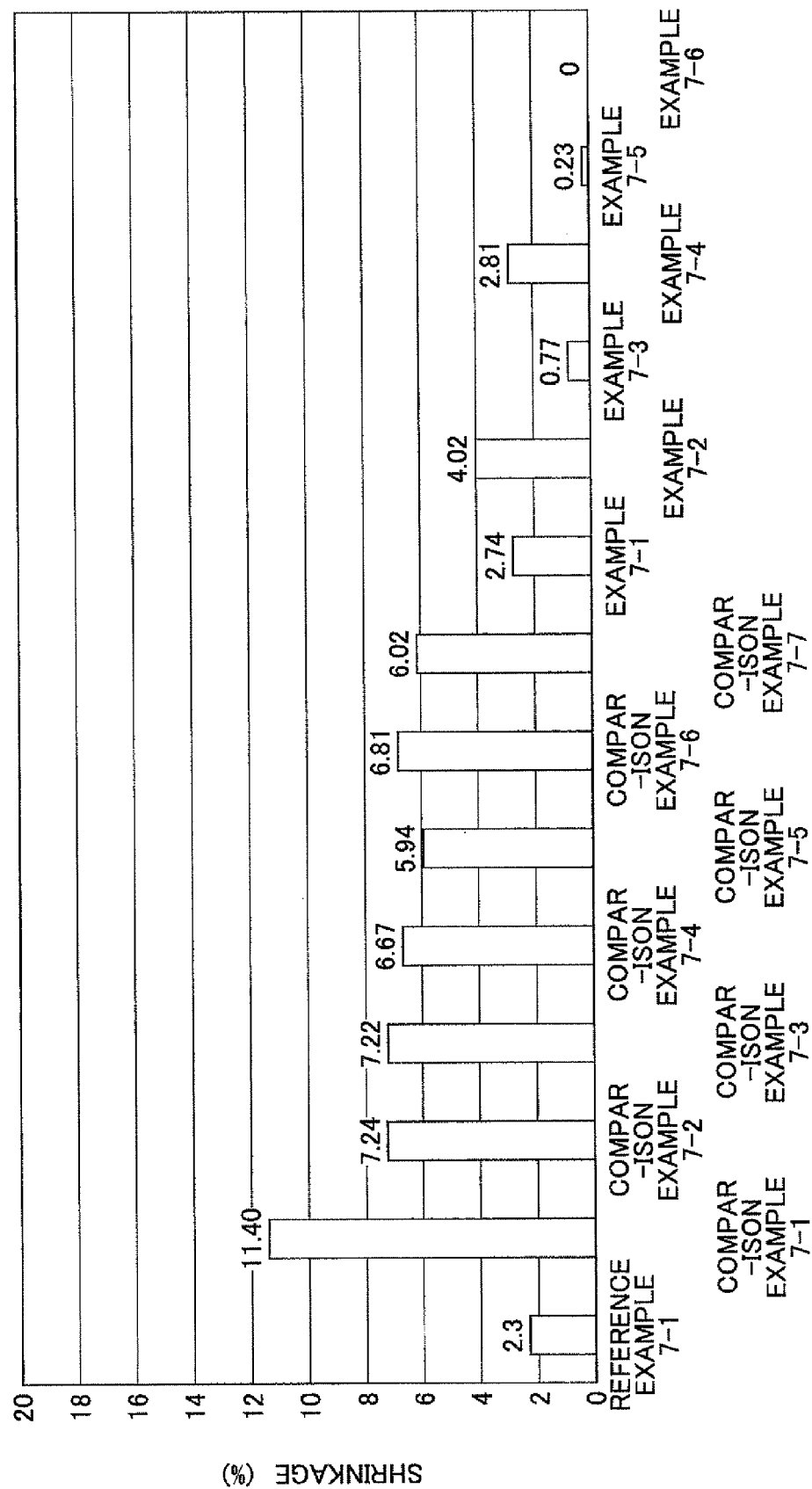
FIG. 46 shows experimental results of another experiment carried out using a film deposition apparatus according to an embodiment of the present invention.

Referring to FIG. 46, the shrinkage due to the annealing is less in the silicon oxide film deposited using the DIPAS gas, which has undergone the property modification, than the silicon oxide film that does not undergo the property modification. Specifically, the silicon oxide film that is deposited at a pressure of 0.5 kPa (4 Torr), a rotational speed of the turntable 2 of 20 rpm and a deposition temperature of 350° C., and undergoes the property modification is not shrunk by the annealing. Namely, the silicon oxide film so prepared is highly densified, and even after the silicon oxide film is etched into a micro- (or nano-) pattern, such micro (or nano-) pattern structure is less likely to collapse, which may be caused by internal stress in a largely shrunk film. In addition, the same tendencies as seen in the deposition rate experiment (Example 5) and the wet-etching rate experiment (Example 6) are observed also in the shrinkage experiment (Example 7) in terms of the rotational speed, the pressure, and the deposition temperature. Moreover, it has been found from another experiment carried out separately that the highly densified silicon oxide can be obtained by using the DIPAS gas with the property modification at a relatively lower deposition temperature, while the silicon oxide film having shrinkage of 5% or less can be obtained at deposition temperatures of 500° C. or more when the BTBAS gas is used.

Example 8

Next, experimental results of another experiment carried out to study an amount of moisture (Si—OH bonds and OH-group ($H_2O$)) included in the silicon oxide film that is deposited using the DIPAS gas and undergoes the property modification are explained. The silicon oxide films were prepared under the following conditions listed in Table 4. In addition, the pressure is 1.067 kPa (8 Torr); and the deposition temperature is 350° C. Fourier Transform Infrared Spectroscopy (FT-IR) was employed to measure an amount of moisture in the silicon oxide films.

TABLE 4

| Exp. # | High Freq. Power (W) | Rotational speed (rpm) |
|---|---|---|
| Comp. 8-1 | OFF | 240 |
| Ex. 8-1 | 400 |  |
| Comp. 8-2 | OFF | 30 |
| Ex. 8-2 | 400 |  |

Figure 47:
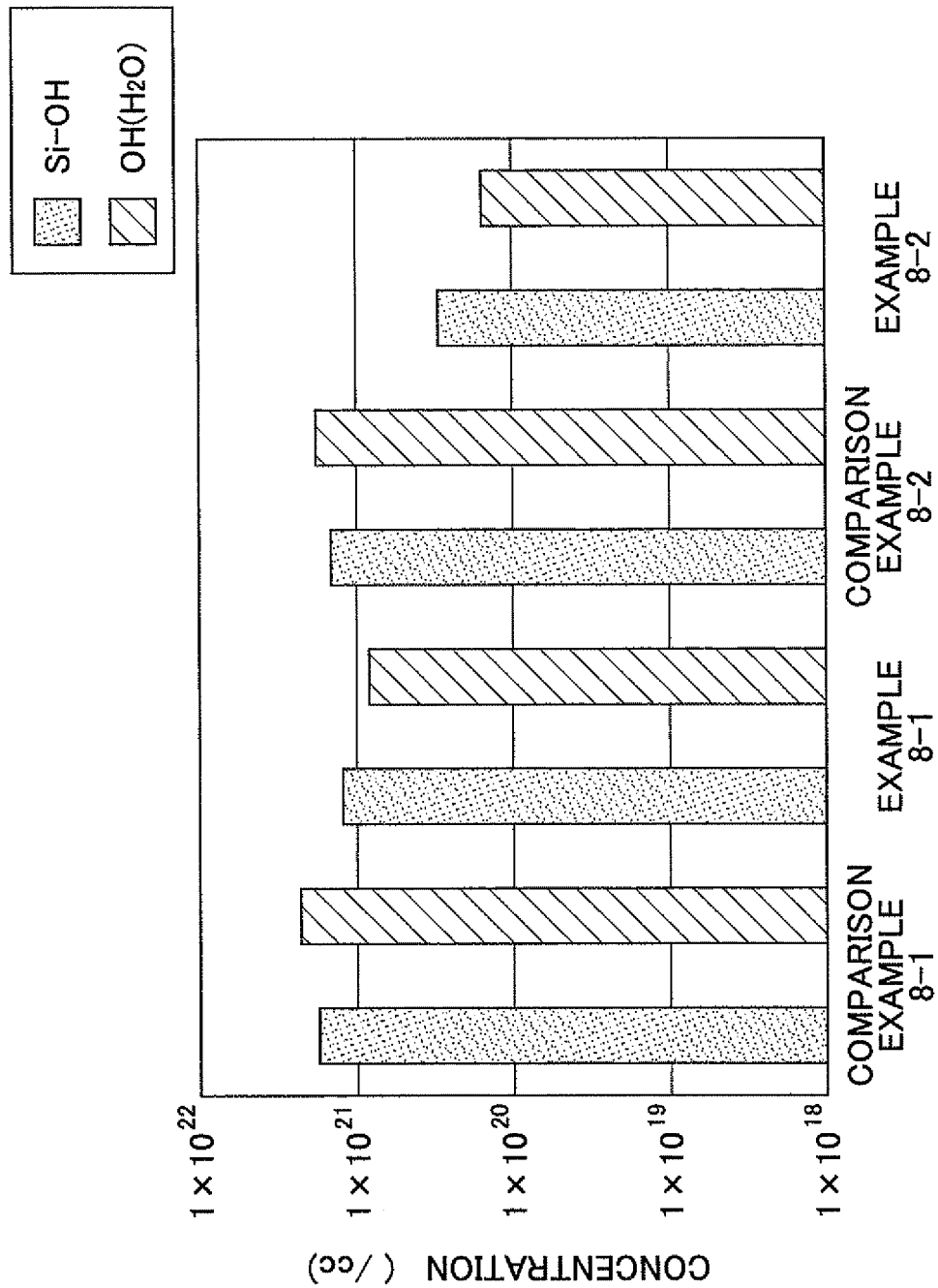
FIG. 47 shows experimental results of another experiment carried out using a film deposition apparatus according to an embodiment of the present invention.

As shown in FIG. 47, an amount of moisture in the silicon oxide films is reduced by carrying out the property modification, and further reduced by decreasing the rotational speed of the turntable 2.

Example 9

Next, experimental results of an experiment similar to Example 8 are explained. In this experiment, the silicon oxide films were prepared using the DIPAS gas at a rotational speed of the turntable 2 of 30 rpm and a deposition temperature of 350° C. The high frequency power and pressure were set as listed in Table 5.

TABLE 5

| Exp. # | High Freq. Power (W) | Pressure (kPa(Torr)) |
|---|---|---|
| Comp. 9-1 | OFF | 1.07 (8) |
| Ex. 9-1 | 400 |  |

TABLE 5-continued

| Exp. # | High Freq. Power (W) | Pressure (kPa(Torr)) |
| --- | --- | --- |
| Comp. 9-2 | OFF | 0.50 (4) |
| Ex. 9-2 | 400 | |

Figure 48:
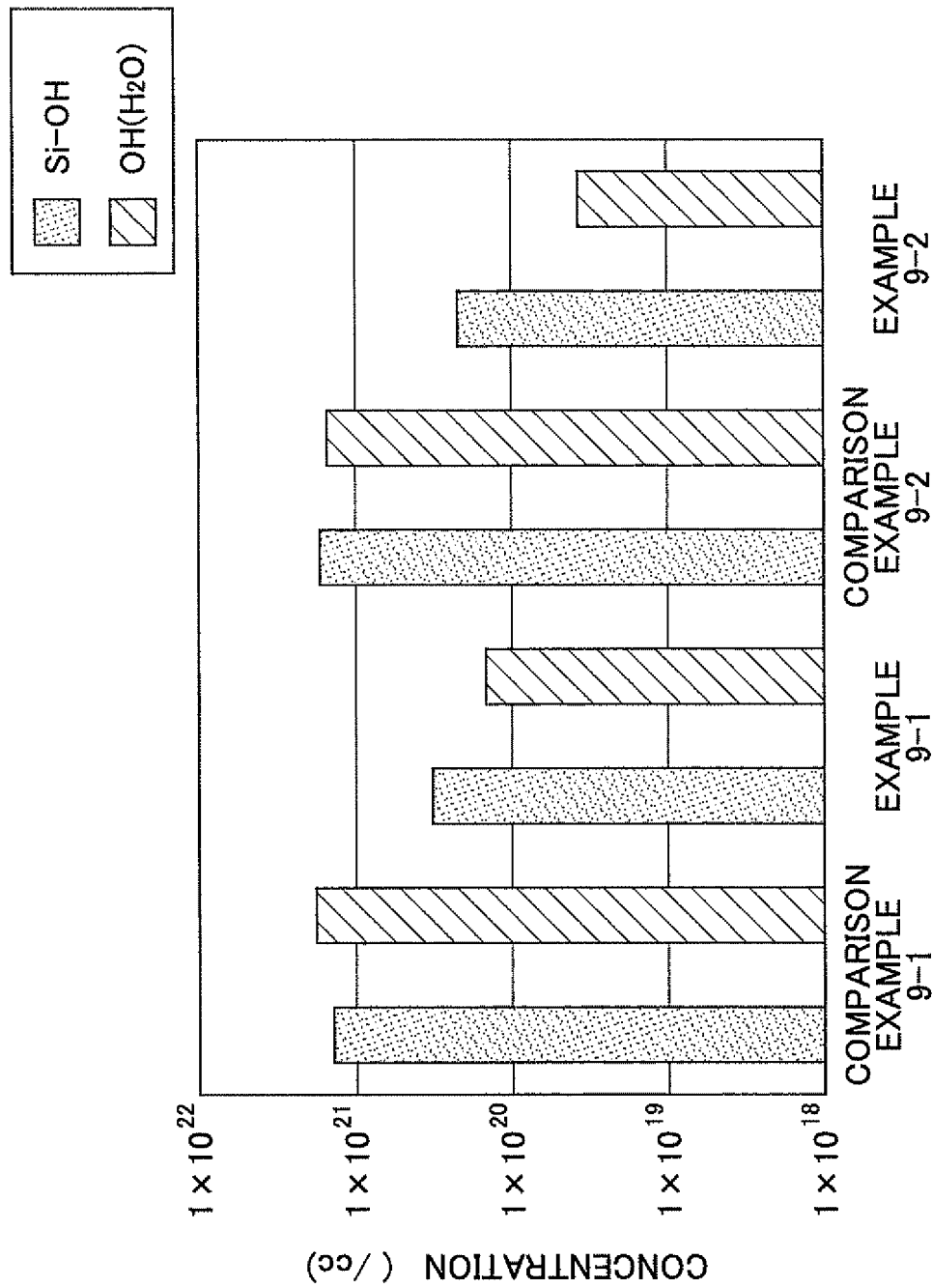
FIG. 48 shows experimental results of another experiment carried out using a film deposition apparatus according to an embodiment of the present invention.

As shown in FIG. 48, an amount of moisture in the silicon oxide films is reduced by carrying out the property modification. In addition, as the pressure is reduced, the amount of moisture is reduced.

Example 10

Next, another experiment was carried out in order to measure an amount of moisture in the silicon oxide films in substantially the same manner as Examples 8 and 9. In this experiment, the silicon oxide films were prepared using the DIPAS gas at a rotational speed of the turntable 2 of 30 rpm. As shown in Table 6, the property modification was carried out for Examples 10-1 and 10-2 at a high frequency power of 400 W, while not carried out for Comparison examples 10-1 and 10-2. After the preparation, an annealing process at an annealing temperature of 850° C. for an annealing time of 10 minutes was carried out for Example 10-2 and Comparison example 10-2.

TABLE 6

| Exp. # | High Freq. Power (W) | Annealing process |
| --- | --- | --- |
| Comp. 10-1 | OFF | not applied |
| Ex. 10-1 | 400 | |
| Comp. 10-2 | OFF | applied |
| Ex. 10-2 | 400 | |

Figure 49:
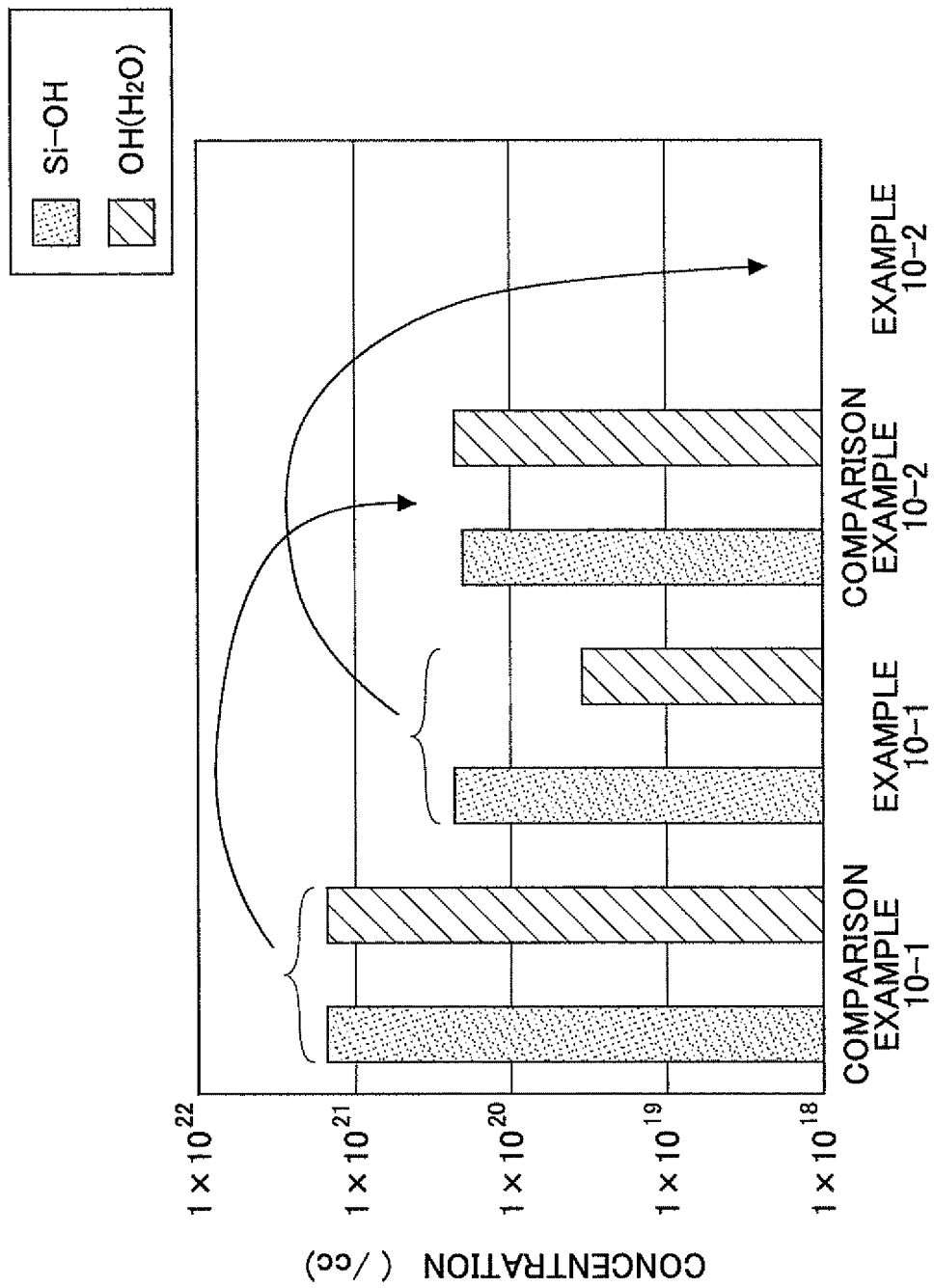
FIG. 49 shows experimental results of another experiment carried out using a film deposition apparatus according to an embodiment of the present invention.

As shown in FIG. 49, an amount of moisture decreases below detection limit by carrying out the property modification and the subsequent annealing process. In addition, the amount of moisture is actually reduced by the annealing process, even when the property modification was not carried out. However, in this case, the reduced amount of moisture is very limited, compared with the silicon oxide film that has undergone the property modification.

Example 11

Next, a specific weight of the silicon oxide films prepared in the same manner as those in Example 9 and a ratio of hydrogen/oxygen amount with respect to silicon amount in the silicon oxide films were measured by a Rutherford Back Scattering/Hydrogen Forward Scattering (RBS/EFS) method.

Figure 50:
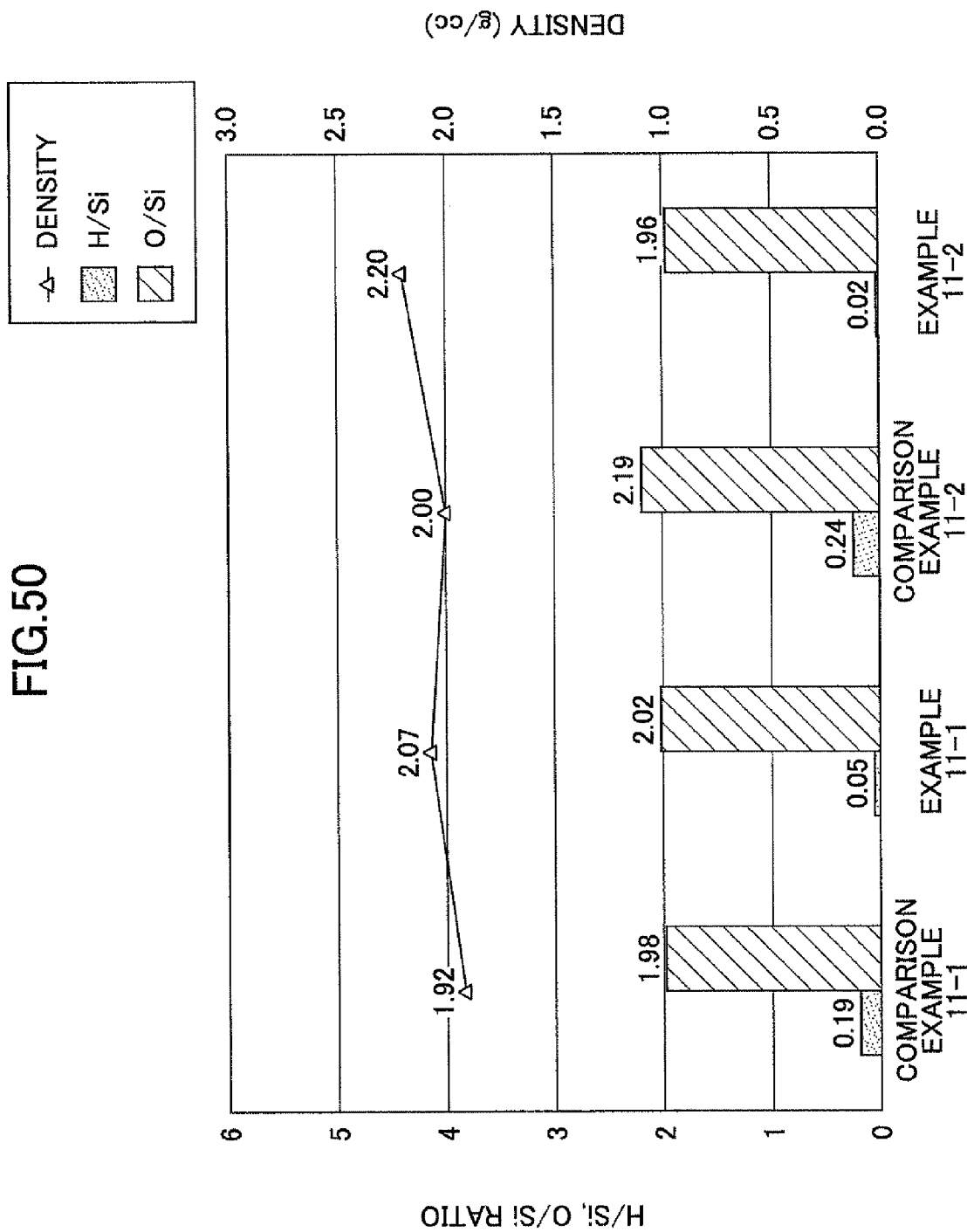
FIG. 50 shows experimental results of another experiment carried out using a film deposition apparatus according to an embodiment of the present invention.

As shown in FIG. 50, amounts of hydrogen and oxygen in the silicon oxide films are reduced by carrying out the property modification, as is substantially the case with Examples 8 through 10. In addition, the specific weight is increased by the property modification. Moreover, as the pressure is reduced, the effects of the property modification are enhanced. Incidentally, the sample referred to as Comparison example 11-1 is thought to include a greater amount of hydrogen because hydrogen being released from the sample was observed during the measurement.

Example 12

Next, impurity concentration was measured for the silicon oxide films prepared using the DIPAS gas under conditions listed in Table 7. The deposition temperature was 350° C. and the rotational speed of the turntable 2 was 30 rpm. In this measurement, Secondary Ion Mass Spectroscopy (SIMS) was used in order to measure impurity concentrations in the films by sputtering the silicon oxide films to a depth of 50 nm.

TABLE 7

| Exp. # | High Freq. Power (W) | Pressure (kPa(Torr)) |
| --- | --- | --- |
| Comp. 12-1 | OFF | 1.07 (8) |
| Comp. 12-2 | | 0.50 (4) |
| Ex. 12-1 | 400 | 1.07 (8) |
| Ex. 12-2 | | 0.50 (4) |

Figure 51:
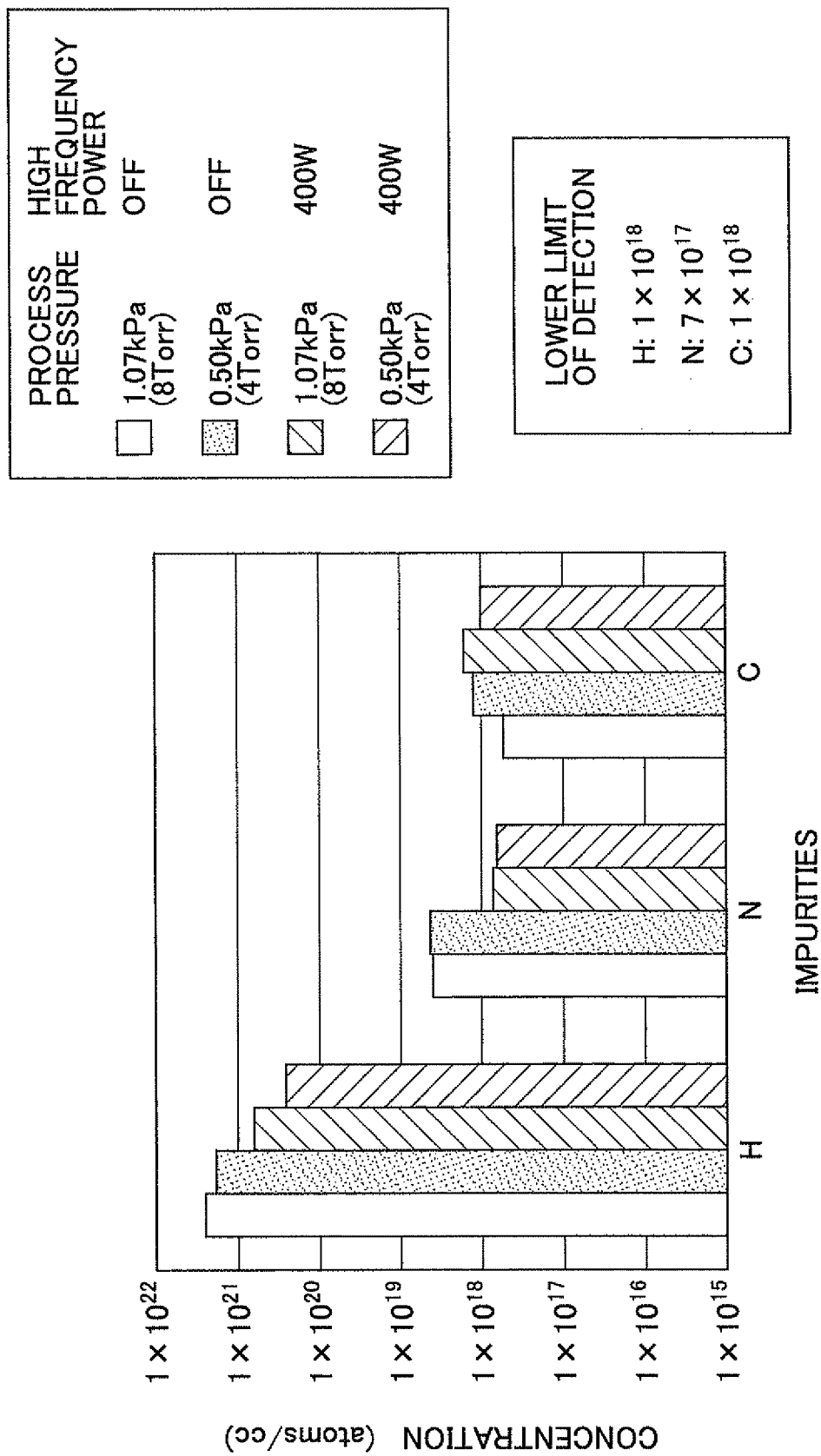
FIG. 51 shows experimental results of another experiment carried out using a film deposition apparatus according to an embodiment of the present invention.
Figure 52:
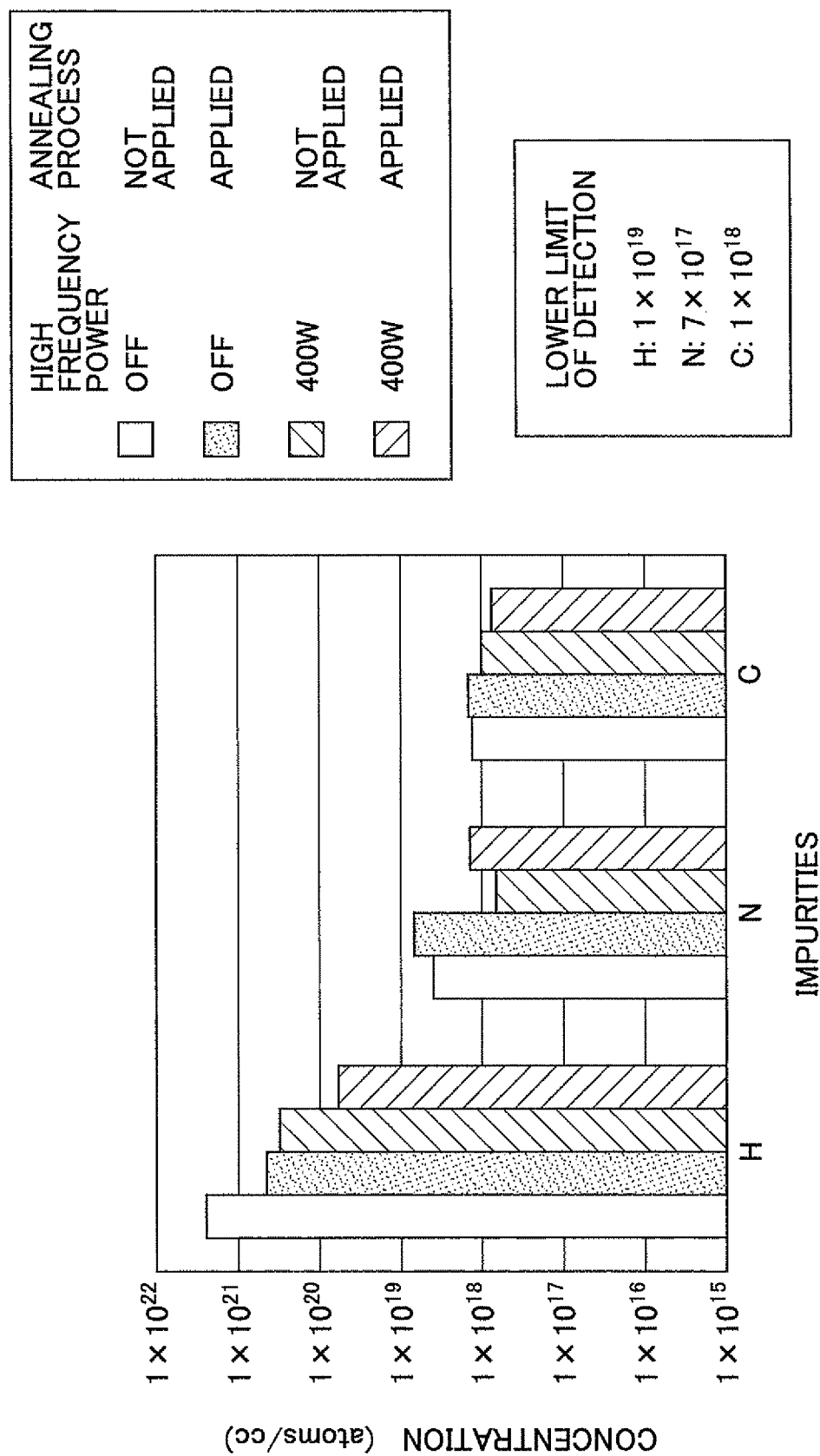
FIG. 52 shows experimental results of another experiment carried out using a film deposition apparatus according to an embodiment of the present invention.

As a result, an amount of hydrogen and nitrogen included in the silicon oxide film is greatly reduced by the property modification, as shown in FIG. 51.

Example 13

The same measurement was carried out for silicon oxide films prepared under conditions listed in Table 8. The deposition temperature was 350° C.; the pressure was 0.5 kPa (4 Torr); and the rotational speed of the turntable 2 was 30 rpm. In addition, the annealing was carried out at 850° C. for 10 minutes.

TABLE 8

| Exp. # | High Freq. Power (W) | Annealing process |
| --- | --- | --- |
| Comp. 13-1 | OFF | not applied |
| Comp. 13-2 | | applied |
| Ex. 13-1 | 400 | not applied |
| Ex. 13-2 | | applied |

As a result, an amount of hydrogen included in the silicon oxide film can be reduced when the property modification and the annealing process are carried for the silicon oxide film.

Example 14

Next, experimental results of another experiment carried out to study a gap-filling characteristic are explained. In this experiment, relatively deep concave portions (openings) each having an aspect ratio of 30 (depth: 10 μm, width: 0.3 μm) were made in the wafer W and the openings were filled with silicon oxide using the DIPAS gas. After the openings were filled with silicon oxide, cross sections of the filled openings were observed using SEM. From the observation, a ratio of the silicon oxide thickness on the surface of the silicon oxide thickness on the side wall of the openings with respect to the wafer W (namely, on a place where the openings are not made) was calculated, and the ratio is used as an indicator in evaluating the gap-fill characteristic. When the silicon oxide is deposited, a deposition temperature was 350° C.; a pressure was 0.5 kPa (4 Torr); a flow rate of the DIPAS gas was 275 sccm; a concentration of the $O_3$ gas was 300 g/Nm$^3$; and a flow rate of the $O_3$ gas was 10000 sccm. In addition, the high frequency power and the rotational speed of the turntable 2 are listed in Table 9.

TABLE 9

| Exp. # | High Freq. Power (W) | Rotational speed (rpm) |
| --- | --- | --- |
| Comp. 14-1 | 0 | 20 |
| Ex. 14-1 | 400 | |

TABLE 9-continued

| Exp. # | High Freq. Power (W) | Rotational speed (rpm) |
|---|---|---|
| Comp. 14-2 | 0 | 30 |
| Ex. 14-2 | 400 | |

The SEM observation results are schematically shown in FIG. 53. From these results, it has been found that the openings are preferentially filled by silicon oxide when the property modification is carried out at a lower rotational speed of the turntable 2.

Example 15

Next, experimental results of another experiment carried out to study a leakage current through the silicon oxide film obtained using the DIPAS gas are explained. In this experiment, a current density of the current flowing through the film was measured by a mercury probe method, while a negative bias voltage was applied to the silicon oxide film. In this measurement, a lower current density means lower leakage current. When the silicon oxide films were prepared, a pressure was 1.067 kPa (8 Torr); a flow rate of the DIPAS gas was 275 sccm; a concentration of the $O_3$ gas was 300 g/Nm$^3$; a flow rate of the $O_3$ gas was 10000 sccm; a flow rate of the process (modification) gas (Ar/$O_2$) was 5 slm/0.1 slm; and the rotational speed of the turntable 2 was 240 rpm. The deposition temperature and the high frequency power were changed as shown in Table 10.

TABLE 10

| Exp. # | Deposition Temp. (° C.) | High Freq. Power (W) |
|---|---|---|
| Comp. 15-1 | 350 | 0 |
| Ex. 15-1 | 450 | |
| Comp. 15-2 | 350 | 400 |
| Ex. 15-2 | 450 | |

Figure 54:
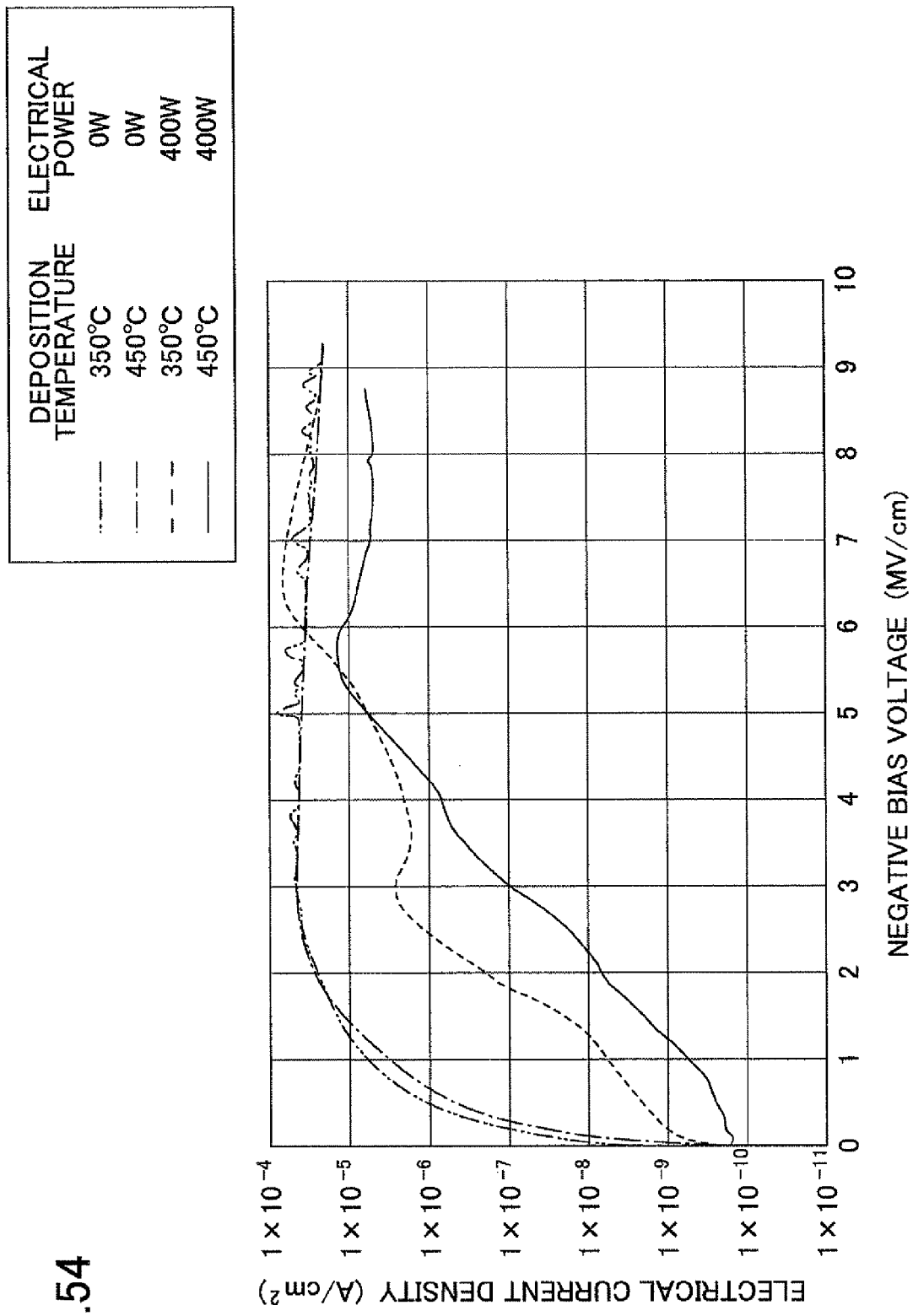
FIGS. 54 through 57 are graphs showing experimental results.

As shown in FIG. 54, when the property modification is carried out, the leakage current is reduced, and a higher deposition temperature yields a lower leakage current.

Example 16

The same measurement as Example 15 was carried out for the silicon oxide films prepared under conditions listed in Table 11. The deposition was 350° C.; and the rotational speed of the turntable 2 was 30 rpm. Other conditions were the same as those in Example 15.

TABLE 11

| Exp. # | High Freq. Power (W) |
|---|---|
| Comp. 16-1 | 0 |
| Ex. 16-1 | 200 |
| Ex. 16-2 | 400 |

Figure 55:
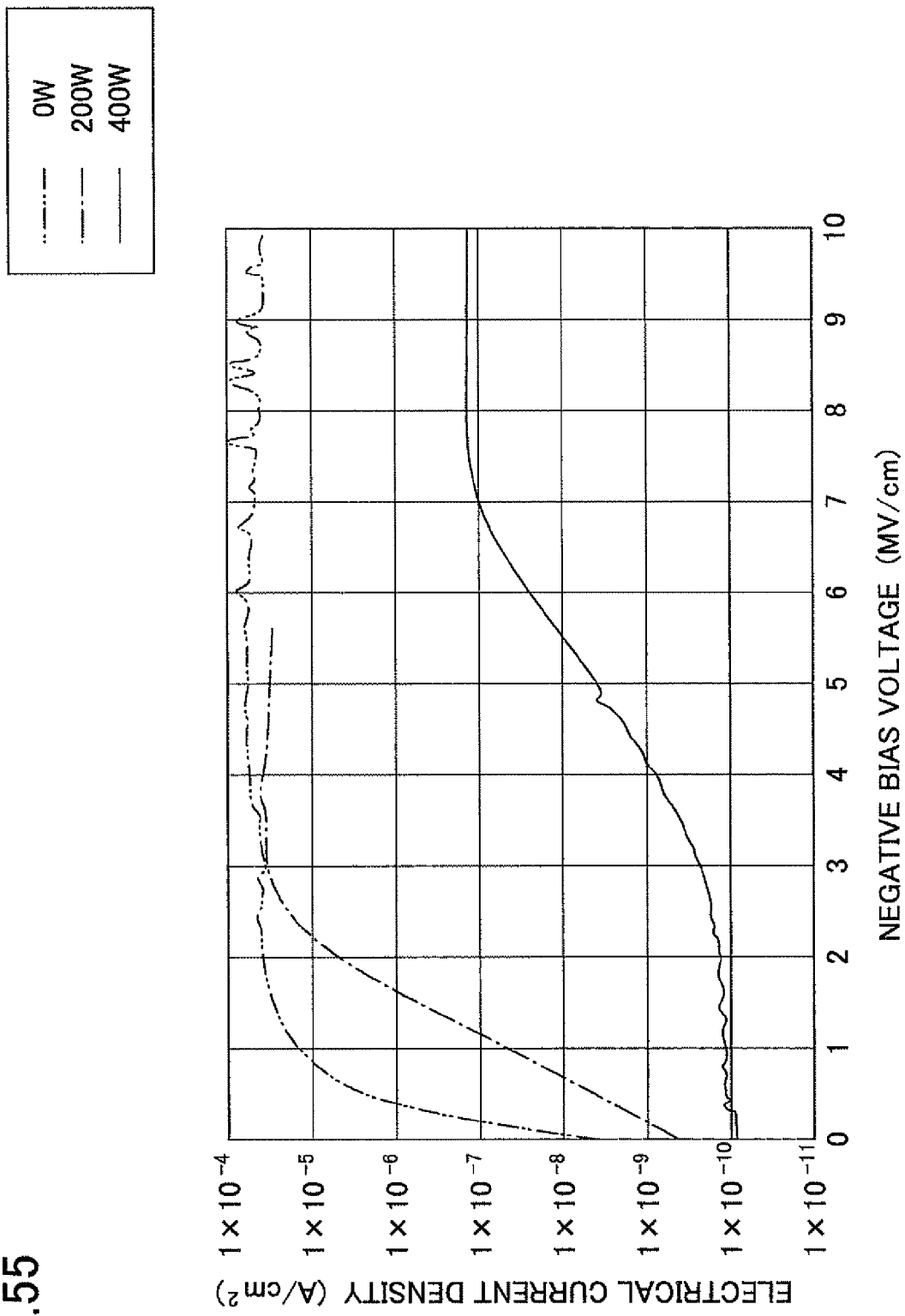

As shown in FIG. 55, it has been found that higher high-frequency power for modifying the properties of the silicon oxide film yields a lower leakage current.

Example 17

The same leakage current measurement as that in Examples 15 and 16 was carried out for the silicon oxide films prepared under conditions listed in Table 12. In the preparation, high frequency power was 400 W, and the other conditions were the same as those in Example 16.

TABLE 12

| Exp. # | Rotational speed (rpm) |
|---|---|
| Ex. 17-1 | 30 |
| Ex. 17-2 | 60 |
| Ex. 17-3 | 120 |
| Ex. 17-4 | 240 |

Figure 56:
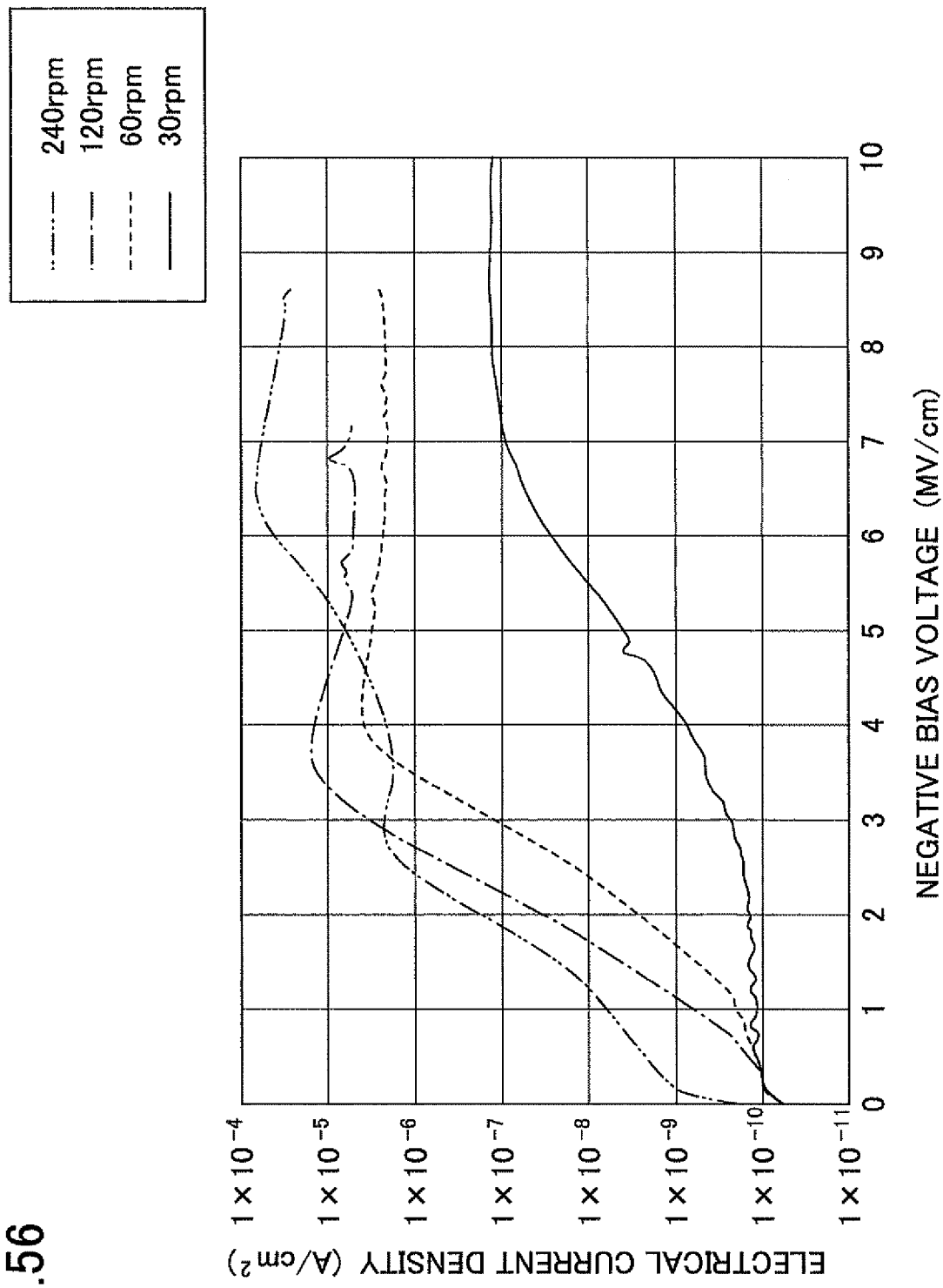

As shown in FIG. 56, it has been found that a lower rotational speed of the turntable 2 yields a lower leakage current.

Example 18

The same leakage current measurement as in Examples 15 through 17 was carried out for the silicon oxide films prepared under conditions listed in Table 13. In the preparation, a rotational speed of the turntable 2 was 30 rpm, and the other conditions were the same as those in Example 17.

TABLE 13

| Exp. # | Pressure (kPa(Torr)) |
|---|---|
| Ex. 18-1 | 0.50(4) |
| Ex. 18-2 | 1.07(8) |

Figure 57:
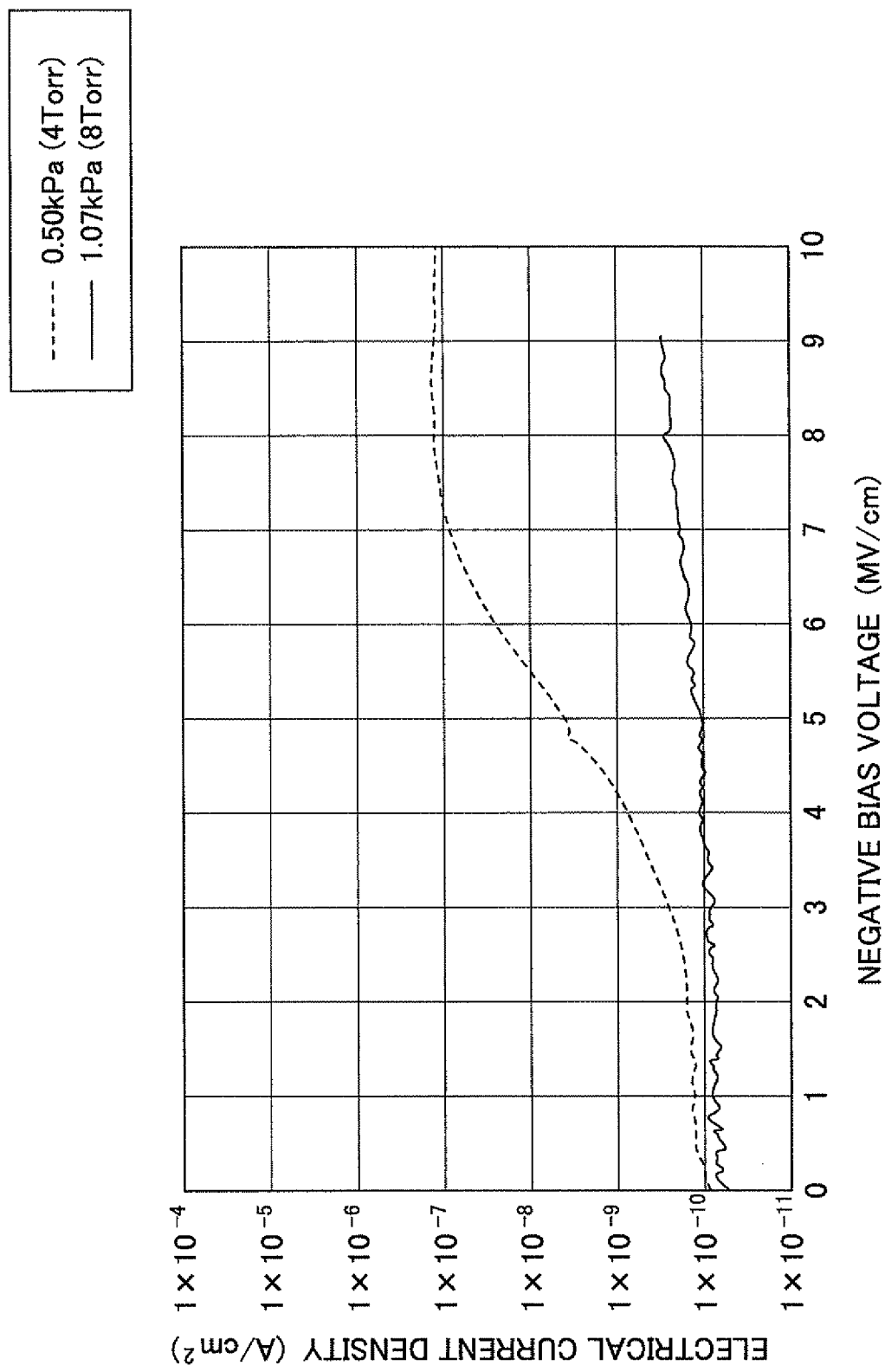

As shown in FIG. 57, when the lower pressure results in the lower leakage current. Incidentally, the silicon oxide film deposited at a pressure of 1.067 kPa (8 Torr) has substantially the same leak current density as the silicon oxide film deposited using the BTBAS gas at a deposition temperature of 350° C. and annealed at a temperature of 850° C. This may indicate that the silicon oxide film having a low leakage current can be obtained at a lower deposition temperature when the silicon oxide film is deposited using the DIPAS gas and undergoes the property modification, compared with the silicon oxide film deposited using the BTBAS gas.

While detailed explanation and figures are omitted, yet another experiment has revealed that a cycle rate (a silicon oxide film thickness per one revolution of the turntable 2) and an across-wafer uniformity of the silicon oxide thickness are increased or improved when the DIPAS gas is used, compared with a case where the BTBAS gas is used. Specifically, it has been found from the experiment using a batch-type deposition apparatus that the cycle rate when using the DIPAS gas becomes 1.34 times as high as that using the BTBAS gas.

In addition, in the case of the DIPAS gas, it has been confirmed that the deposition rate is not changed at deposition temperatures from 350° C. through 500° C. This may indicate that the DIPAS gas adsorbed on the wafer W is oxidatively decomposed by the $O_3$ gas rather than thermally decomposed by the heat from the wafer W, and thus an ALD mode film deposition is carried out.

Incidentally, an activated gas injector according to an embodiment of the present invention may be recited in the following.

According to one aspect of the present invention, there is provided an activated gas injector including a gas introduction port configured to take in a process gas; an activation unit configured to include one of a pair of electrodes to be supplied with electrical power to generate electromagnetic field therebetween and a heater configured to heat the process gas, in order to activate the process gas; and a flow passage defining member configured to guide the process gas taken in from the gas introduction port to the activation unit and have holes through which the process gas activated by the activation unit may be supplied toward an object to be processed.

According to another aspect of the present invention, there is provided an activated gas injector according to the one aspect, wherein each of the electrodes is covered by ceramics when the activating unit includes the pair of the electrodes when the activation unit includes the pair of the electrodes.

According to another aspect of the present invention, there is provided an activated gas injector according to one of the precedent aspects, further including a gas introduction nozzle that is connected to the gas introduction port in the flow passage defining member and has gas holes through which the process gas is ejected into the flow passage defining member.

According to another aspect of the present invention, there is provided an activated gas injector according to one of the precedent aspects, further including a partition wall configured to partition an inner space of the flow passage defining member into a gas introduction passage and a gas activation passage.

While the present invention has been described in reference to the foregoing embodiments, the present invention is not limited to the disclosed embodiments, but may be modified or altered within the scope of the accompanying claims.

What is claimed is:

1. An activated gas injector comprising:
a flow passage defining member having an enclosed space surrounded by circumferential walls extending longer in a first horizontal direction than in a vertical direction, the circumferential walls including a ceiling wall, a bottom wall and first and second side walls, the enclosed space being partitioned into a gas activation chamber and a gas introduction chamber by a partition wall, all of the gas activation chamber, the gas introduction chamber and the partition wall extending longer in the first horizontal direction than in the vertical direction, the gas introduction chamber being defined by the ceiling wall, the first side wall, the bottom wall of the circumferential walls and the partition wall along the first horizontal direction, the gas activation chamber being defined by the ceiling wall, the second side wall and the bottom wall of the circumference walls and the partition wall along the first horizontal direction, a first distance between the first side wall and the partition wall within the gas introduction chamber being longer than a second distance between the second side wall and the partition wall within the gas activation chamber in a second horizontal direction perpendicular to the first horizontal direction within a horizontal plane, the partition wall having a plurality of cut-out portions to form through-holes to allow the gas introduction chamber to be communicated with the gas activation chamber, the through-holes being defined by the ceiling wall of the circumferential walls and the cut-out portions of the partition wall arranged at predetermined first intervals in the first horizontal direction along the ceiling wall;
a gas introduction nozzle through which a process gas is introduced into the gas introduction chamber, the gas introduction nozzle being provided in the gas introduction chamber extending along an inner surface of the first side wall of the circumferential walls, the gas introduction nozzle extending along the first horizontal direction, the gas introduction nozzle having a plurality of gas discharge holes arranged at predetermined second intervals different from the first intervals along the first horizontal direction;
a pair of electrodes provided in the gas activation chamber and to be supplied with electrical power to activate the process gas so as to form a plasma generation portion therebetween, wherein the pair of electrodes extends along the first horizontal direction in parallel to each other within the horizontal plane in the gas activation chamber defined by the ceiling wall, the bottom wall and the second side wall of the circumferential walls and the partition wall, the pair of electrodes including a first electrode on the partition wall side and a second electrode on the second side wall side of the circumferential wall, a third distance between the gas introduction nozzle and the partition wall being longer than a fourth distance between the first electrode and the partition wall; and
gas ejection holes provided in the gas activation chamber along the longitudinal direction of the electrodes, the gas ejection holes being formed in one of the circumferential walls that are at the same distance from both of the electrodes and right under the plasma generation portion, wherein the gas ejection holes allow the process gas activated in the gas activation chamber to be ejected therefrom to outside of the circumferential walls.

2. The activated gas injector of claim 1, wherein each of the electrodes is covered by ceramics when the activating unit includes the pair of the electrodes.

3. The activated gas injector of claim 1, wherein the gas introduction nozzle is connected at a base end thereof to a gas introduction port.

* * * * *